(12) United States Patent
Sugawara et al.

(10) Patent No.: US 7,274,207 B2
(45) Date of Patent: Sep. 25, 2007

(54) SEMICONDUCTOR-INTEGRATED CIRCUIT UTILIZING MAGNETORESISTIVE EFFECT ELEMENTS

(75) Inventors: Minoru Sugawara, Kanagawa (JP); Makoto Motoyoshi, Kanagawa (JP)

(73) Assignee: Sony Corporation, Tokyo (JP)

( * ) Notice: Subject to any disclaimer, the term of this patent is extended or adjusted under 35 U.S.C. 154(b) by 178 days.

(21) Appl. No.: 10/477,115

(22) PCT Filed: Apr. 3, 2003

(86) PCT No.: PCT/JP03/04255

§ 371 (c)(1), (2), (4) Date: Apr. 8, 2004

(87) PCT Pub. No.: WO03/084065

PCT Pub. Date: Oct. 9, 2003

(65) Prior Publication Data

US 2004/0155345 A1 Aug. 12, 2004

(30) Foreign Application Priority Data

Apr. 3, 2002 (JP) ............................. 2002-101092
Oct. 16, 2002 (JP) ............................. 2002-301323

(51) Int. Cl.
*H03K 19/173* (2006.01)
(52) U.S. Cl. ........................ 326/38; 326/41; 326/47; 326/82; 326/101; 327/387
(58) Field of Classification Search ............ 326/38–41, 326/82, 47, 101, 114; 327/387
See application file for complete search history.

(56) References Cited

U.S. PATENT DOCUMENTS

| 3,648,119 A | * | 3/1972 | Van Eeck ................ 361/435 |
| 4,990,489 A | | 2/1991 | Mashiko et al. |
| 5,298,485 A | | 3/1994 | Kataoka et al. |

(Continued)

FOREIGN PATENT DOCUMENTS

JP 55-141824 A 11/1980

(Continued)

OTHER PUBLICATIONS

International Search Report Jun. 3, 2003.

(Continued)

*Primary Examiner*—Rexford Barnie
*Assistant Examiner*—Jason Crawford
(74) *Attorney, Agent, or Firm*—Rader, Fishman & Grauer PLLC

(57) ABSTRACT

A semiconductor integrated circuit device has a plurality of circuit elements, a plurality of connection elements each of which becomes a conductive state or a nonconductive state, interconnects for supplying control signals for placing the connection elements in the conductive state or the nonconductive state, and a plurality of circuit selection switching elements, wherein said circuit selection switching elements are driven in response to the circuit configuration instruction signal, control signals are output from the circuit selection switching elements. As the connection elements, preferably use is made of magnetoresistance effect elements or resistance control elements which become the conductive state or the nonconductive state in accordance with application of a magnetic field. As the circuit elements, use can be made of magnetoresistance effect elements or resistance control elements.

33 Claims, 76 Drawing Sheets

U.S. PATENT DOCUMENTS

| | | | |
|---|---|---|---|
| 6,140,838 A | * | 10/2000 | Johnson .................... 326/39 |
| 6,316,965 B1 | * | 11/2001 | Jonker et al. .............. 326/134 |
| 6,429,713 B2 | * | 8/2002 | Nakaizumi ................. 327/218 |
| 6,542,000 B1 | * | 4/2003 | Black et al. ................. 326/39 |
| 6,779,168 B2 | * | 8/2004 | Hamlin ....................... 716/16 |

FOREIGN PATENT DOCUMENTS

| | | |
|---|---|---|
| JP | 60-15895 A | 1/1985 |
| JP | 60-47344 | 4/1985 |
| JP | 64-5768 B2 | 1/1989 |
| JP | 64-13297 A | 1/1989 |
| JP | 1-303769 A | 12/1989 |
| JP | 3-204956 A | 9/1991 |
| JP | 8-139590 A | 5/1996 |
| JP | 9-45915 A | 2/1997 |
| JP | 9-293843 A | 11/1997 |
| JP | 11-251442 A | 9/1999 |
| JP | 2003-513438 A | 5/2001 |
| WO | WO 01-031789 A | 5/2001 |

OTHER PUBLICATIONS

Notification of Reasons for Refusal; Application No.: 2003-581359; dated Jul. 10, 2006.

J. Shen et al., "Logic Devices and Circuits Based on Giant Magnetoresistance", IEEE Transactions on Magnetics, vol. 33, No. 6, dated Nov. 1997.

Japanese Office Action, Application No.: 2003-581353, dated Jul. 18, 2006.

* cited by examiner

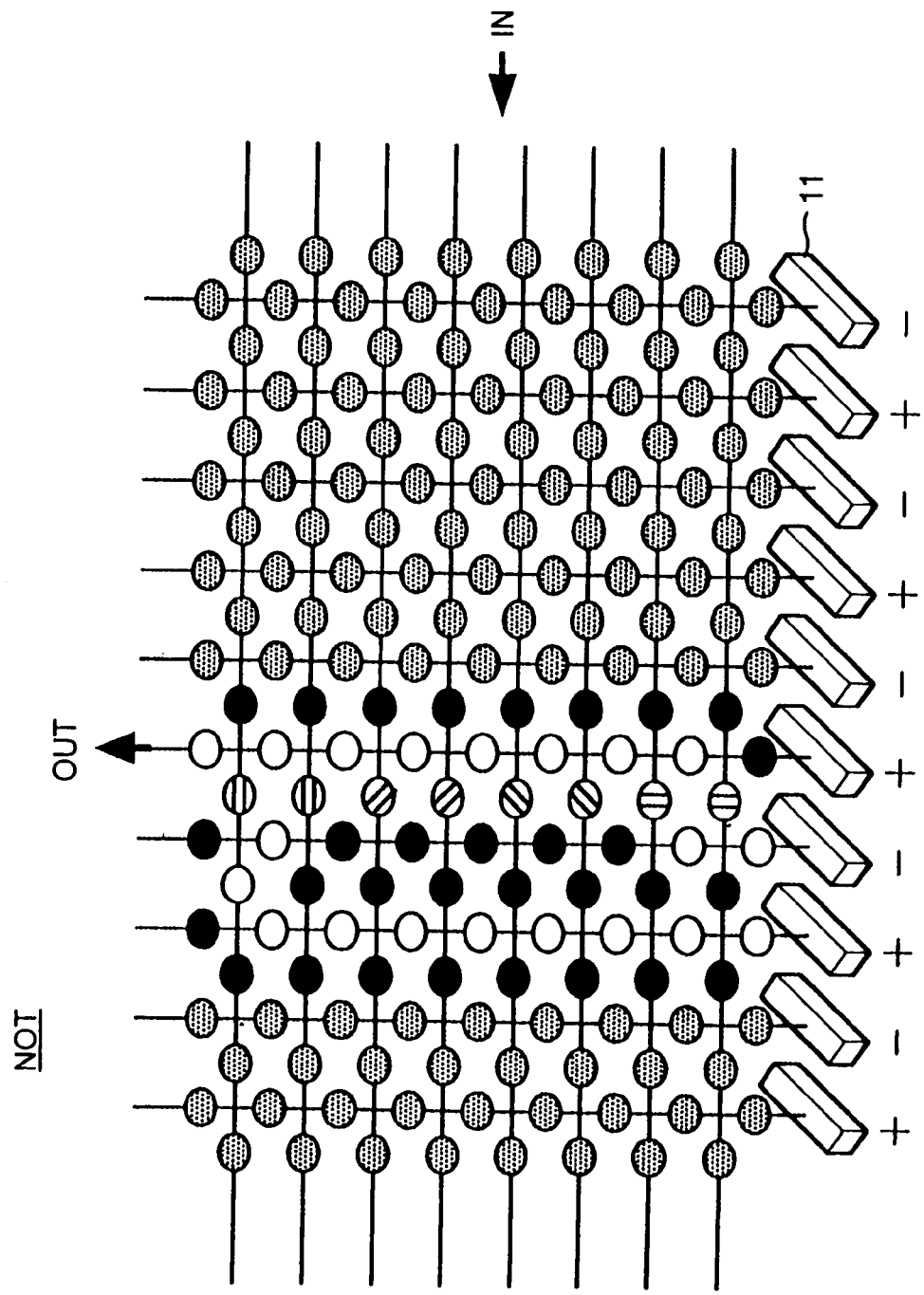

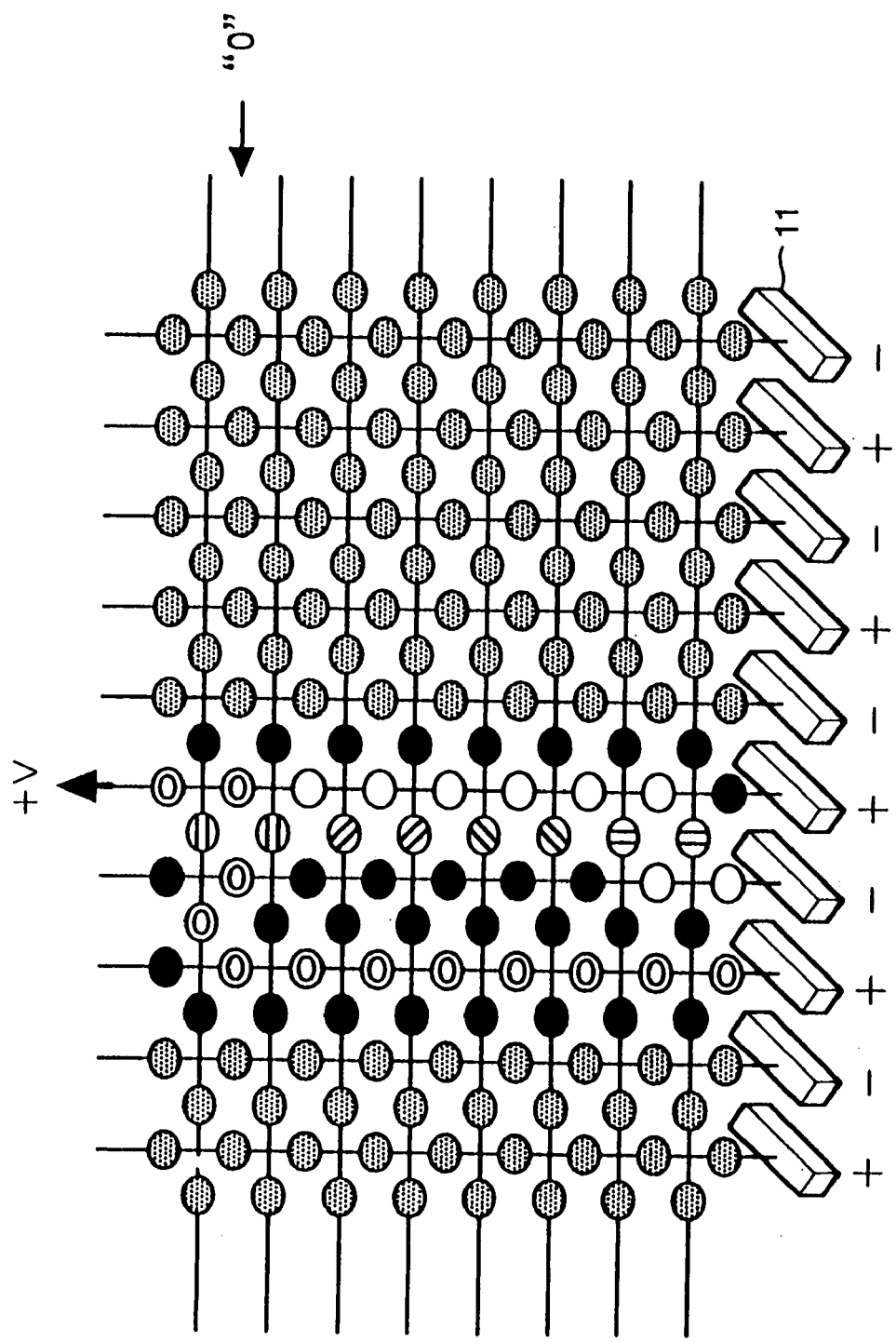

FIG. 12

- ⊕ ELEMENTS NOT YET SET IN FUNCTION
- ● ELEMENTS TURNED OFF FOR FORMING NOT LOGIC CIRCUIT
- ⊖ HORIZONTAL CONNECTION ELEMENTS WHICH BECOME ON AT (0) INPUT
- ⊕ HORIZONTAL CONNECTION ELEMENTS WHICH BECOME ON AT (1) INPUT
- ◉ CURRENT PATH AT "1" INPUT
- ○ CURRENT PATH

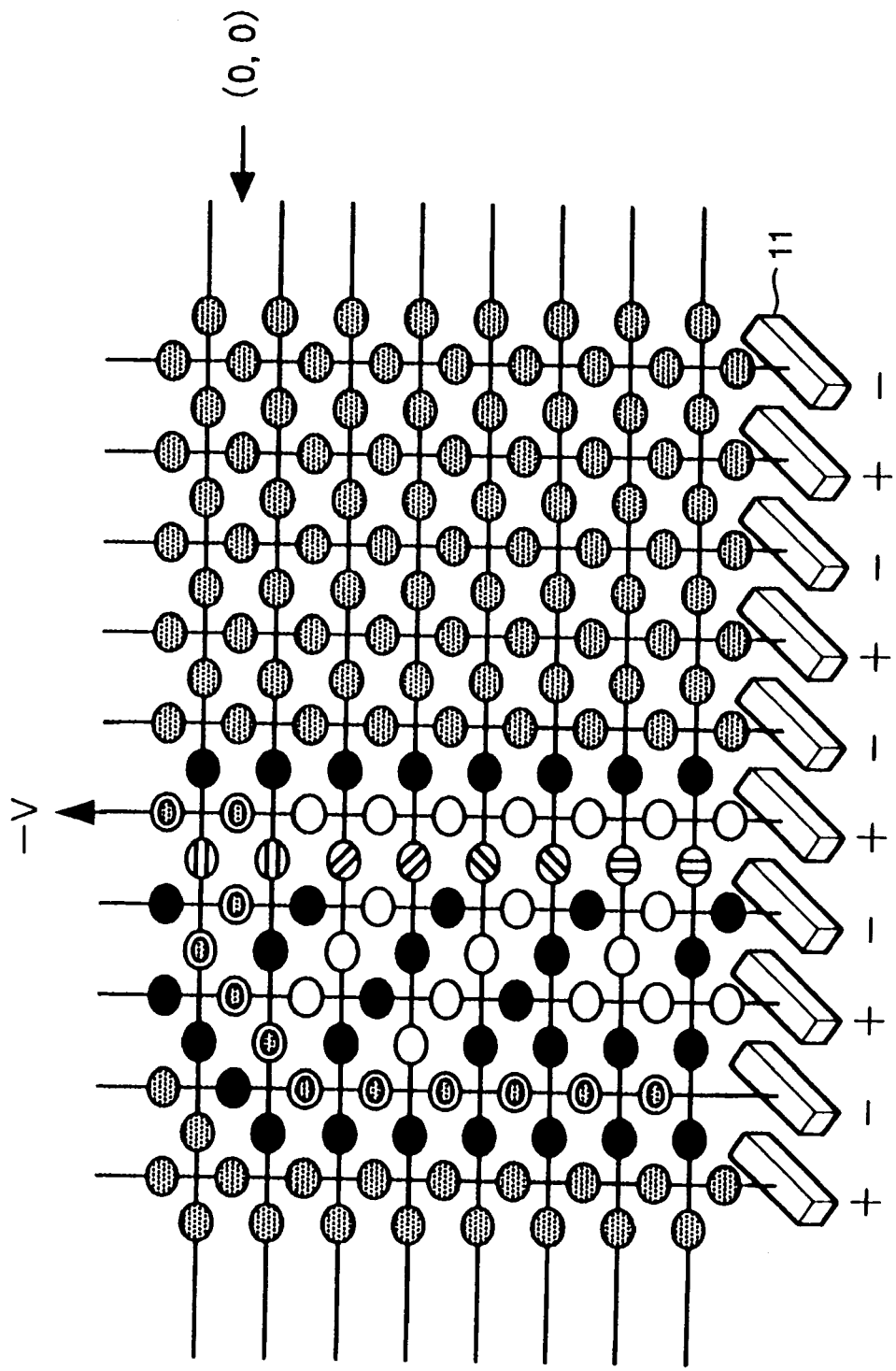

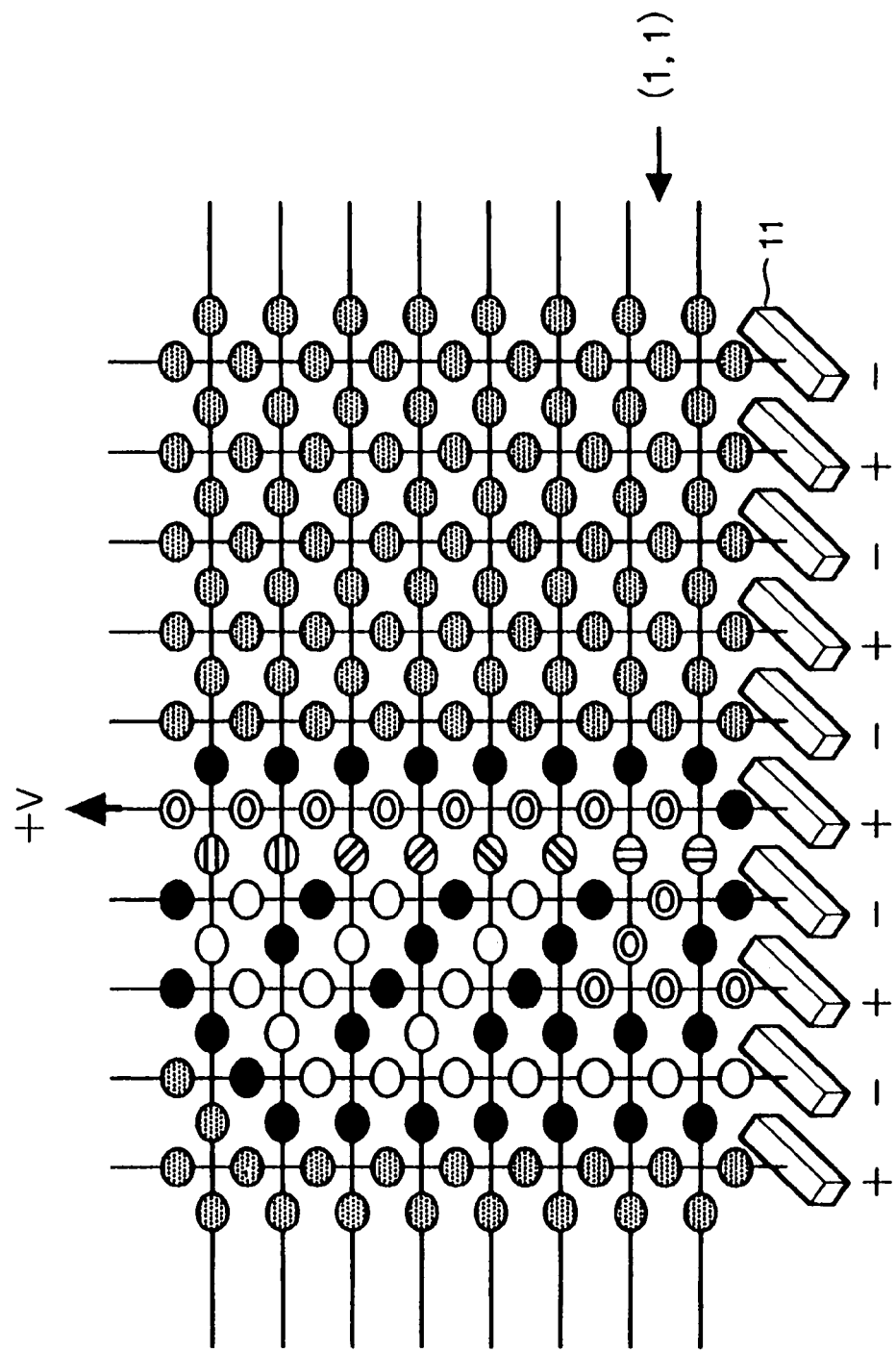

FIG. 14

- ⊛ ELEMENTS NOT YET SET IN FUNCTION
- ● ELEMENTS TURNED OFF FOR FORMING AND LOGIC CIRCUIT
- ⊖ HORIZONTAL CONNECTION ELEMENTS WHICH BECOME ON AT (0, 0) INPUT
- ⊘ HORIZONTAL CONNECTION ELEMENTS WHICH BECOME ON AT (1, 0) INPUT
- ⊘ HORIZONTAL CONNECTION ELEMENTS WHICH BECOME ON AT (0, 1) INPUT
- ⌽ HORIZONTAL CONNECTION ELEMENTS WHICH BECOME ON AT (1, 1) INPUT
- ⊙ CURRENT PATH AT EACH INPUT
- ○ CURRENT PATH

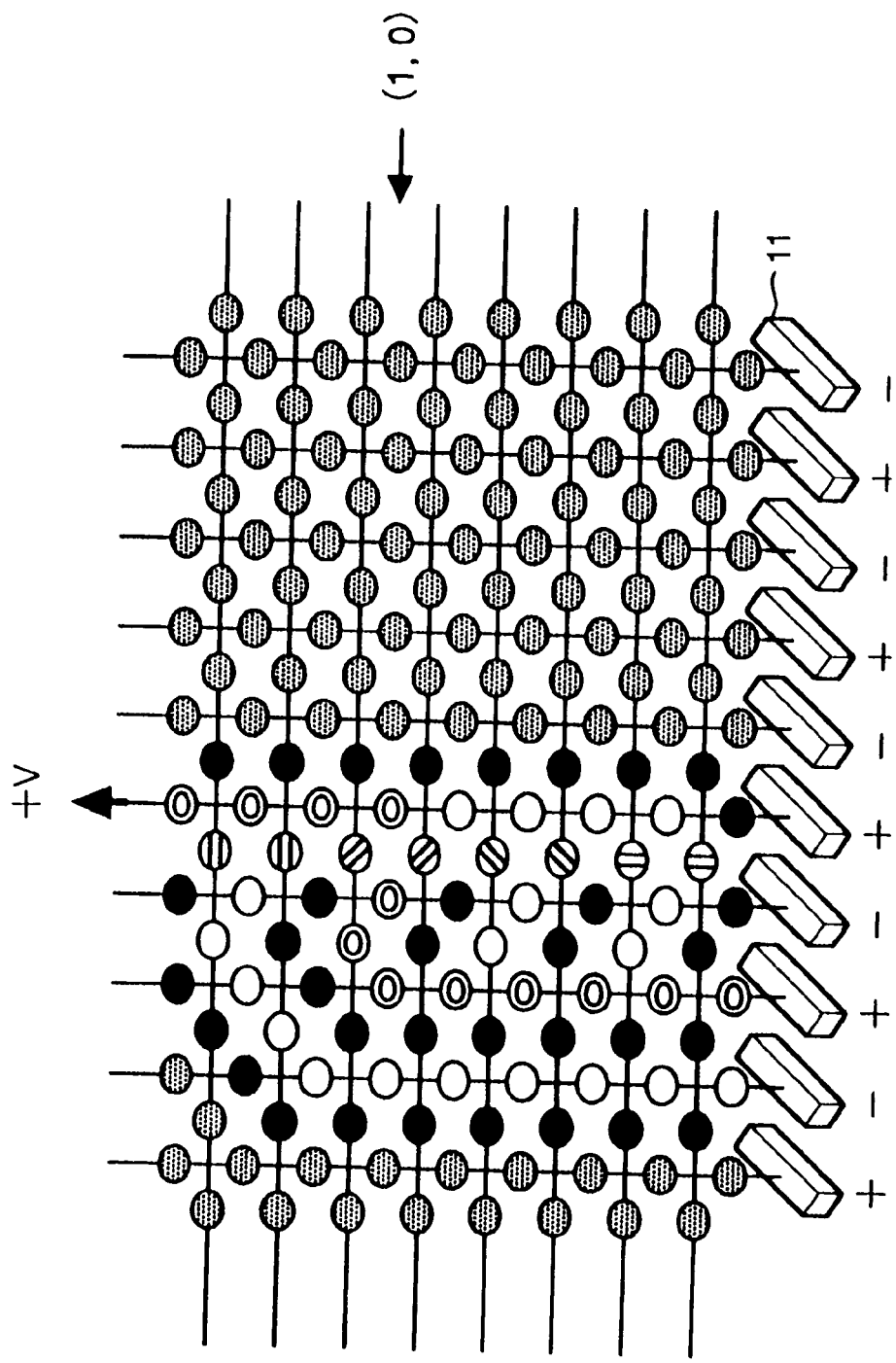

FIG. 16

- ⊕ ELEMENTS NOT YET SET IN FUNCTION
- ● ELEMENTS TURNED OFF FOR FORMING OR LOGIC CIRCUIT
- ⊖ HORIZONTAL CONNECTION ELEMENTS WHICH BECOME ON AT (0, 0) INPUT
- ⊘ HORIZONTAL CONNECTION ELEMENTS WHICH BECOME ON AT (1, 0) INPUT
- ⊘ HORIZONTAL CONNECTION ELEMENTS WHICH BECOME ON AT (0, 1) INPUT
- ⊕ HORIZONTAL CONNECTION ELEMENTS WHICH BECOME ON AT (1, 1) INPUT
- ⊚ CURRENT PATH AT EACH INPUT
- ○ CURRENT PATH

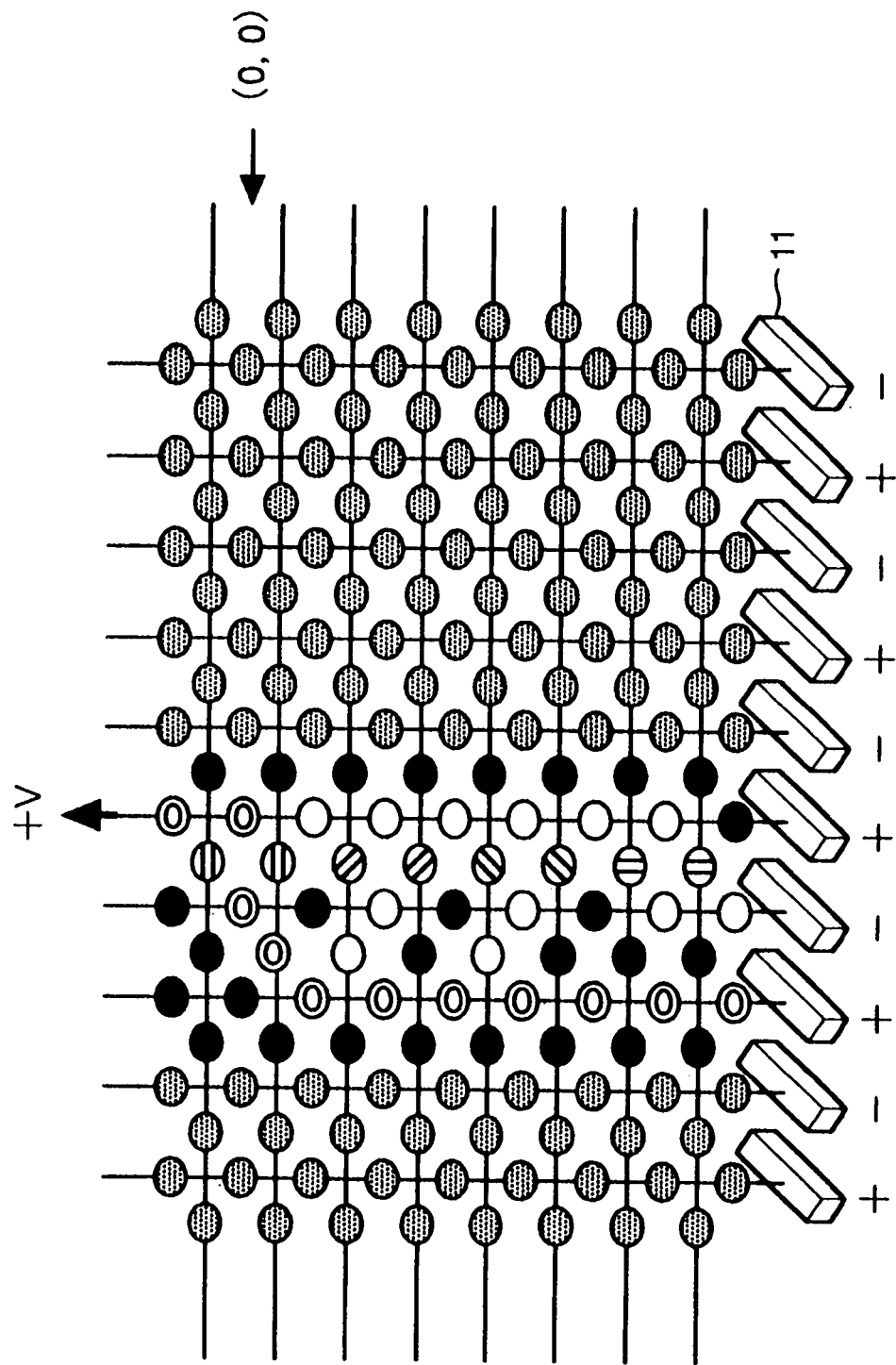

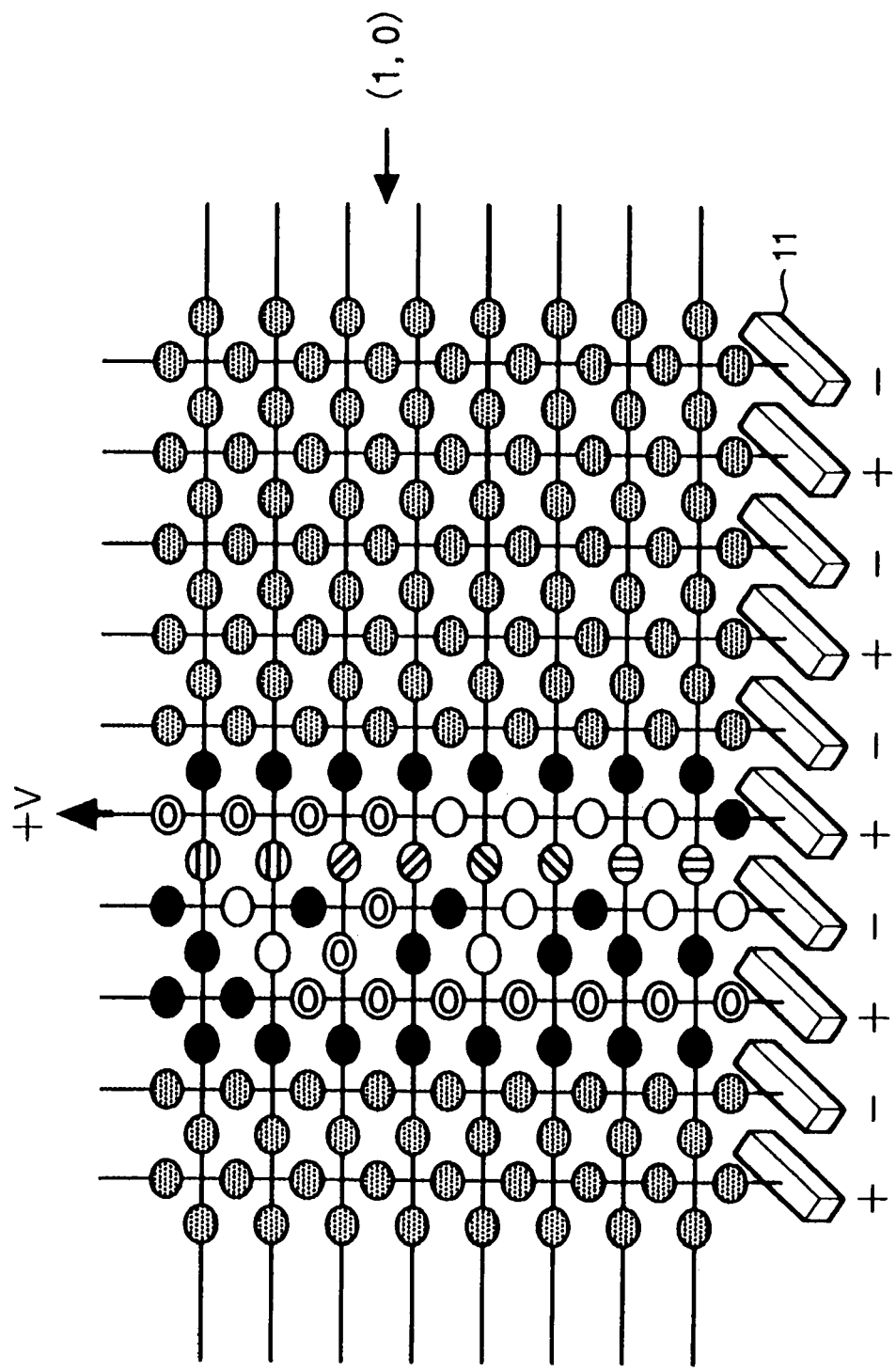

FIG. 18

- ⊜ (shaded) ELEMENTS NOT YET SET IN FUNCTION
- ● ELEMENTS TURNED OFF FOR FORMING NAND LOGIC CIRCUIT
- ⊖ HORIZONTAL CONNECTION ELEMENTS WHICH BECOME ON AT (0, 0) INPUT
- ⊘ HORIZONTAL CONNECTION ELEMENTS WHICH BECOME ON AT (1, 0) INPUT
- ⊘ HORIZONTAL CONNECTION ELEMENTS WHICH BECOME ON AT (0, 1) INPUT
- ⊕ HORIZONTAL CONNECTION ELEMENTS WHICH BECOME ON AT (1, 1) INPUT
- ◉ CURRENT PATH AT EACH INPUT
- ○ CURRENT PATH

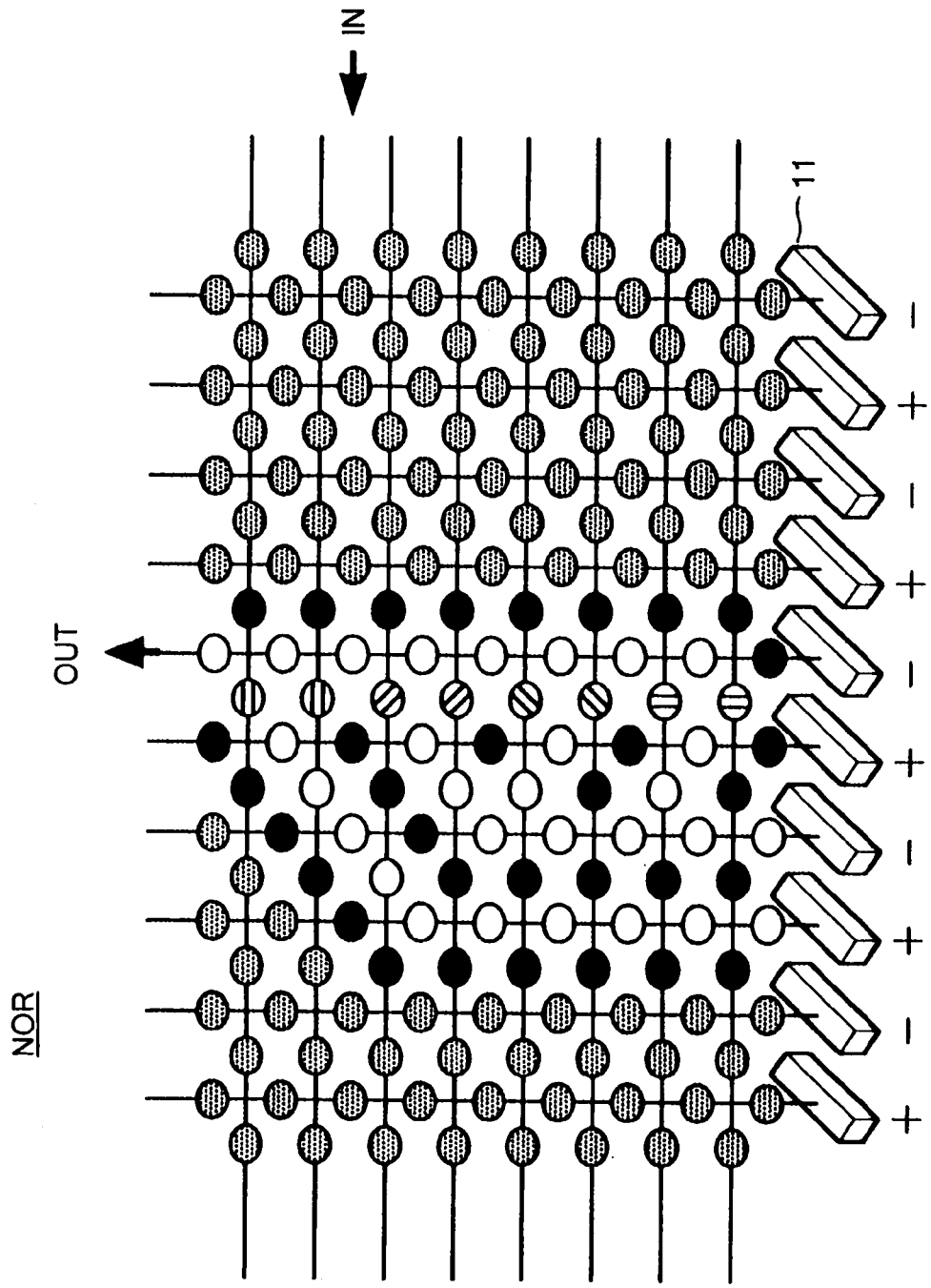

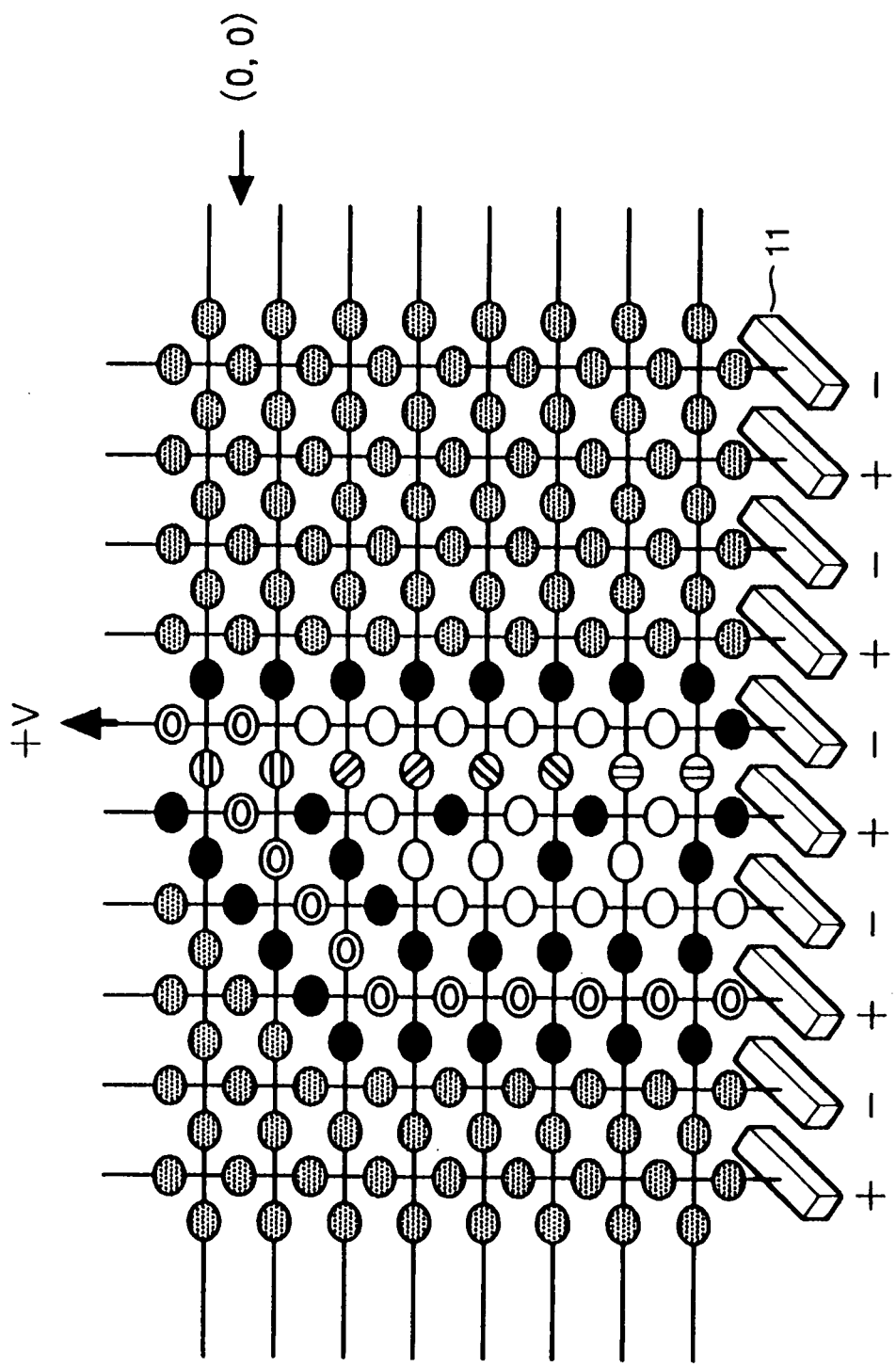

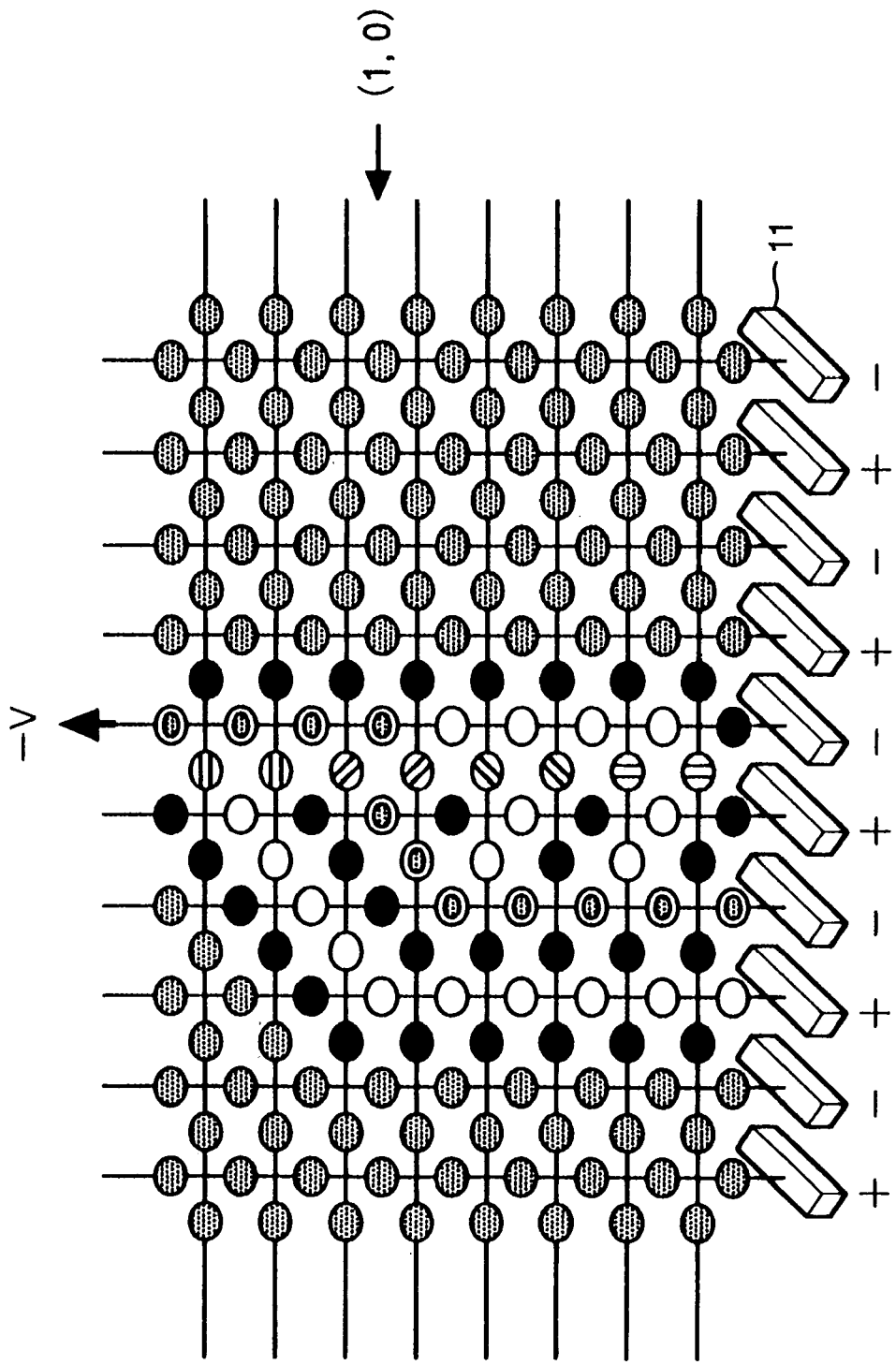

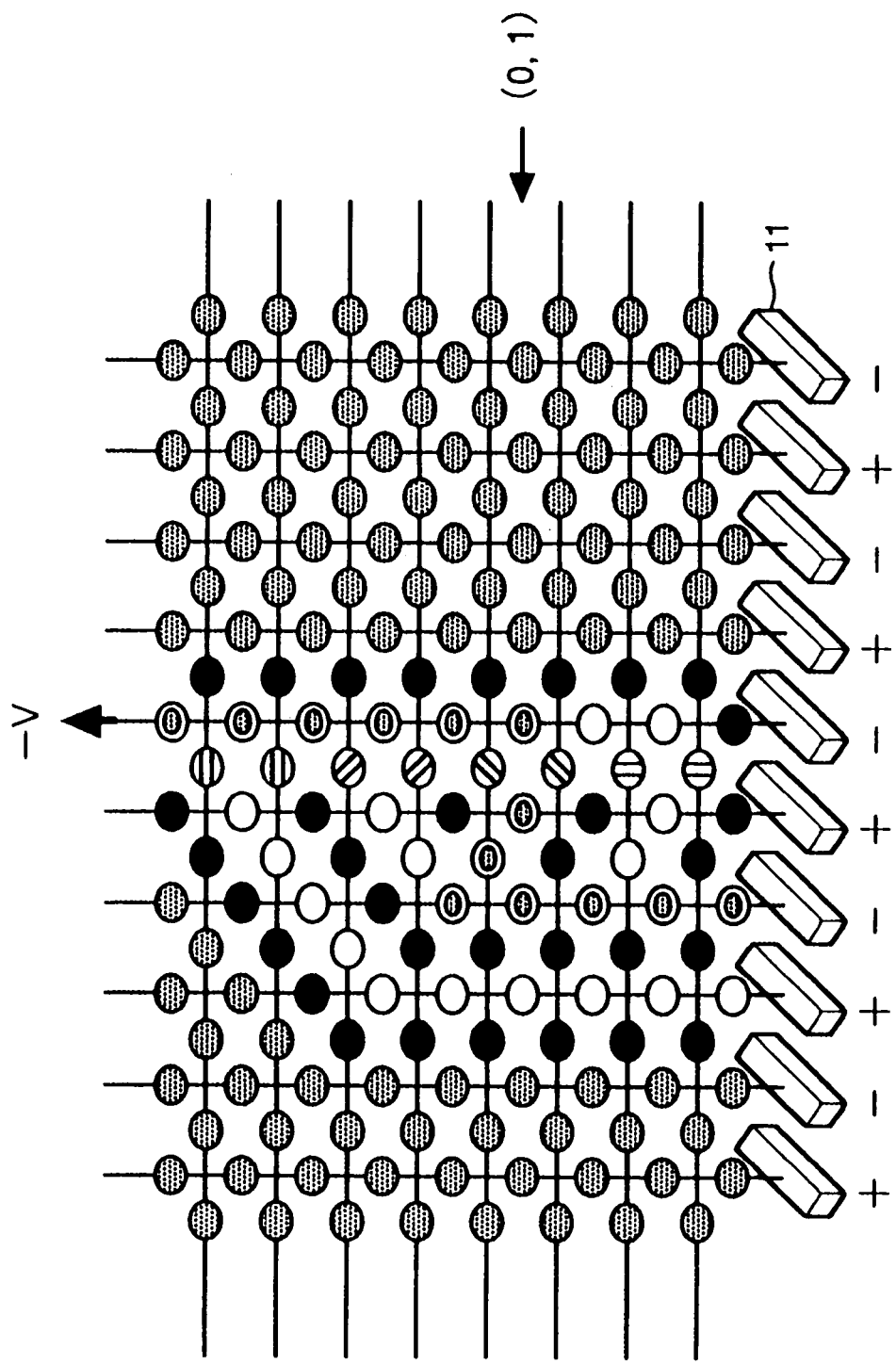

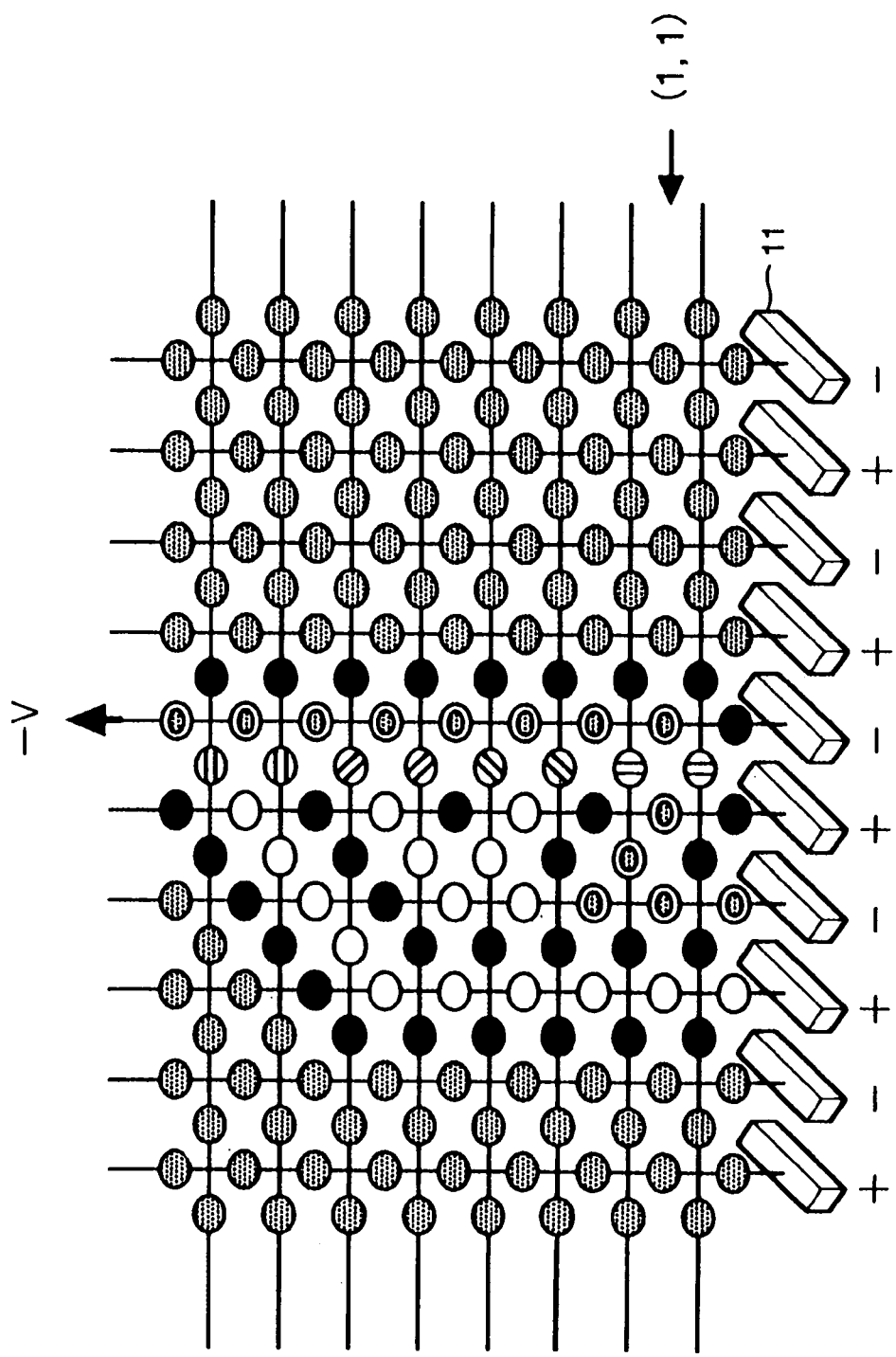

FIG. 20

- ⊕ ELEMENTS NOT YET SET IN FUNCTION
- ● ELEMENTS TURNED OFF FOR FORMING NOR LOGIC CIRCUIT
- ⊖ HORIZONTAL CONNECTION ELEMENTS WHICH BECOME ON AT (0, 0) INPUT
- ⊘ HORIZONTAL CONNECTION ELEMENTS WHICH BECOME ON AT (1, 0) INPUT
- ⊘ HORIZONTAL CONNECTION ELEMENTS WHICH BECOME ON AT (0, 1) INPUT
- ⊕ HORIZONTAL CONNECTION ELEMENTS WHICH BECOME ON AT (1, 1) INPUT
- ◉ CURRENT PATH AT EACH INPUT
- ○ CURRENT PATH

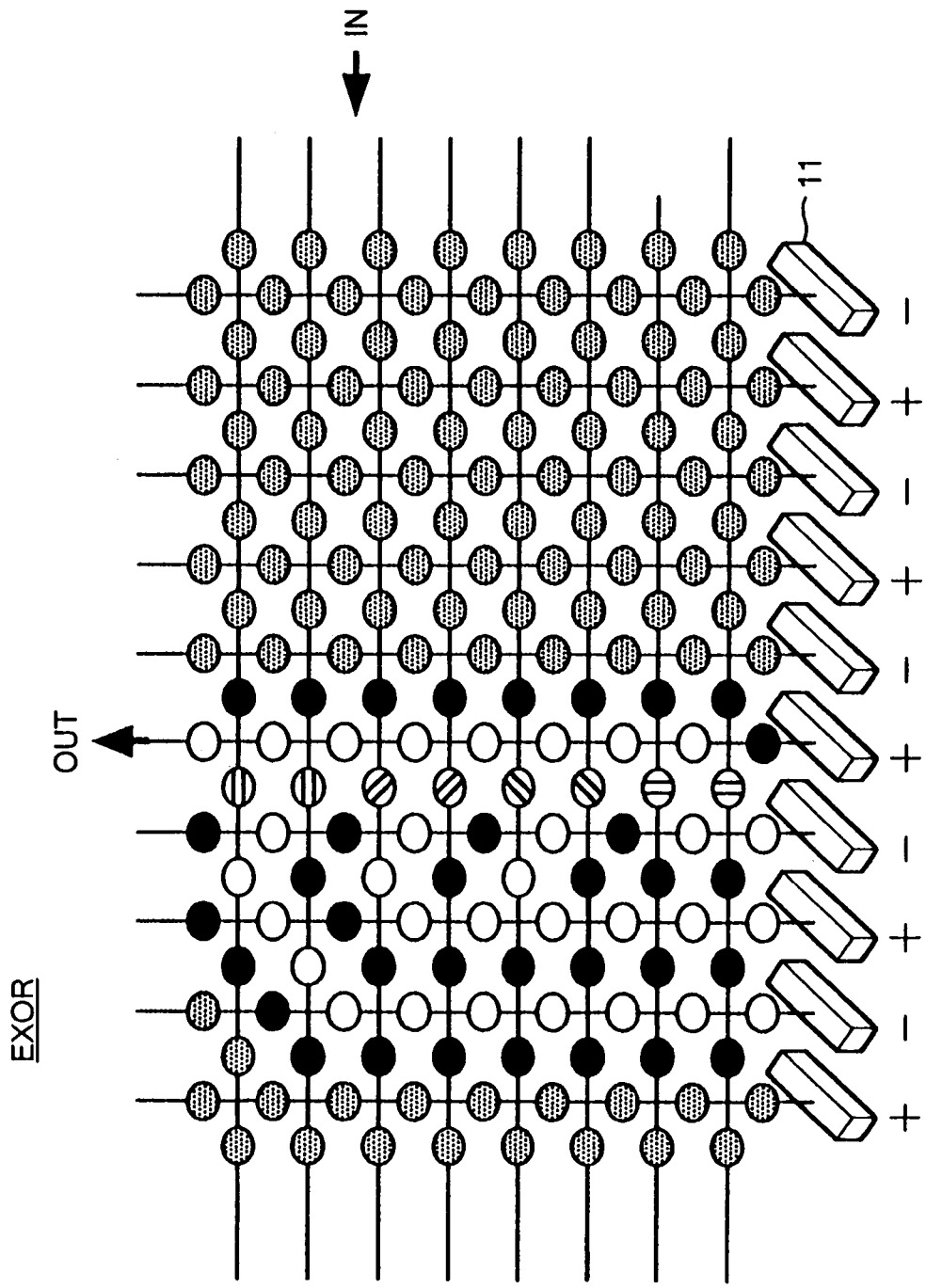

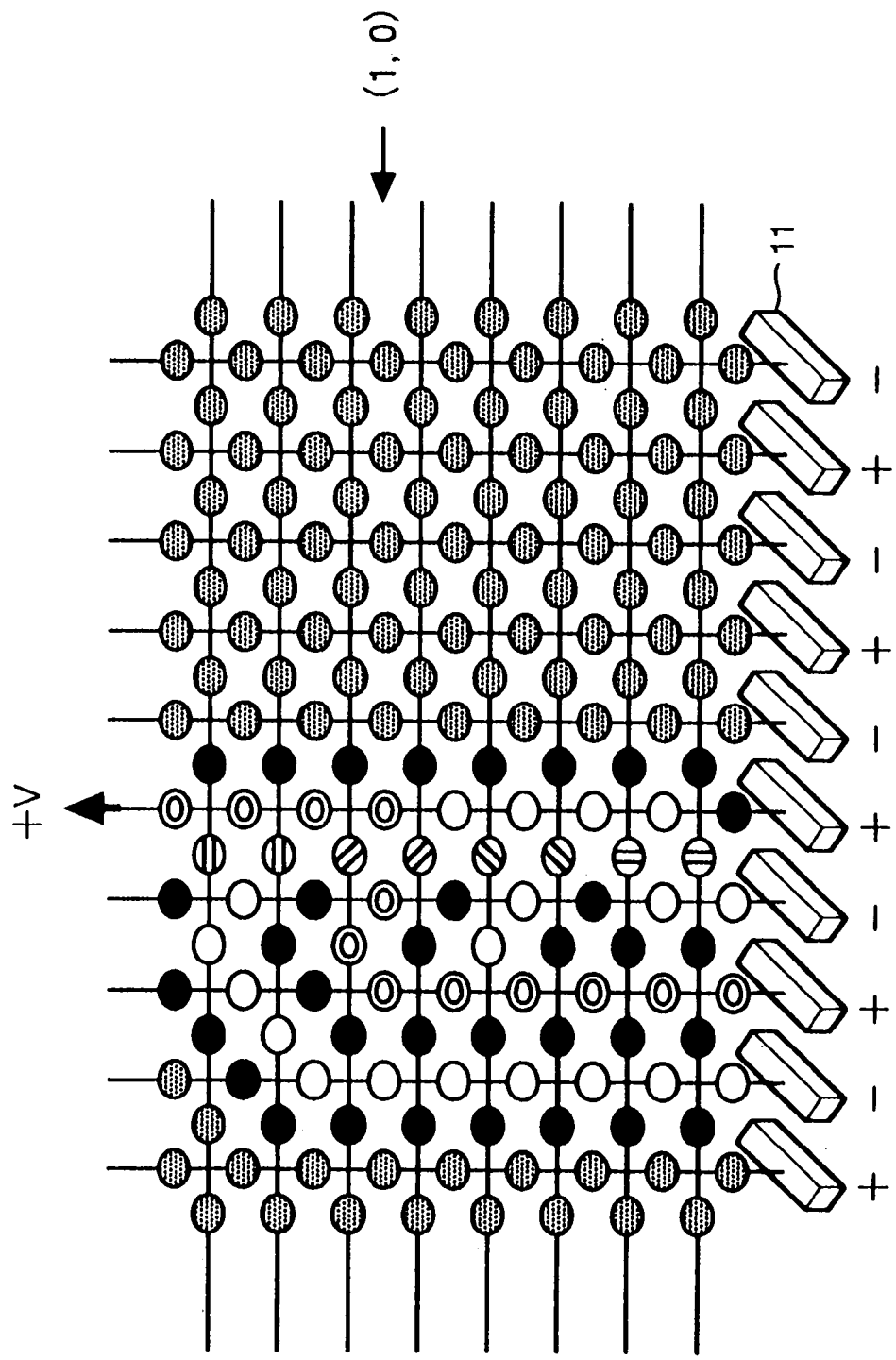

FIG. 22

⊛ ELEMENTS NOT YET SET IN FUNCTION
● ELEMENTS TURNED OFF FOR FORMING EXCLUSIVE OR LOGIC CIRCUIT
⊖ HORIZONTAL CONNECTION ELEMENTS WHICH BECOME ON AT (0, 0) INPUT
⊘ HORIZONTAL CONNECTION ELEMENTS WHICH BECOME ON AT (1, 0) INPUT
⊘ HORIZONTAL CONNECTION ELEMENTS WHICH BECOME ON AT (0, 1) INPUT
⊕ HORIZONTAL CONNECTION ELEMENTS WHICH BECOME ON AT (1, 1) INPUT
◉ CURRENT PATH AT EACH INPUT
○ CURRENT PATH

Inclusive AND

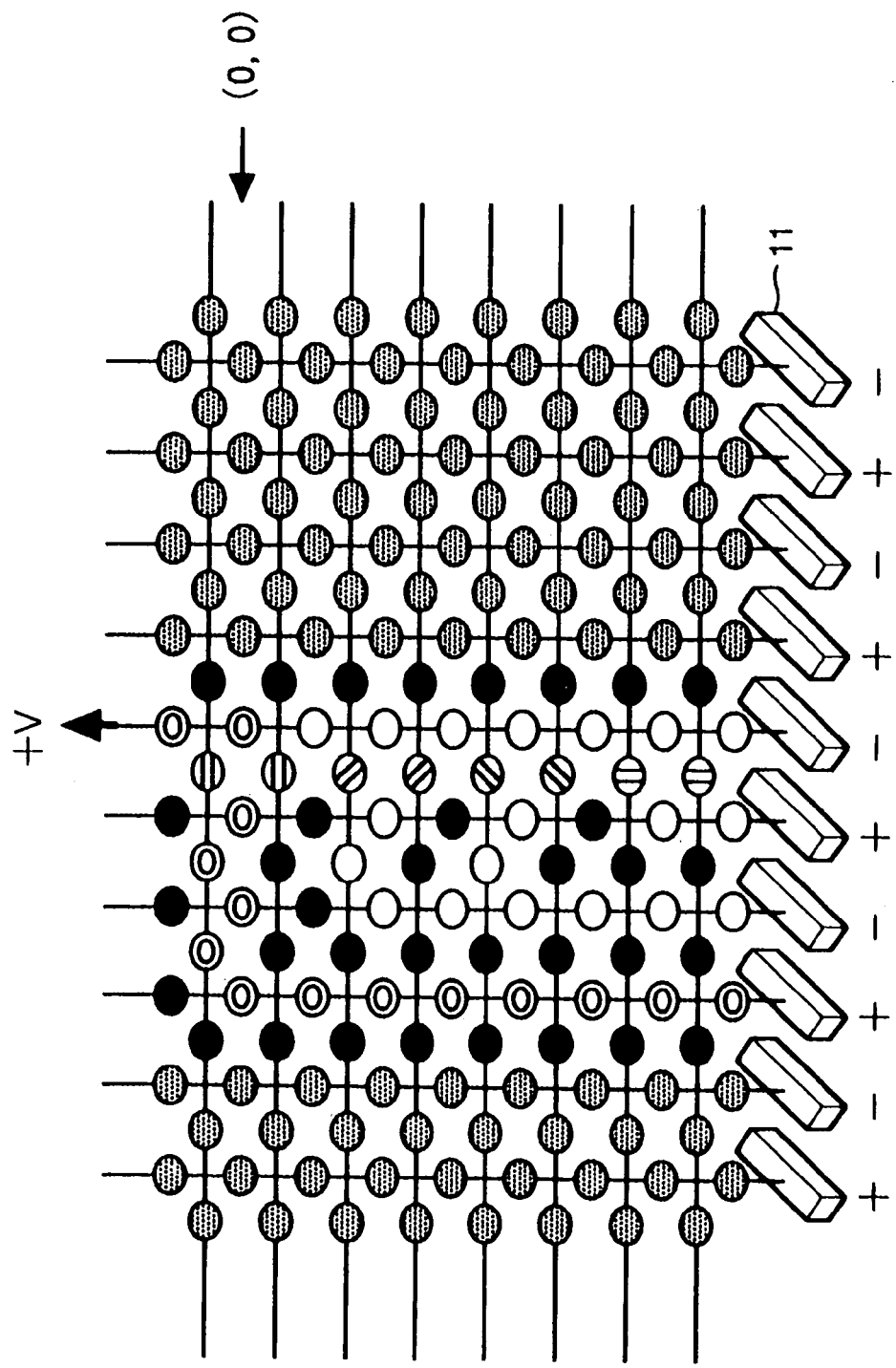

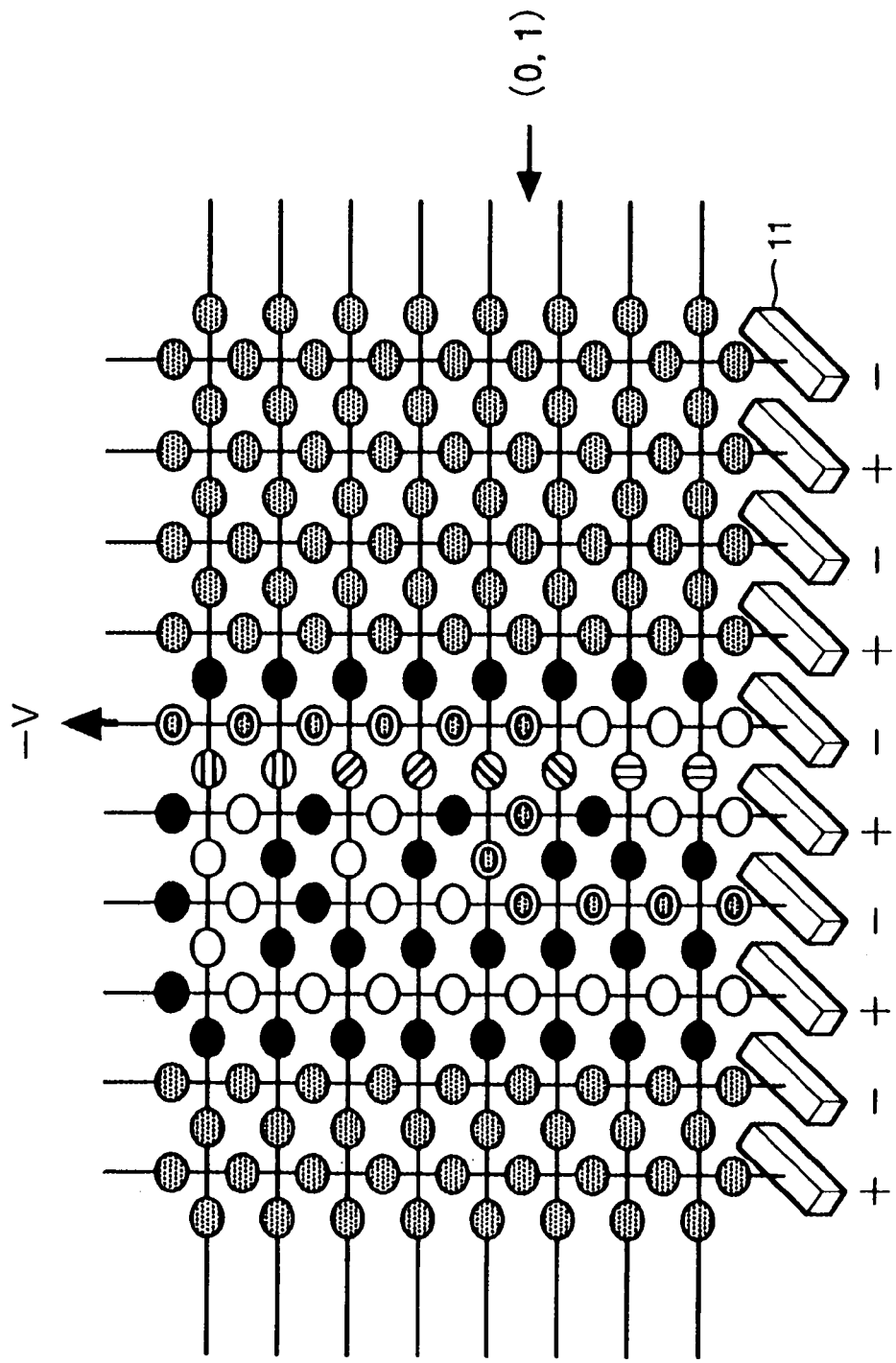

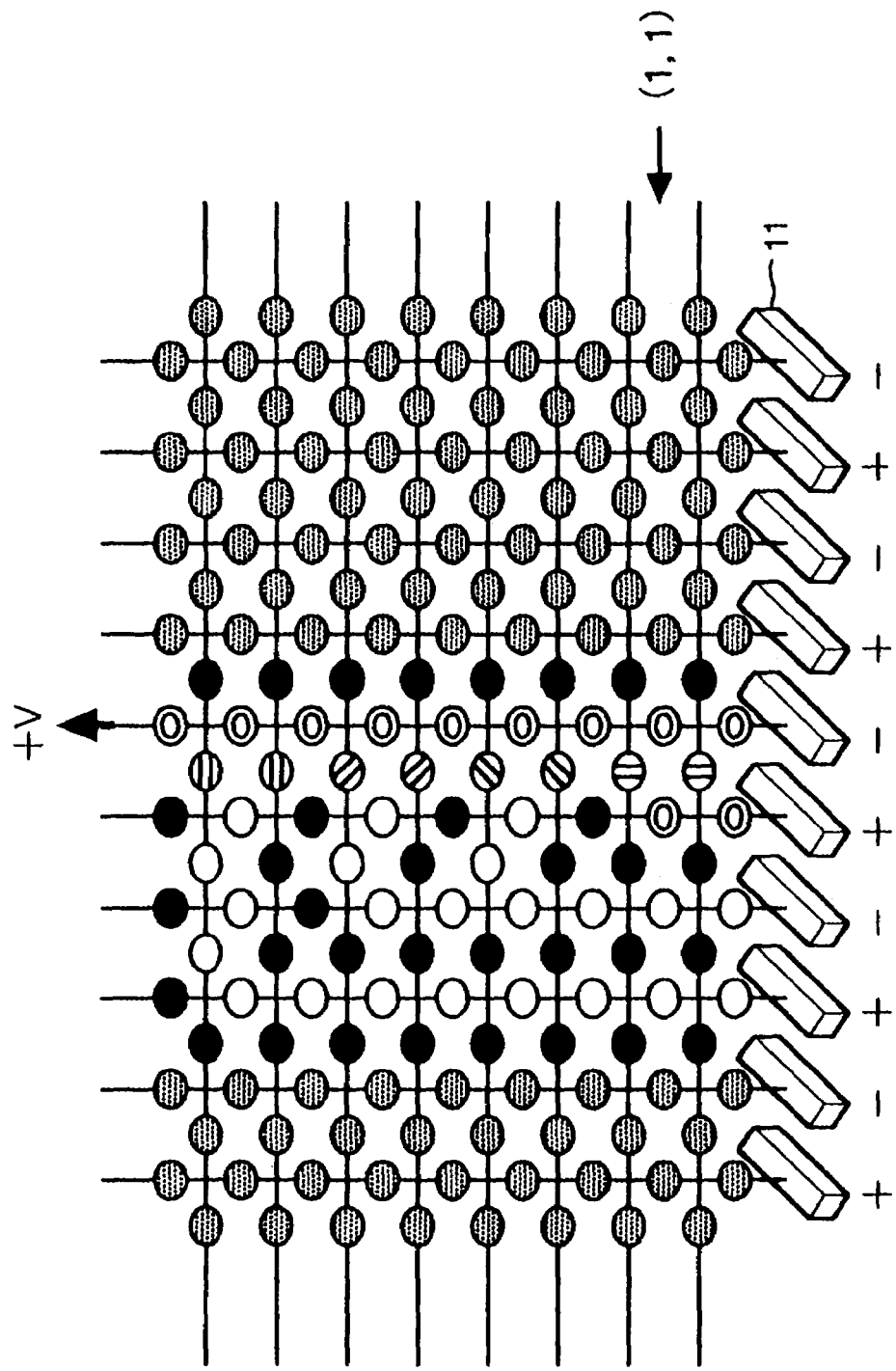

FIG. 24

- ⊛ ELEMENTS NOT YET SET IN FUNCTION
- ● ELEMENTS TURNED OFF FOR FORMING INCLUSIVE AND LOGIC CIRCUIT
- ⊖ HORIZONTAL CONNECTION ELEMENTS WHICH BECOME ON AT (0, 0) INPUT
- ⦸ HORIZONTAL CONNECTION ELEMENTS WHICH BECOME ON AT (1, 0) INPUT
- ⊘ HORIZONTAL CONNECTION ELEMENTS WHICH BECOME ON AT (0, 1) INPUT
- ⦻ HORIZONTAL CONNECTION ELEMENTS WHICH BECOME ON AT (1, 1) INPUT
- ◎ CURRENT PATH AT EACH INPUT
- ○ CURRENT PATH

Half Adder

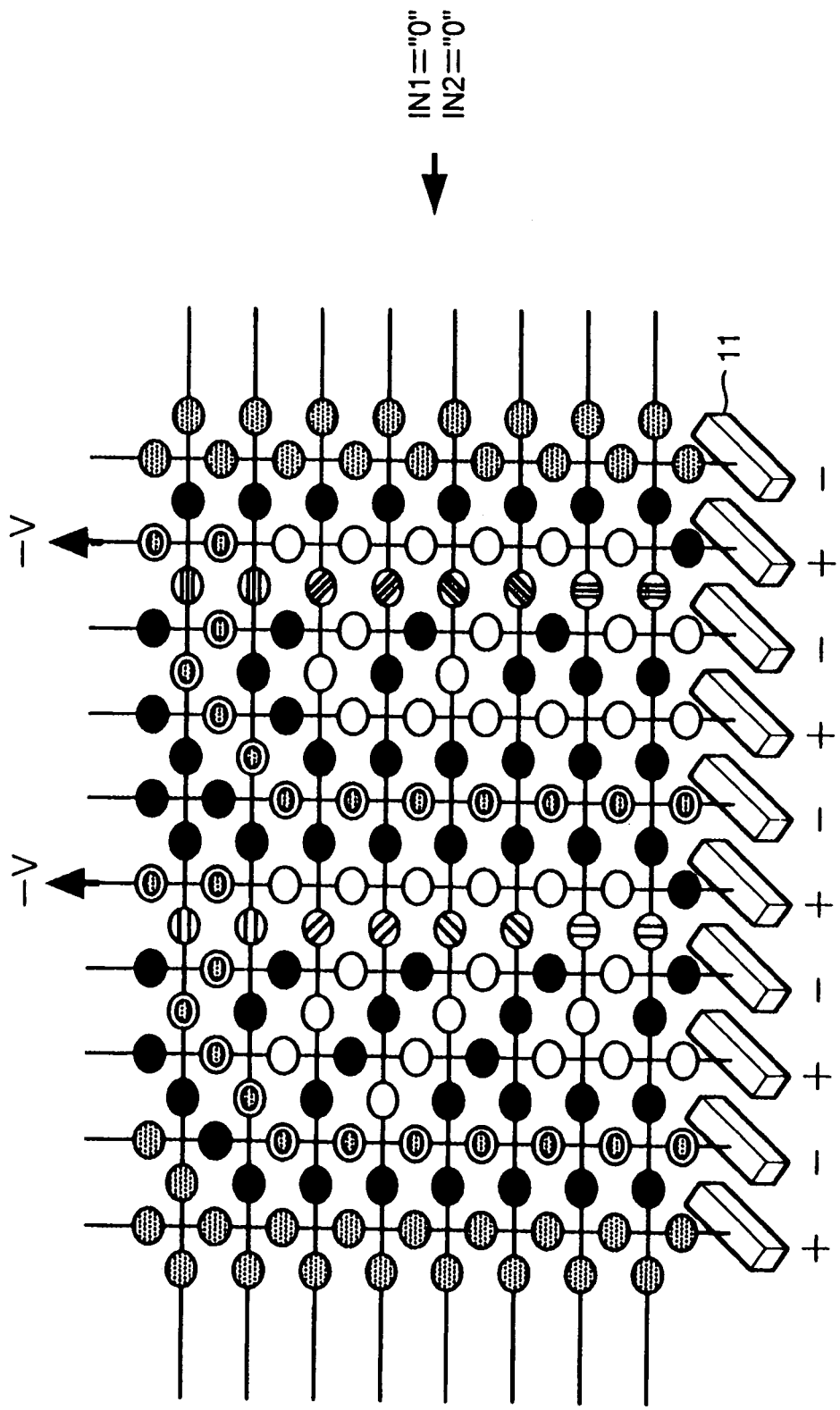

FIG. 26

- ELEMENTS NOT YET SET IN FUNCTION
- ELEMENTS TURNED OFF FOR FORMING HALF-ADDER LOGIC CIRCUIT

- CURRENT PATH IN EACH COMPUTATION
- HORIZONTAL CONNECTION ELEMENTS WHICH BECOME ON IN CASE OF COMBINATION WHERE INPUT 1 AND INPUT 2 ARE (0, 0)
- HORIZONTAL CONNECTION ELEMENTS WHICH BECOME ON IN CASE OF COMBINATION WHERE INPUT 1 AND INPUT 2 ARE (1, 0)
- HORIZONTAL CONNECTION ELEMENTS WHICH BECOME ON IN CASE OF COMBINATION WHERE INPUT 1 AND INPUT 2 ARE (0, 1)
- HORIZONTAL CONNECTION ELEMENTS WHICH BECOME ON IN CASE OF COMBINATION WHERE INPUT 1 AND INPUT 2 ARE (1, 1)

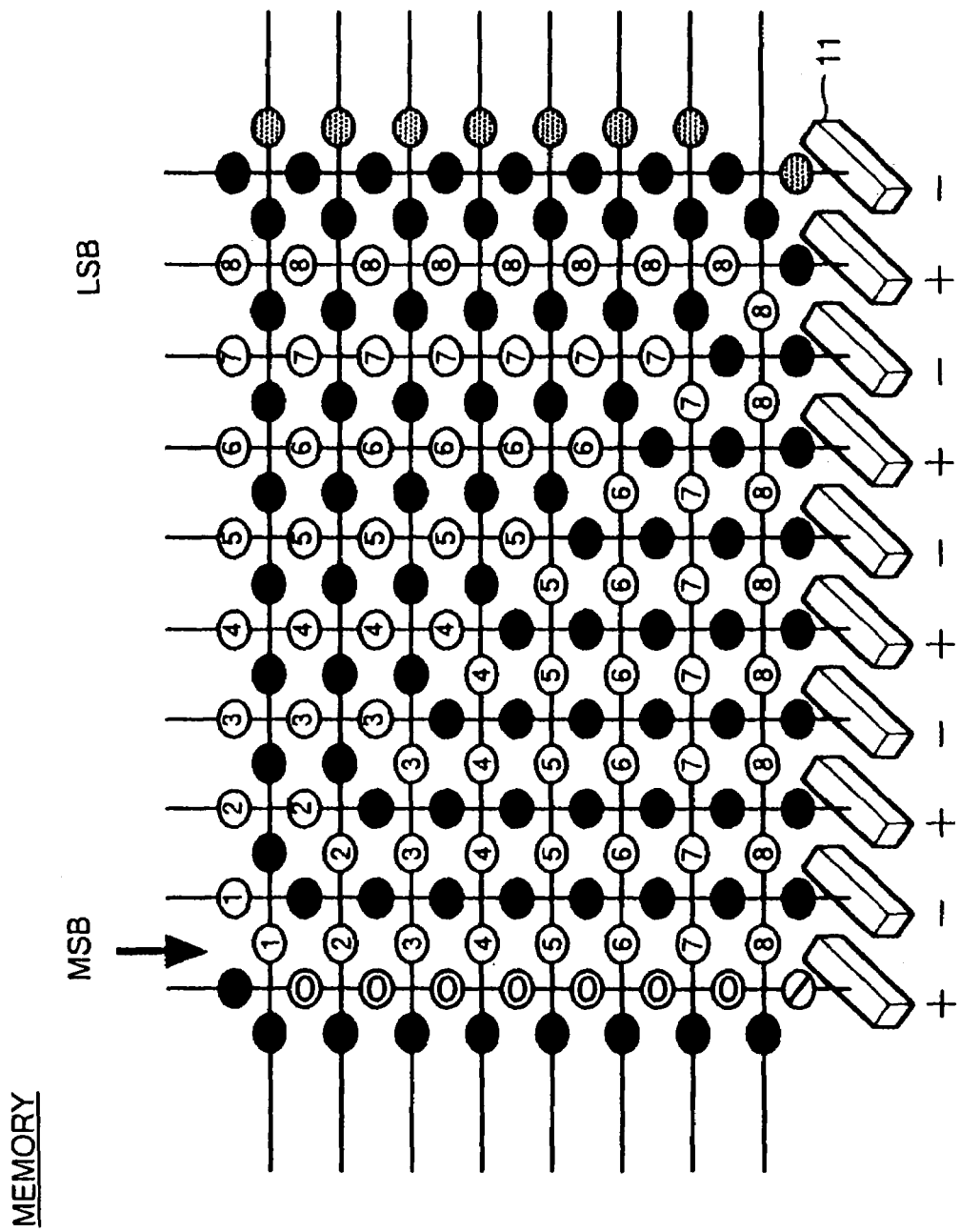

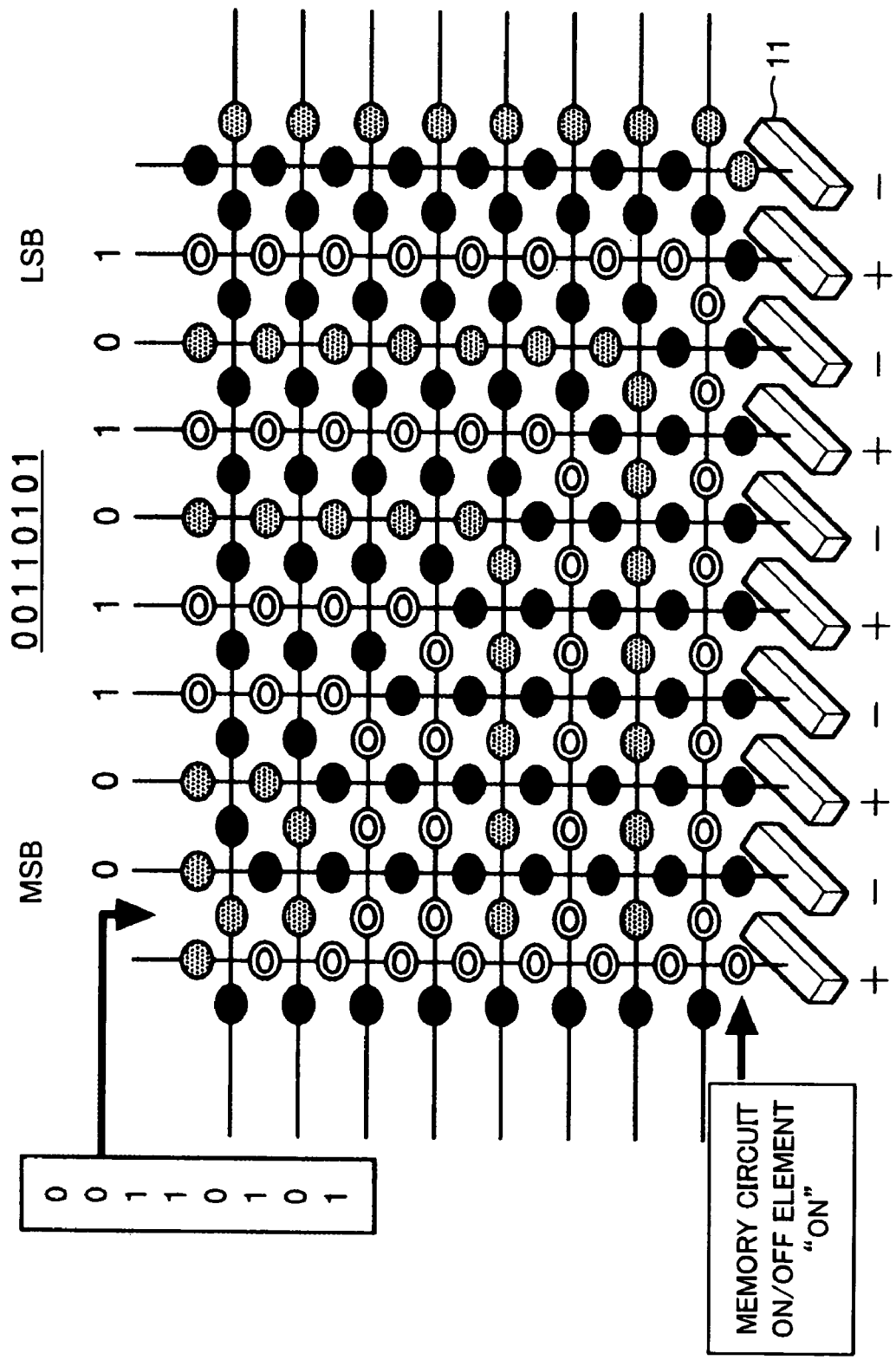

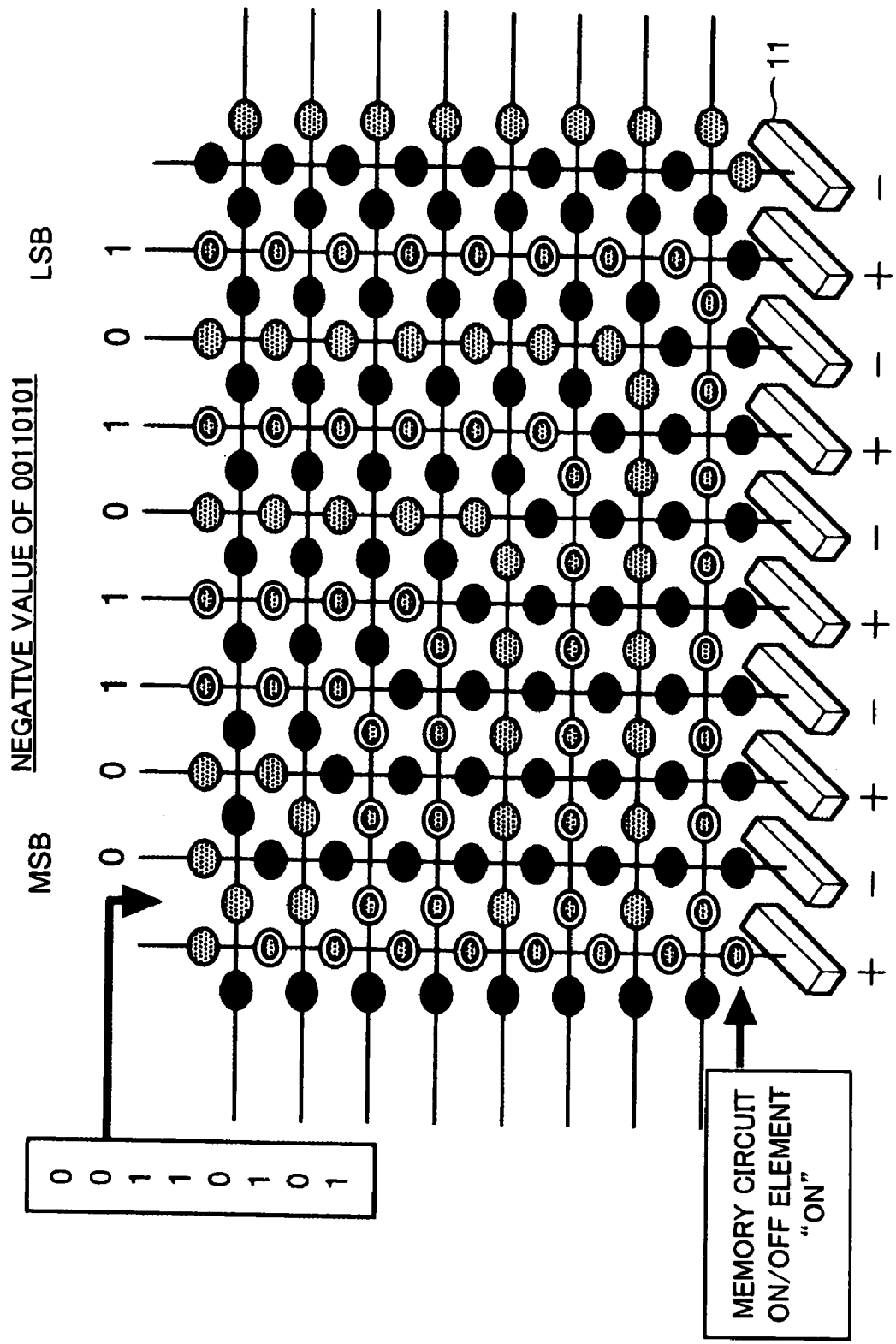

FIG. 28

- ⊛ ELEMENTS NOT YET SET IN FUNCTION
- ● ELEMENTS TURNED OFF FOR FORMING MEMORY CIRCUIT
- ⊘ MEMORY CIRCUIT ON/OFF ELEMENT
- ○ CURRENT PATH

SEMICONDUCTOR-INTEGRATED CIRCUIT UTILIZING MAGNETORESISTIVE EFFECT ELEMENTS

CROSS REFERENCE TO RELATED APPLICATIONS

This application is a 371 of PCT/JP03/04255, filed on Apr. 3, 2003, which in turn claims priority from Japanese applications Nos. 2002-101092 filed on Apr. 3, 2002 and 2002-301323 filed on Oct. 16, 2002, the entire contents of which are hereby incorporated by reference.

TECHNICAL FIELD

The present invention relates to an integrated circuit device configured by a logic circuit and a memory circuit and changing in function every certain time interval and a method of configuration and a method of production of an integrated circuit device, more particularly relates to an architecture of an integrated circuit device for dynamically securing an address space to be used for obtaining a targeted logic function and memory function in elements or a set of integrated circuits having addresses allocated thereto and performing instruction processing or action as a memory, a method of configuration of an integrated circuit device, and a method of production of an integrated circuit device.

BACKGROUND ART

In image processing, audio processing, mobile terminal, or other information communication apparatuses or processing apparatuses, an integrated circuit devices configured by logic elements and memory elements are being required to offer higher performance such as higher integration, higher speed, and improved functions. Conventionally, these integrated circuit devices are configured by portions for performing the logic operations and portions configured by memory elements for temporarily storing data and instructions such as cache memories and main memories. Further, the portions for performing the logic operations are physically and two-dimensionally divided into spaces for each function such as integer operations, floating point operations, image processing, audio processing, data processing, and input/output. Further, the allocated space (domain) regions are fixed in advance. These integrated circuit devices with functions allocated to two-dimensional spaces in advance are mainly configured by MOS transistors.

In a conventional integrated circuit device provided with a logic circuit configured by MOS transistors and a memory region configured by a SRAM, a DRAM, and a flash memory, the roles of the elements are clearly divided between logic elements and memory elements. Further, the logic circuit is divided into space regions for each function such as integer operations, floating point operations, image processing, audio processing, data processing, and input/output. These space regions are fixed in advance.

In such a configuration, the degree of integration has been improved in each region by the methods explained below. For example, in the logic element circuit, the degree of integration has been improved by miniaturization of the gate length and miniaturization of the inter-gate pitch. Further, in the memory element region, for example, in a DRAM, the degree of integration has been improved by reducing the pitch between cells by the miniaturization of the capacitors holding the charges and COB (capacitor on bit line) structure cells.

However, the conventional integrated circuit devices having logic elements and memory elements mounted together suffer from the following disadvantages.

First, in the improvement of the degree of integration, since the structure is restricted to a two-dimensional plane, the area in the two-dimensional plane is limited to the exposure range of the exposure apparatus used for the production of the integrated circuit device. Accordingly, the number of mounted elements is limited.

Second, the roles of the elements are clearly divided spatially between logic elements and memory elements. Further, the logic element region is also fixed in the two-dimensional space for individual purposes. Therefore, in order to newly add functions and expand functions, it suffers from the disadvantage in that a plurality of integrated circuit devices must be prepared for the required functions.

DISCLOSURE OF THE INVENTION

An object of the present invention is to provide an architecture of an integrated circuit, an architecture of an integrated circuit device, a method of configuration of an integrated circuit device, and a method of production of an integrated circuit device for overcoming the above disadvantage.

According to a first aspect of the present invention, there is provided a semiconductor integrated circuit device including a plurality of circuit elements functioning as part of a configured circuit; a plurality of connection elements each of which becomes a conductive state or a nonconductive state to connect or disconnect at least part of the circuit elements of said plurality of circuit elements to each other; interconnects for supplying control signals for placing said plurality of connection elements in said conductive state or nonconductive state; and a plurality of circuit selection switching elements which become a conductive state or a nonconductive state in response to a circuit configuration instruction signal in accordance with the desired circuit to be configured and apply said control signals to said interconnects in the conductive state.

According to a second aspect of the present invention, there is provided a semiconductor integrated circuit device wherein a control line for supplying said control signals is connected to an input terminal of the semiconductor integrated circuit device and is connected to another of said connection elements or another of said circuit elements and connected to an output terminal of the semiconductor integrated circuit device, and drive input terminals of the circuit switching elements are connected to terminals for applying said circuit configuration instruction signals.

According to a third aspect of the present invention, there is provided a method of configuring and using a desired circuit in a semiconductor integrated circuit device for operating said configured circuit.

According to a fourth aspect of the present invention, there is provided a semiconductor integrated circuit device including a semiconductor substrate, a plurality of circuit selection switching elements formed on said semiconductor substrate, a first insulating film formed on said semiconductor substrate, a power supply line formed at the first insulating film, and a first circuit forming layer having a second insulating film formed at said first insulating film and having a first interconnect used as a control line formed inside it, a magnetoresistance effect element formed on the surface of the second insulating film, and a second interconnect formed on the magnetoresistance effect element, wherein a via hole in which a conductive member is filled is formed in said second insulating film close to said magnetoresistance effect element, said power supply line is connected to one end of said conductive member, said second interconnect is connected to the other end of said conductive member, a drive input terminal of said circuit switching element is connected to a terminal for applying a circuit configuration instruction signal input from the outside of the semiconductor integrated circuit device, an input signal input from the outside of the semiconductor integrated circuit device is applied to said first interconnect of a portion functioning as a circuit element among said magnetoresistance effect elements, an output portion of said circuit selection switching element is connected to said first interconnect of the portion functioning as the connection element among said magnetoresistance effect elements, the output portion of said circuit selection switching element is connected to said second interconnect via the conductive member filled in the via hole formed in said first insulating film, connected to another of said connection elements or another of said circuit elements, and connected to the output terminal of the semiconductor integrated circuit device, said circuit selection switching element is driven in response to said circuit configuration instruction signal, the circuit selection switching element outputs said control signal, and a desired circuit can be configured by combining said circuit elements via said connection elements which become the conductive state or the nonconductive state in response to this control signal.

According to a fifth aspect of the present invention, there is provided a method of production of a semiconductor integrated circuit device comprising forming switching transistors on said semiconductor substrate as said circuit selection switching elements.

BRIEF DESCRIPTION OF THE DRAWINGS

FIGS. 11A to 11C are views of the configuration of a NOT circuit as an example of the circuit configuration according to the present invention and an operation thereof.

FIG. 12 is a graph of the states of the circuit elements and the connection elements of the NOT circuit illustrated in FIGS. 11A to 11C.

FIGS. 13A to 13E are views of the configuration of an AND circuit as an example of the circuit configuration according to the present invention and the operation thereof.

FIG. 14 is a graph of the states of the circuit elements and the connection elements of the AND circuit illustrated in FIGS. 13A to 13E.

FIGS. 15A to 15E are views of the configuration of an OR circuit as an example of the circuit configuration according to the present invention and the operation thereof.

FIG. 16 is a graph of the states of the circuit elements and the connection elements of the OR circuit illustrated in FIGS. 15A to 15E.

FIGS. 17A to 17E are views of the configuration of a NAND circuit as an example of the circuit configuration according to the present invention and the operation thereof.

FIG. 18 is a graph of the states of the circuit elements and the connection elements of the NAND circuit illustrated in FIGS. 17A to 17E.

FIGS. 19A to 19E are views of the configuration of a NOR circuit as an example of the circuit configuration according to the present invention and the operation thereof.

FIG. 20 is a graph of the states of the circuit elements and the connection elements of the NOR circuit illustrated in FIGS. 19A to 19E.

FIGS. 21A to 21E are views of the configuration of an exclusive OR (EXOR) circuit as an example of the circuit configuration according to the present invention and the operation thereof.

FIG. 22 is a graph of the states of the circuit elements and the connection elements of the EXOR circuit illustrated in FIGS. 21A to 21E.

FIGS. 23A to 23E are views of the configuration of an inclusive-AND circuit as an example of the circuit configuration according to the present invention and the operation thereof.

FIG. 24 is a graph of the states of the circuit elements and the connection elements of the inclusive-AND circuit illustrated in FIGS. 23A to 23E.

FIGS. 25A to 25E are views of the configuration of a half-adder circuit as an example of the circuit configuration according to the present invention and the operation thereof.

FIG. 26 is a graph of the states of the circuit elements and the connection elements of the half-adder circuit illustrated in FIGS. 25A to 25E.

FIGS. 27A to 27C are views of the configuration of a memory circuit as an example of the circuit configuration according to the present invention and the operation thereof.

FIG. 28 is a graph of the states of the circuit elements and the connection elements of the memory circuit illustrated in FIGS. 27A to 27C.

BEST MODE FOR CARRYING OUT THE INVENTION

An explanation will be given below of embodiments of the architectures of an integrated circuit and an integrated circuit device of the present invention.

An example of an integrated circuit device of the present invention will be explained below. The integrated circuit device of the present invention is an integrated circuit device configured by a plurality of elements or a plurality of integrated circuits which applies either of the methods of operation of the integrated circuit devices of the present invention explained before to repeatedly generate spaces acting as any circuit functions or release the addresses of circuit functions so as to divide in time and divide in space the functions of the elements or the integrated circuits.

Figure 34A:
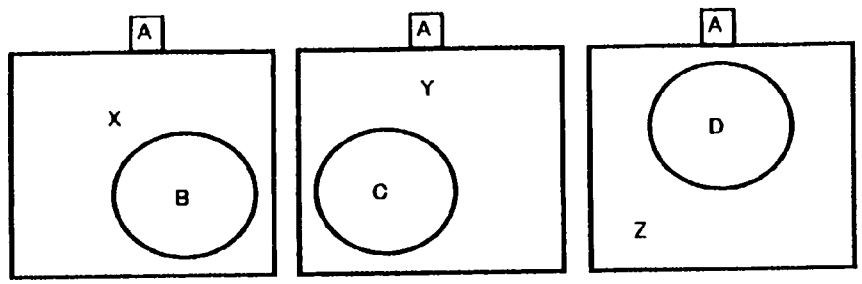
FIGS. 34A to 34C are views for explaining a circuit configuration and mode of usage in a semiconductor integrated circuit device as a first aspect of the present invention.
Figure 34B:
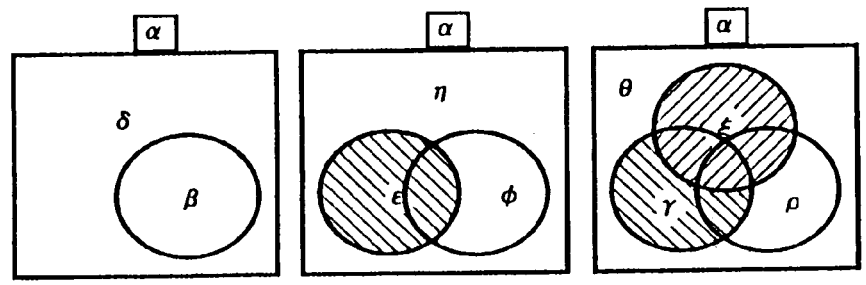
Figure 34C:
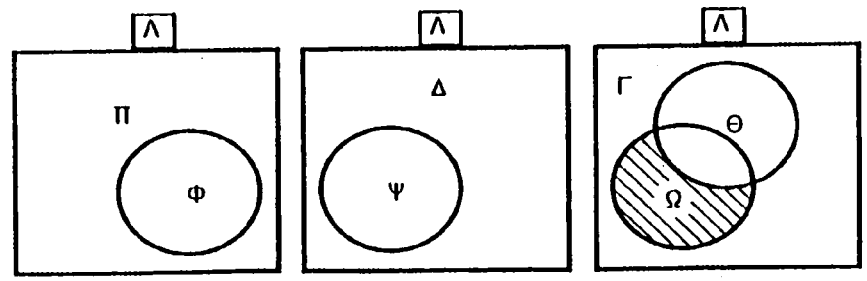

In general, an integrated circuit device providing a plurality of circuit functions, for example, as illustrated in FIGS. 34A to 34C, is realized by using as switching function elements either or both of magnetoresistance effect elements which become the conductive state or the nonconductive state in accordance with application of a magnetic field or resistance control elements which become the conductive state or the nonconductive state in accordance with application of a current (voltage) for the elements comprising the sets "A" and "α" and "Λ" of the elements.

Alternatively, it is comprised by using as the switching function elements either or both of the magnetoresistance effect elements and the resistance control element for the elements comprising the sets "A" and "α" and "Λ" of the elements and having the magnetoresistance effect elements and/or the resistance control elements stacked so as to be able to simultaneously write and read 2 bits or more worth of information.

Alternatively, it is comprised by repeating at least two times a structure using as the switching functional elements either or both of the magnetoresistance effect elements and the resistance control elements and having either or both of the magnetoresistance effect elements and the resistance control elements stacked so as to be able to process a binary input of the logic circuit and able to simultaneously write and read 2 bits=worth pf information.

The above resistance control element is described in for example IEDM Proceedings 01 "OUM A 180 nm Nonvolatile Memory Cell Element Technology For Stand Alone and Embedded Applications", Stefan Lai and Tyler Lowrey, p. 803–806. A resistance control element is a element having a resistance value changing by a large extent and becomes a conductive state or substantially nonconductive state between when voltage (current) is applied and when voltage is not applied.

Here, specifically, a description will be given taking as an example an integrated circuit device comprised of magnetoresistance effect elements formed in a three-dimensional cubic structure referring to a cubic diagram of an integrated circuit device comprised of magnetoresistance effect elements configuring a time divisional control logic circuit and memory circuit of FIG. 1.

Figure 1:
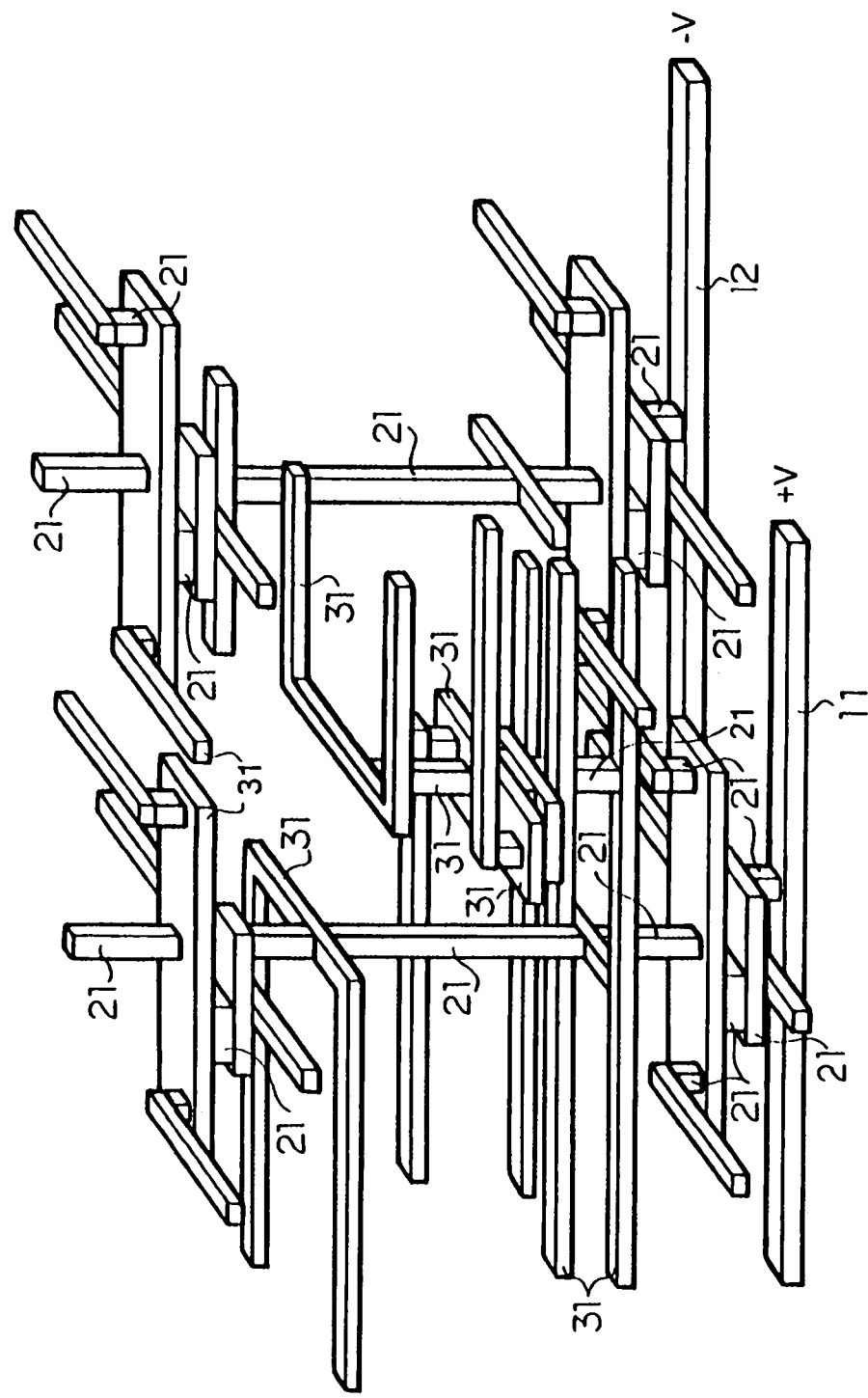
FIG. 1 is a perspective view schematically showing the configuration of a semiconductor integrated circuit device of the present invention.

As shown in FIG. 1, a lower portion of the integrated circuit device is formed with a power supply line 11 of a plus voltage (+V) and a power supply line 12 of a minus voltage (−V). These power supply lines are connected to a group of magnetoresistance effect field switching elements connected in series in a vertical direction with respect to the power supply lines 11 and 12. The group of the magnetoresistance effect field switching elements connected in series in the vertical direction with respect to these power supply lines 11 and 12 will be referred to as the "vertical connection elements 21". Next, magnetoresistance effect field switching elements are provided for connecting the vertical connection elements 21 in a horizontal direction. These magnetoresistance effect field switching elements will be referred to as the "horizontal connection elements 31". The vertical connection elements 21 secure current paths from the power supply lines 11 and 12 and, at the same time, designate the current path of a signal line together with the horizontal connection elements 31. In the present embodiment, an example of stacking nine layers of the vertical connection elements 21 and eight layers of the horizontal connection elements 31 is shown, but the number of these connection elements 21 and 31 stacked is not limited.

Figure 2:
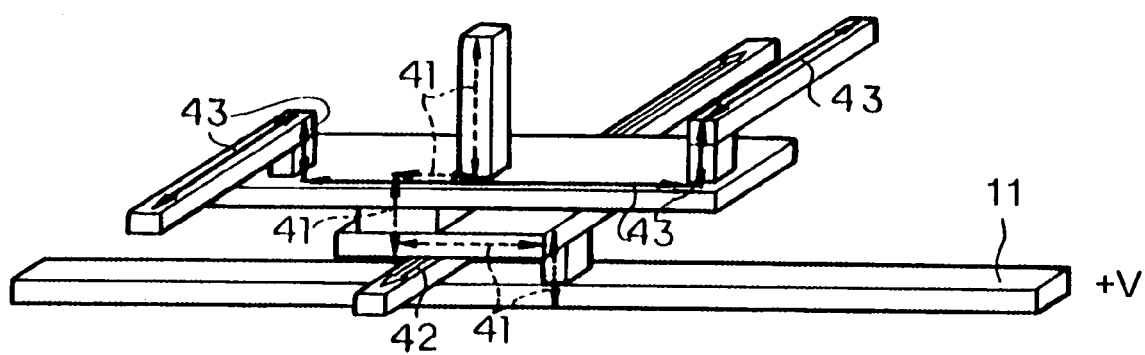
FIG. 2 is a partial enlarged view of the semiconductor integrated circuit device illustrated in FIG. 1.

As shown in FIG. 2, a magnetic field inversion signal line for inverting the magnetic field of the magnetoresistance effect elements is separately formed at each vertical connection element 21 and horizontal connection element 31. In the illustration of FIG. 2, a signal line current path 41, a magnetoresistance effect element field inversion lower signal line current path 42, and a magnetoresistance effect element field inversion upper signal line current path 43 are indicated by arrows. Namely, the magnetoresistance effect element field inversion lower signal line current path 42 and the magnetoresistance effect element field inversion upper signal line current path 43 form the magnetic field inversion signal line.

Next, a description will be given of the procedure for stacking the vertical connection elements 21 and the horizontal connection elements 31 one after another by referring to the schematic layout views and partial enlarged views of FIG. 3 to FIG. 10.

Figure 3:
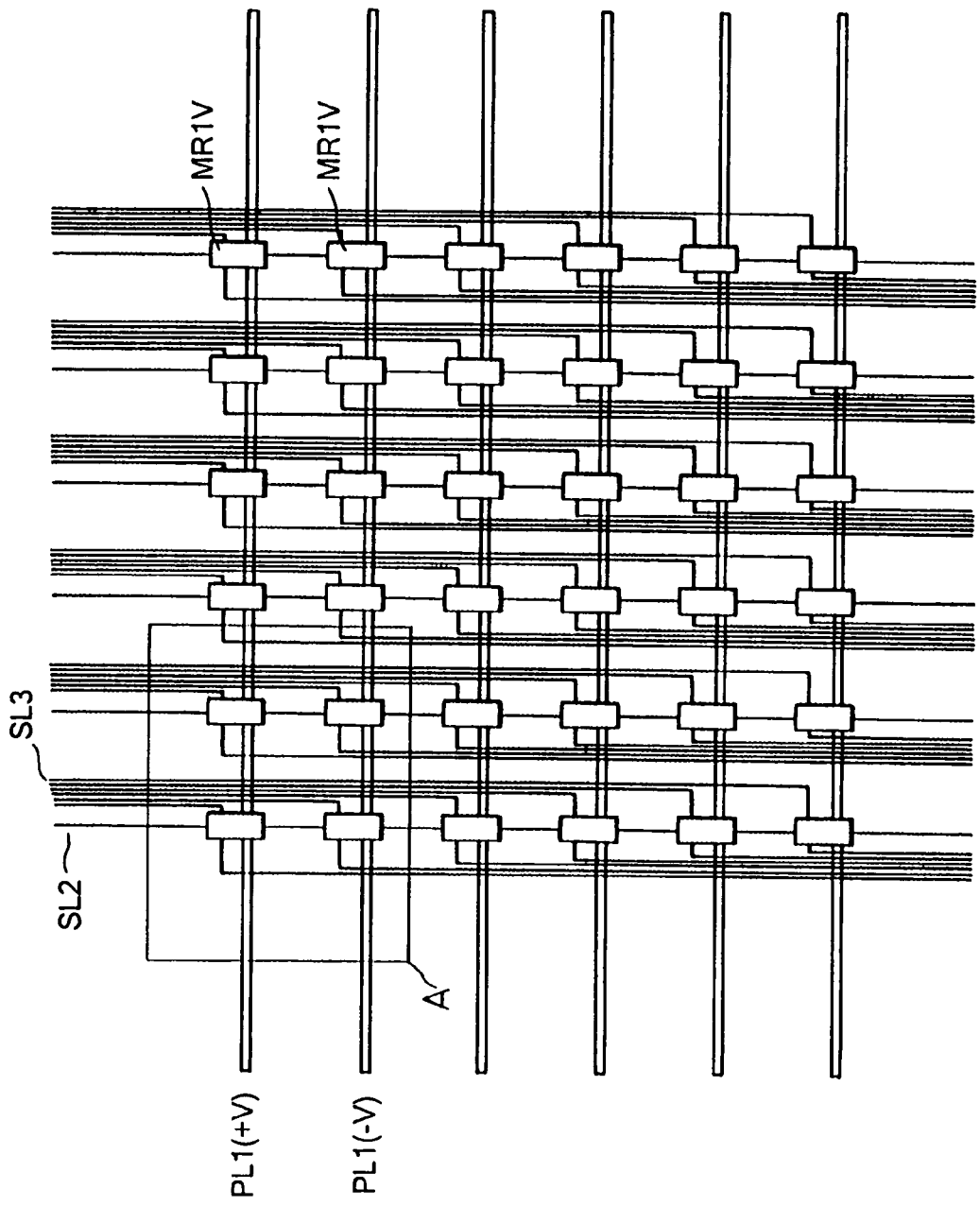
FIG. 3 to FIG. 10 are views of arrangements of connection elements using magnetoresistance effect elements for configuring the semiconductor integrated circuit device illustrated in FIG. 1 and FIG. 2.
Figure 4:
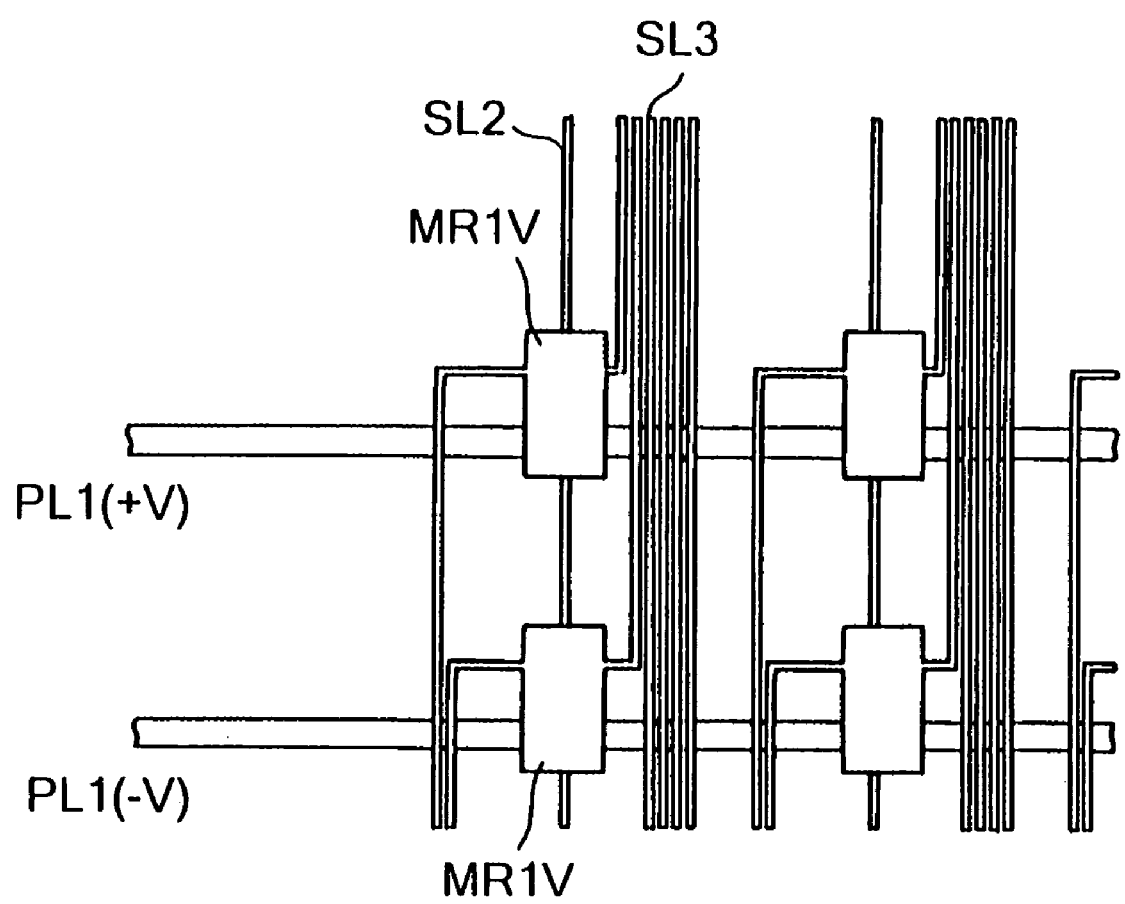

In the schematic layout view of FIG. 3 and an A portion enlarged view in FIG. 3 of FIG. 4, configurations of a (+V) power supply line PL1 (+V), a (−V) power supply line PL1 (−V), and first stage vertical connection elements MR1V are shown.

In the illustrations of FIG. 3 and FIG. 4, as illustrated in FIG. 2, the power supply lines (or power feed lines) PL1 (+V) and PL1 (−V) are formed in a first layer (lowermost layer), and first stage vertical connection elements MR1V using magnetoresistance effect field switching elements functioning as vertical connection elements 21 illustrated in FIG. 1 are connected to these power supply lines PL1 (+V) and PL1 (−V). In order to drive the first stage vertical connection elements MR1V formed by these magnetoresistance effect field switching elements, a second layer magnetoresistance effect field switching element use magnetic field inversion lower signal line SL2 and a third layer magnetoresistance effect field switching element use magnetic field inversion upper signal line SL3 are formed.

Figure 5:
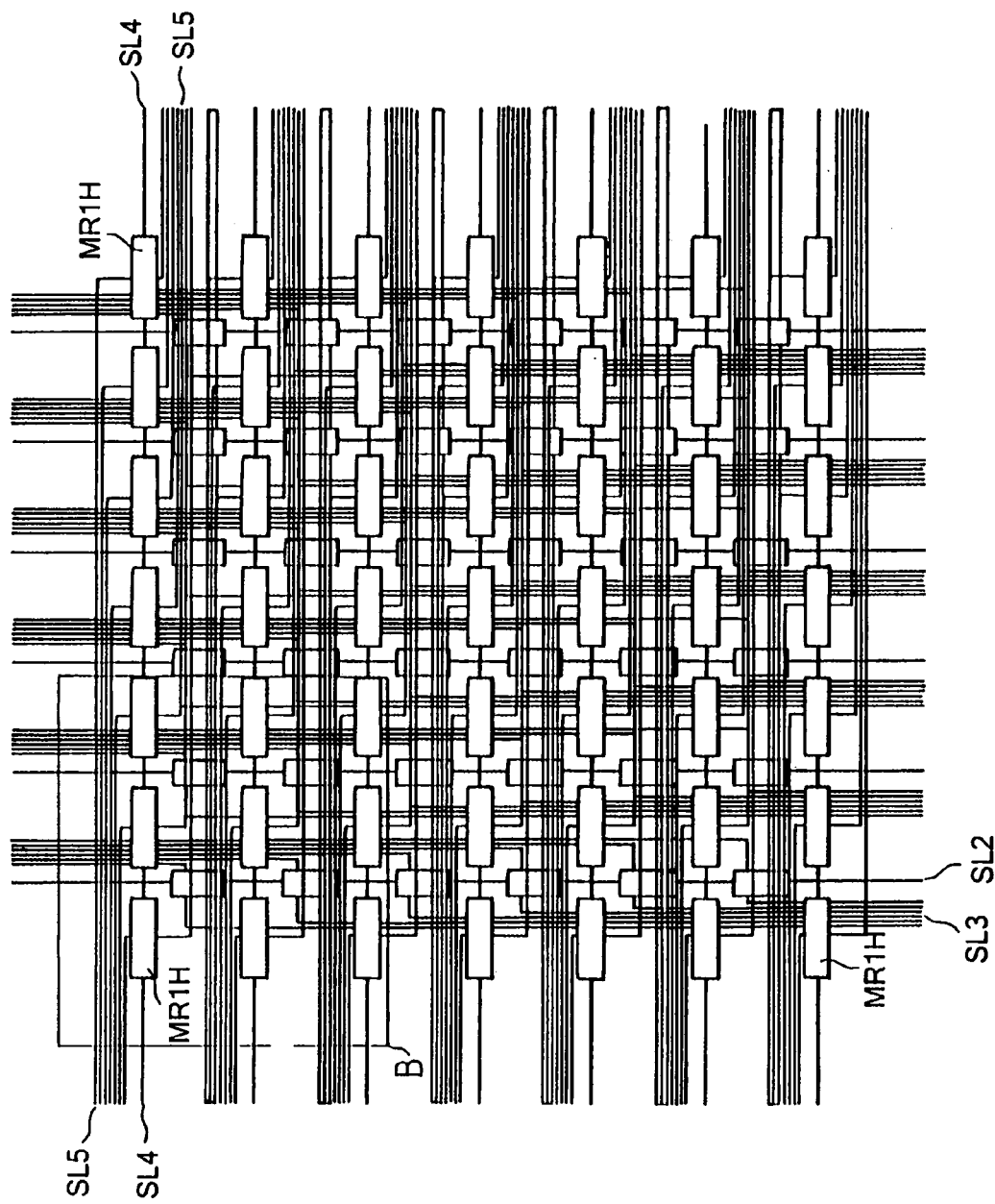
Figure 6:
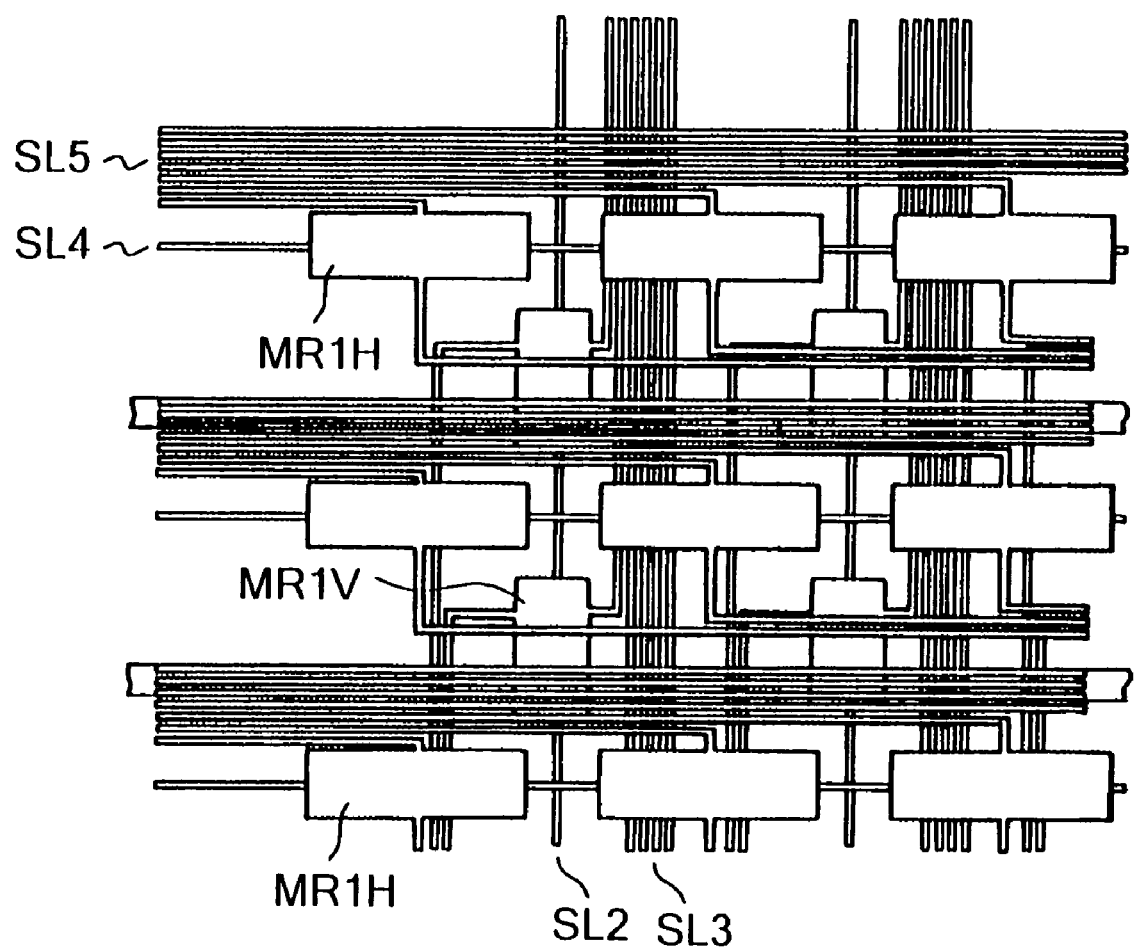

In the schematic layout view of FIG. 5 and a B portion enlarged view in FIG. 5 of FIG. 6, a configuration of stacking first stage horizontal connection elements MR1H on the first stage vertical connection elements MR1V is shown.

Namely, first stage horizontal connection elements MR1H are provided using magnetoresistance effect field switching elements functioning as the horizontal connection elements 31 illustrated in FIG. 1. In order to drive the first stage horizontal connection elements MR1H formed by these magnetoresistance effect field switching elements, a fourth layer magnetoresistance effect field switching element use magnetic field inversion lower signal line SL4 and a fifth layer magnetoresistance effect field switching element use magnetic field inversion upper signal line SL5 are formed.

Figure 7:
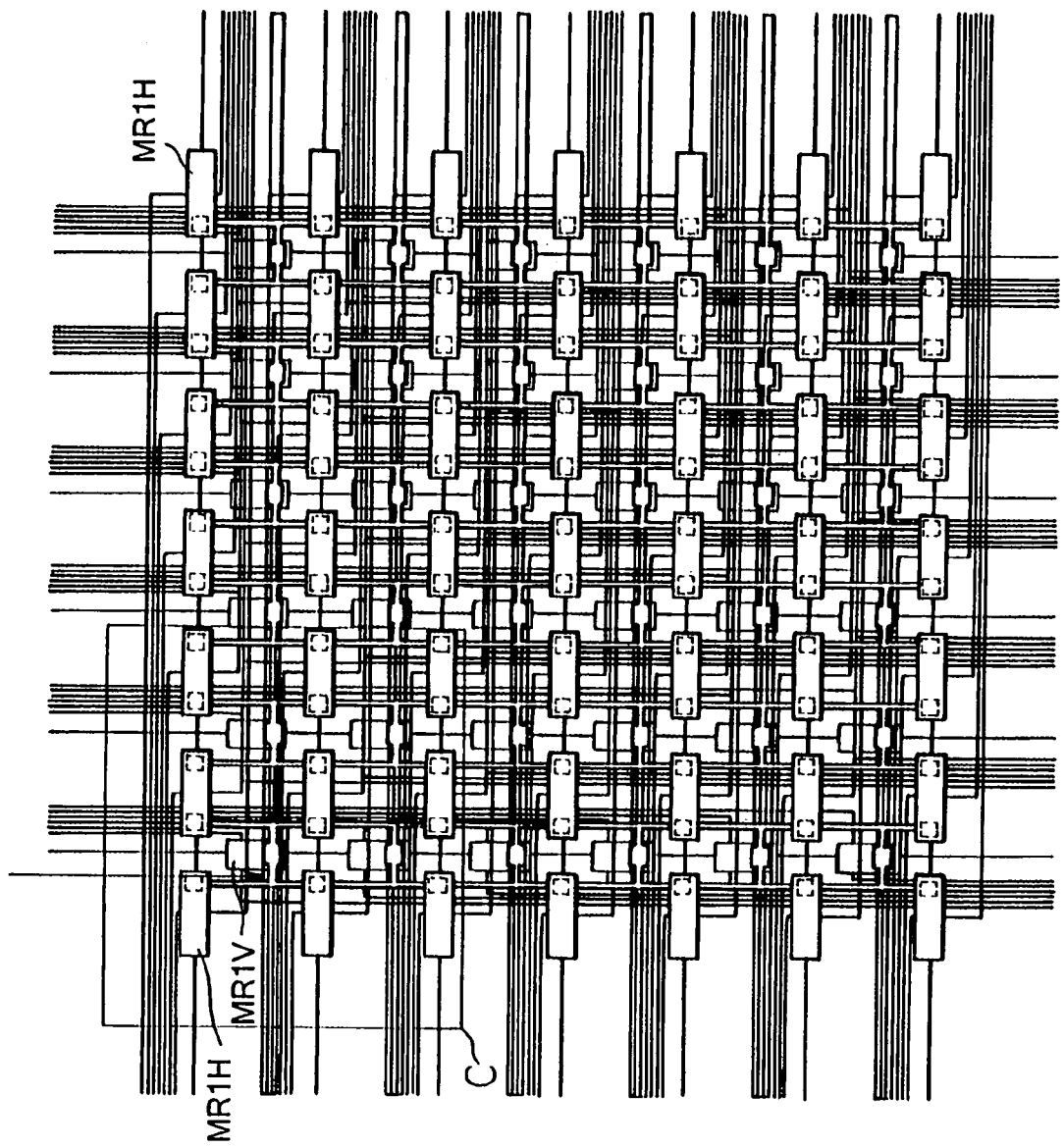
Figure 8:
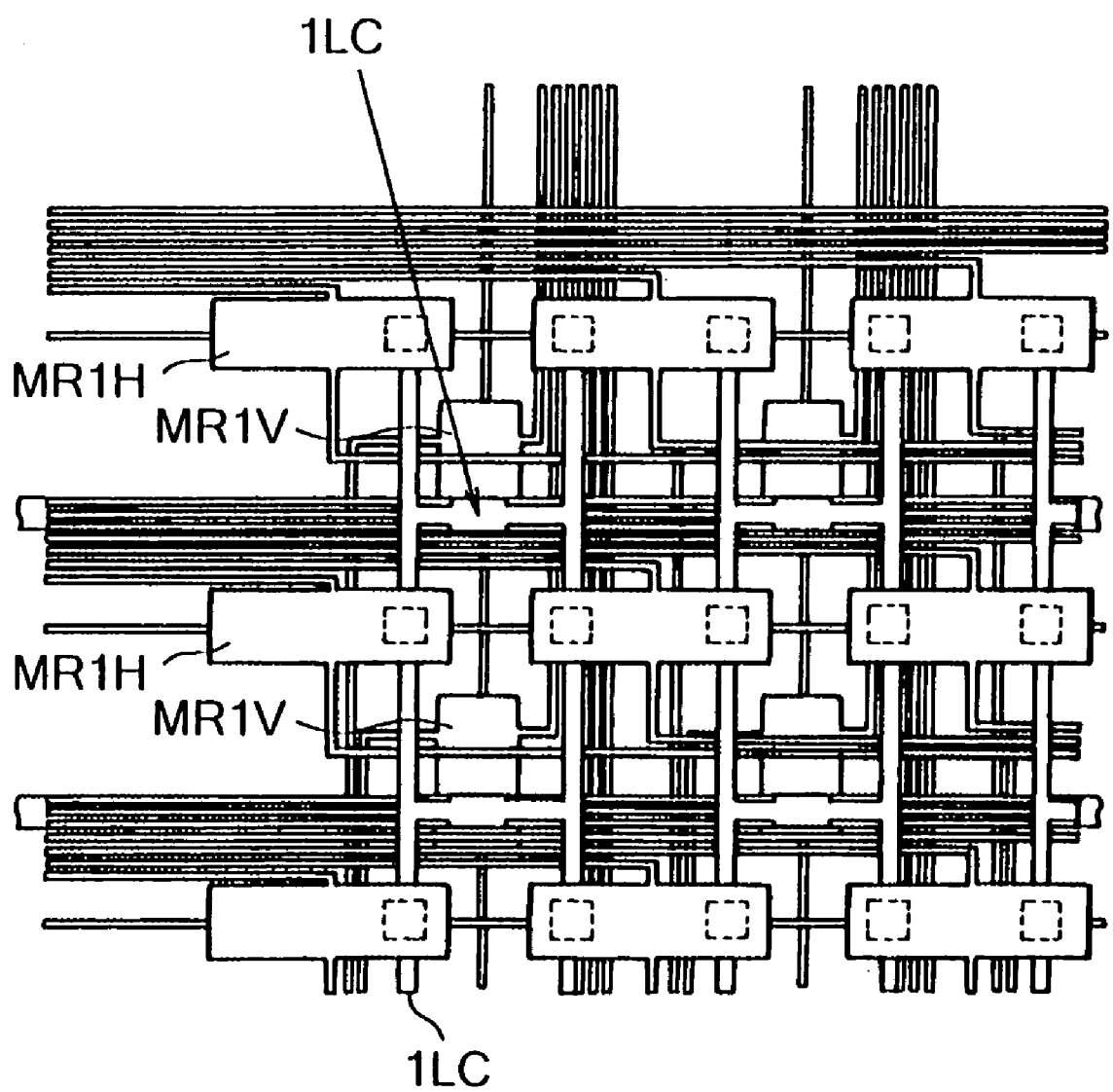

The schematic layout view of FIG. 7 and a C portion enlarged view in FIG. 7 of FIG. 8 show the configuration of a local interconnect for connecting the first stage vertical connection elements MR1V and the first stage horizontal connection elements MR1H.

Namely, in order to connect the first stage vertical connection elements MR1V using the magnetoresistance effect field switching elements illustrated in FIG. 3 and FIG. 4 functioning as the vertical connection elements 21 illustrated in FIG. 1 and the first stage horizontal connection elements MR1H using the magnetoresistance effect field switching elements illustrated in FIG. 5 and FIG. 6 functioning as the horizontal connection elements 31 illustrated in FIG. 1, a first stage vertical connection element-horizontal connection element local interconnect 1LC is provided.

Figure 9:
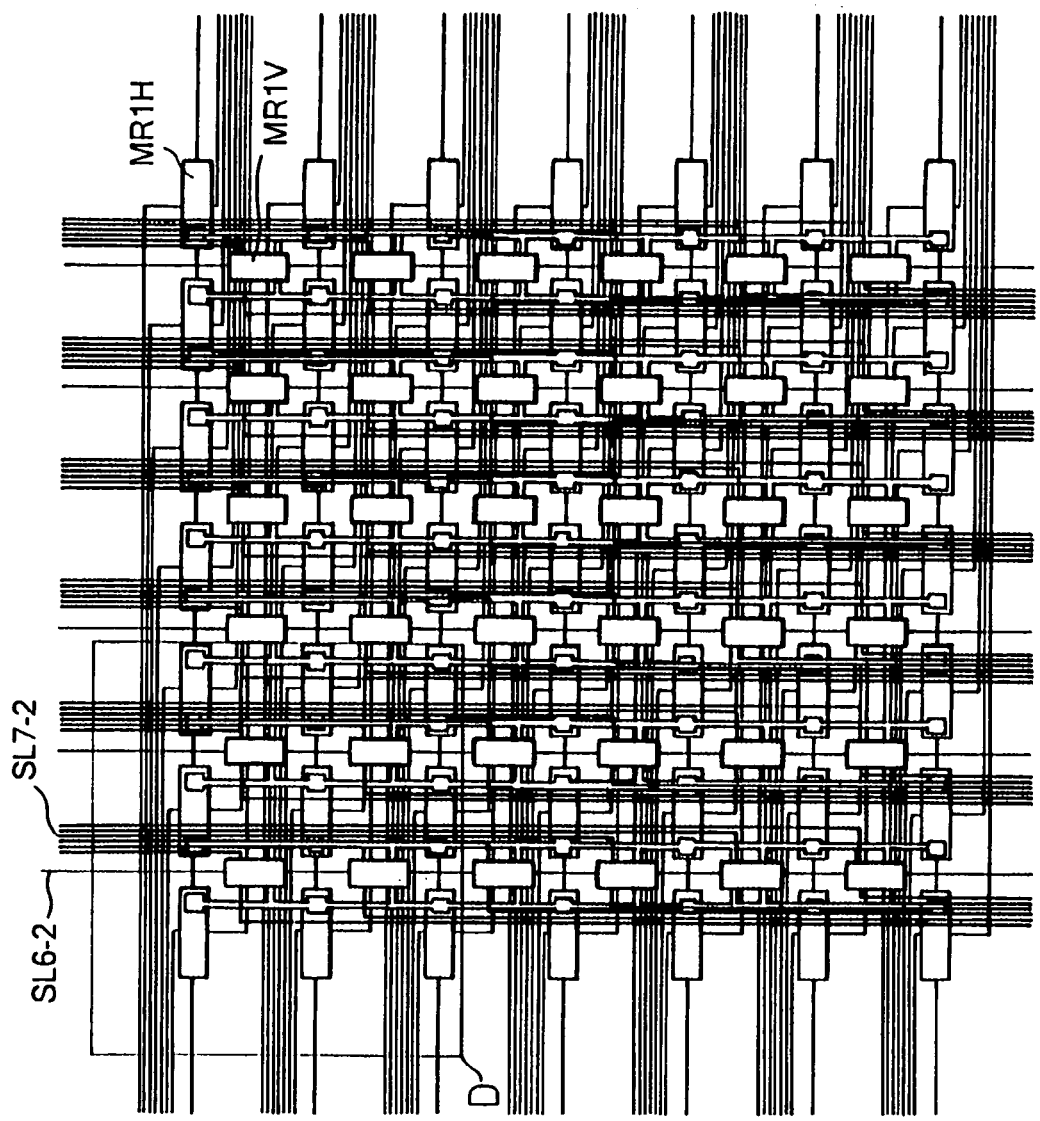
Figure 10:
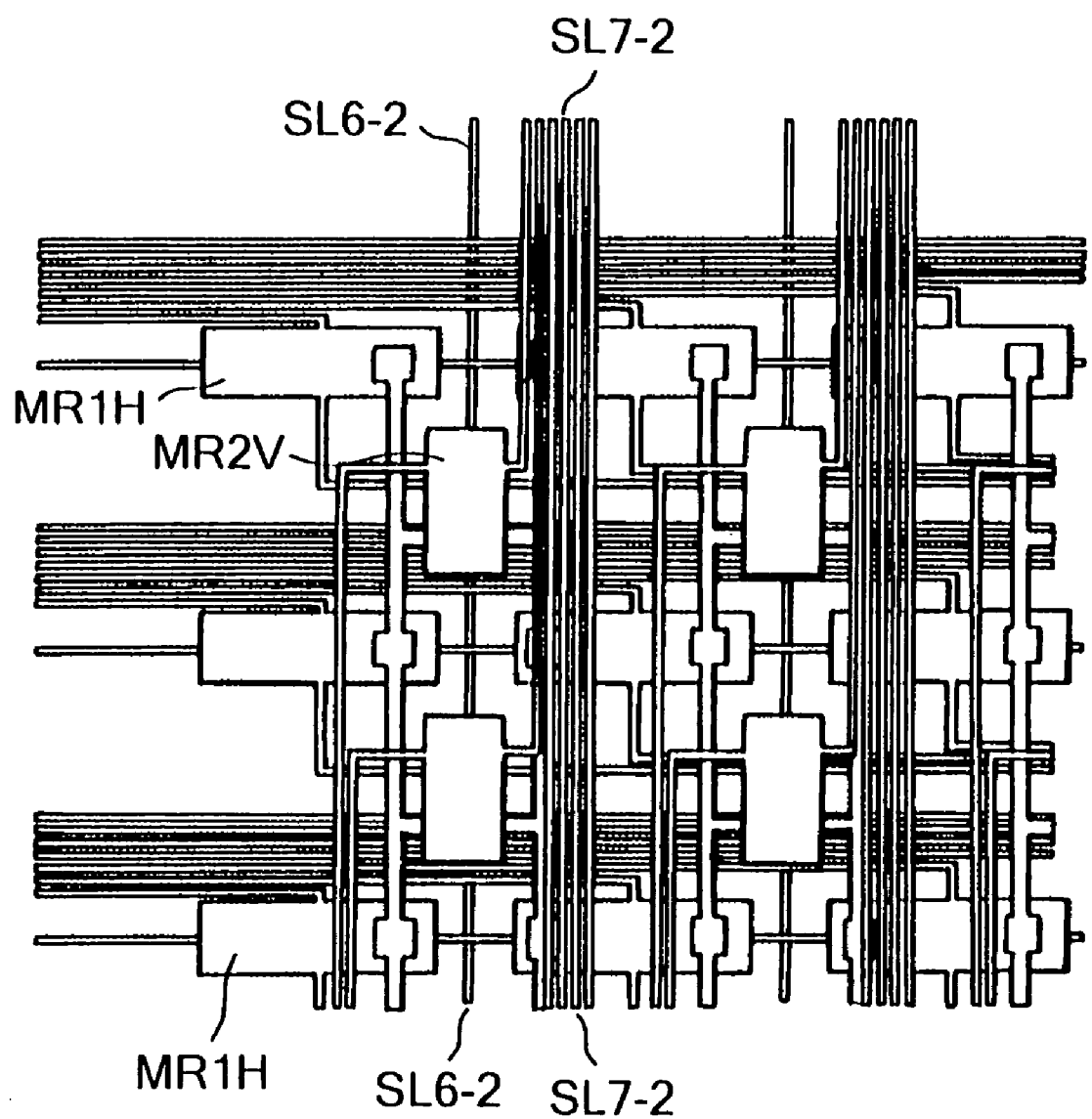

The schematic layout view of FIG. 9 and a D portion enlarged view in FIG. 9 of FIG. 10 show the configuration of stacking second stage vertical elements MR2V on the configuration illustrated in FIG. 8. In order to stack further layers, the configuration of the vertical connection elements and horizontal connection elements may be simply repeated.

In the state illustrated in FIG. 9 and FIG. 10, on the layer illustrated in FIG. 7 and FIG. 8, the second stage vertical connection elements MR2 using magnetoresistance effect field switching elements, a sixth layer second stage magnetoresistance effect field switching element use magnetic field inversion lower signal line SL6-2 for driving the second stage vertical connection elements MR2, and a seventh layer second stage magnetoresistance effect field switching element use magnetic field inversion upper signal line SL7-2 are formed.

The magnetoresistance effect field switching elements used as the vertical connection elements and horizontal connection elements are elements using the phenomenon of a change in the electric resistance value due to application of a magnetic field to a resistor. In the present embodiment, by passing a current through the upper signal line and the lower signal line, for example, for the first stage vertical connection elements MR1V illustrated in FIG. 4, the second layer magnetoresistance effect field switching element use magnetic field inversion lower signal line SL2 and the third layer magnetoresistance effect field switching element use magnetic field inversion upper signal line SL3, a magnetic field is generated, whereby the resistance values of the first stage vertical connection elements MR1V using the magnetoresistance effect field switching elements change and a current path including the first stage vertical connection elements MR1V can be established, that is, a circuit can be formed.

In order to pass a current for generating a magnetic field through the upper signal line and the lower signal line or suspend the supply of the current, switching elements, for example, the MOS transistors illustrated in FIG. 29, are connected to the upper signal line and the lower signal line. Drive signals defined in accordance with the circuit configuration desired by the user are supplied to these transistors.

The configurations of the connection elements using the magnetoresistance effect field switching elements and the upper signal line and the lower signal line for applying a magnetic field to the magnetoresistance effect field switching elements will be explained by referring to FIGS. 29A to 29I.

Note that when it is made to function as a magnetoresistance effect field switching element, a magnetoresistance effect element can be made to continuously maintain its conductive state by application of a continuous magnetic field, while when made to function as a logic circuit element, can be made to generate an instantaneous conductive state (inversion state) by application of an instantaneous magnetic field. In other words, a magnetoresistance effect element can be made to function as the logic circuit element or can be made to function as the connection element in accordance with the pattern of the current applied to the control line (pulse or continuous signal). The case where it is made to function as a logic circuit element will be explained later.

A logic circuit is formed using vertical connection elements and horizontal connection elements as follows.

Note that the semiconductor integrated circuit device of the embodiment of the present invention has built into it in advance an amount of circuit elements able to configure one or more circuits configured by formation of a current path by the conductive state (state where resistance value is smallest) and the nonconductive state (state where resistance value is largest, preferably substantially infinitely large state) of the vertical connection elements and the horizontal connection elements using the magnetoresistance effect field switching elements mentioned above. In other words, in the embodiment of the present invention, the desired circuit is configured by combining a plurality of circuit elements in accordance with the conductive state and the nonconductive state of the vertical connection elements and the horizontal connection elements.

In order to designate the conductive state and the nonconductive state of the vertical connection elements and the horizontal connection elements, addresses are assigned to the switching elements for applying/not applying current to the upper signal line and the lower signal line for applying the magnetic field to the vertical connection elements and the horizontal connection elements. Addresses in accordance with the desired circuit configuration are applied from the outside of the semiconductor integrated circuit device. In other words, by designating addresses in accordance with the circuit configuration desired by the user from outside the semiconductor integrated circuit device to turn on or off the switching elements built into the semiconductor integrated circuit device, for example, the transistors, and thereby supply current to the upper signal line and the lower signal line or stop the supply to apply a magnetic field to the corresponding vertical connection elements or horizontal connection elements or stop the application and place the vertical connection elements or the horizontal connection elements to the conductive state or the nonconductive state, it is possible to combine the circuit elements built in the semiconductor integrated circuit device and configure the desired circuit.

Note that when it is desired to eliminate such a circuit and configure a new circuit, it is sufficient to reset the signals applied by the switching elements and apply the signals for the new circuit configuration to the switching elements.

Accordingly, the semiconductor integrated circuit device of this embodiment of the present invention can be operated by repeatedly configuring the desired circuits.

Further, in a semiconductor integrated circuit device of magnetoresistance effect elements of the present invention, it is possible to configure a plurality of circuits using pluralities of circuit elements in a single semiconductor integrated circuit device.

When configuring such circuits, the magnetoresistance effect elements can not only be used as connection elements, but can also be made to function as logic operation elements, memory elements, and processing elements.

The address region for forming a logic circuit is designated. Specifically, in order to designate the minimum region to be used as a logic circuit and make the logical function of the region designated independent from the adjacent logic circuits, the vertical connection elements and the horizontal connection elements surrounding the minimum region are turned OFF (made the nonconductive state). Simultaneously, in order to designate the current path required for the desired logic circuit, the vertical connection elements and the horizontal connection elements are appropriately turned ON (made the conductive state).

Parts of the horizontal connection elements are led to the outside of the semiconductor integrated circuit device and used as signal input elements of the switching elements. The horizontal connection elements are turned ON/OFF in accordance with the input signals, while output voltages in accordance with the logic circuit are output to the output.

When the logic circuit finishes being used, the designated address region is released and the used vertical connection elements and horizontal connection elements are used for the configuration of the next logic circuit.

Note that, when working the present invention, it is also possible to use resistance control elements in place of the magnetoresistance effect elements as the switching elements.

A concrete explanation will be given next of the settings for a basic logic circuit based on the concept of the present invention explained above.

NOT Circuit

A NOT (negation) circuit will be illustrated here.

Figure 11C:
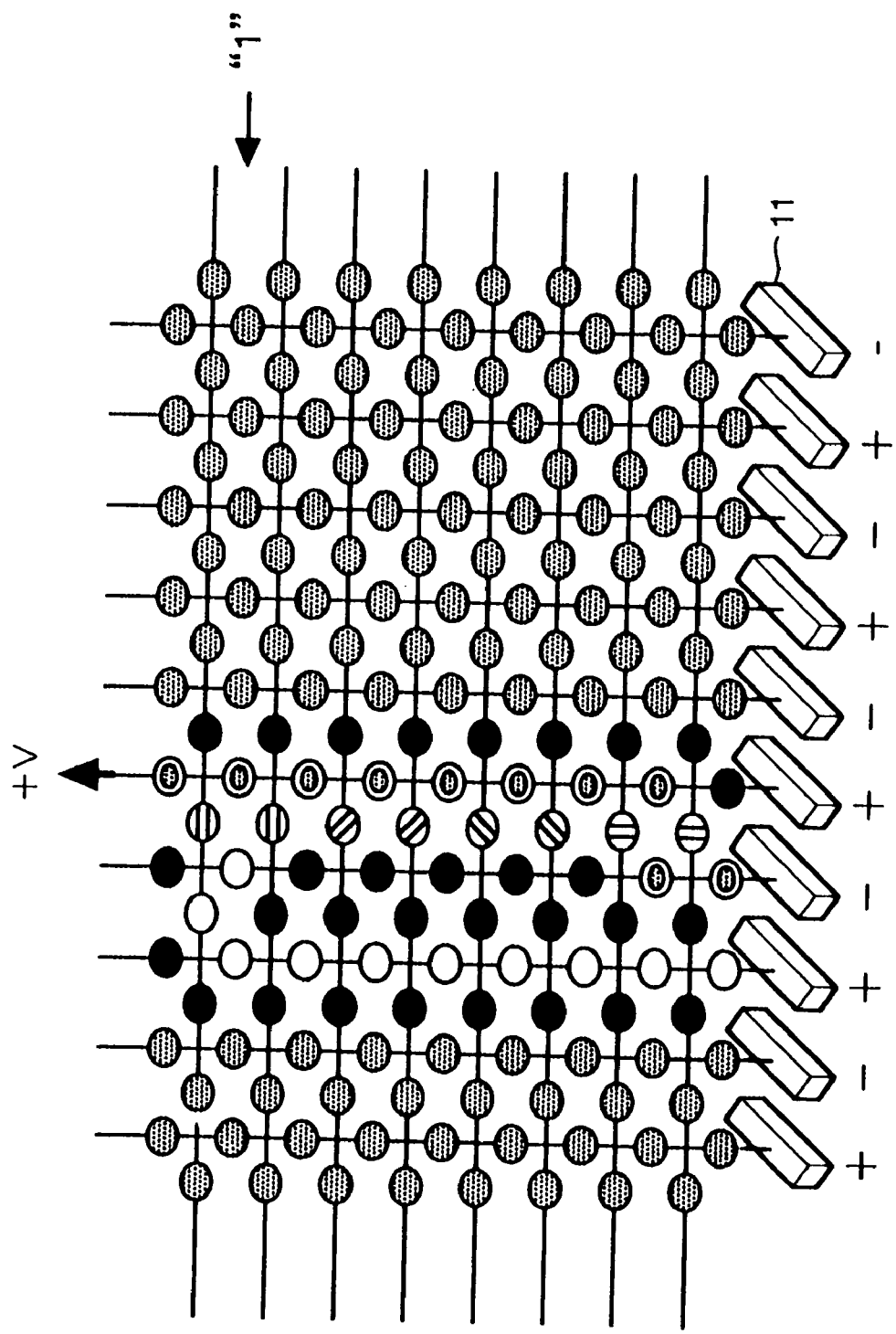

FIGS. 11A to 11C are views of the configuration of a NOT circuit. FIG. 12 is a graph of the states of the elements of the NOT circuit.

As shown in FIG. 11A, a current path (circuit) is set for forming a NOT logic circuit.

In FIG. 11A, the elements indicated by white ovals indicate the elements set to form the current path. The current path indicated by the white ovals is connected to the lower current lines 11 (+V) and 11 (−V). The portions indicated by black ovals adjacent to the portion formed with the current path indicated by the white ovals are isolation portions for separating the logic of the NOR circuit from the other peripheral circuits and set the connection elements OFF (nonconductive state).

This NOR circuit includes horizontal connection elements which become ON (conductive state) at a time of a "0" input and horizontal connection elements which become ON (conductive state) at a time of a "1" input. The elements functioning in this way will be referred to as "circuit elements" in the present invention. As such circuit elements, use can be made of magnetoresistance effect elements or resistance control elements. Below, the case of using magnetoresistance effect elements will be illustrated. Namely, when an instantaneous current is passed through the control line, an instantaneous magnetic field acts upon the magnetoresistance effect elements and the magnetoresistance effect elements instantaneously become the conductive state, so can be used as logic circuit elements operating at a high speed. In this case, the control line of the magnetoresistance effect elements configuring the NOR circuit is connected to the input terminal of the logic circuit element.

On the other hand, when current is continuously passed through the control line, the magnetic field continuously acts upon the magnetoresistance effect elements, and the magnetoresistance effect elements continuously maintain the conductive state, so the magnetoresistance effect elements can be used as connection elements. The elements functioning as conducting means in the circuit path in this way will be referred to as "connection elements" in the present invention. Note that, when referring to a "connecting means", this includes a magnetoresistance effect field switching element and the magnetic field application portions of the upper signal line and the lower signal line for applying the magnetic field to this.

Of course, it is also possible to use resistance control elements in place of the magnetoresistance effect elements as the switching elements.

The circuit elements, conductive elements, and connection elements are not limited to a NOR circuit and are similarly present in other circuits as well.

Next, when the input signal is "0" as shown in FIG. 11B, the horizontal connection elements linked with "0" in advance are turned ON. By this, the voltage of +V, that is, "1", is output to the output line along the current path at the "0" input.

Conversely, where the input signal is "1" as shown in FIG. 11C, the horizontal connection elements linked with "1" in advance are turned ON. By this, the voltage of −V, that is, "0", is output to the output line along the current path at the "1" input.

The logic operation may be summarized as follows. It will be seen that the circuit operates as a NOT circuit. When the horizontal connection elements corresponding to the input signal (1) are turned ON, −V corresponding to the output signal "0" is output. When the horizontal connection elements corresponding to the input signal (0) are turned ON, +V corresponding to the output signal "1" is output.

AND Circuit

The settings for an AND circuit will be illustrated here. FIGS. 13A to 13E are views of the configuration of an AND circuit. FIG. 14 is a graph of the states of the elements in the AND circuit.

The logic operation becomes as follows.

When the elements corresponding to an input signal (0, 0), for example, horizontal connection elements using magnetoresistance effect elements, are turned ON, −V corresponding to the output signal "0" is output. When the horizontal connection elements corresponding to an input signal (1, 0) are turned ON, −V corresponding to the output signal "0" is output. When the horizontal connection elements corresponding to an input signal (0, 1) are turned ON, −V corresponding to the output signal "0" is output. When the horizontal connection elements corresponding to an input signal (1, 1) are turned ON, +V corresponding to the output signal "1" is output.

Figure 13A:
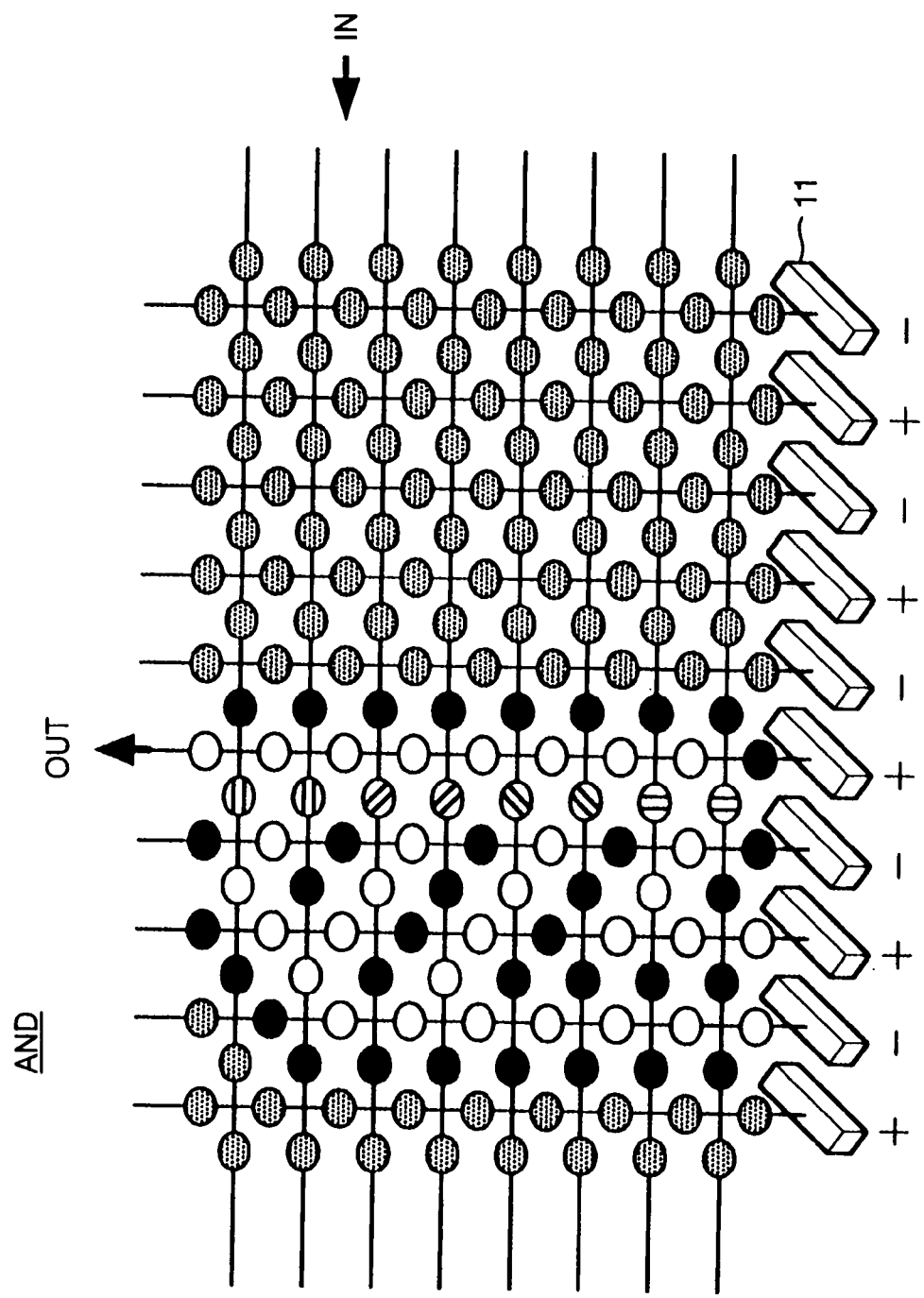

The current path of the AND circuit is set as shown in FIG. 13A. In the figure, elements using the magnetoresistance effect elements or resistance control elements indicated by white ovals (below, magnetoresistance effect elements will be illustrated) show the elements for forming the current path.

When the input signal is (0, 0) as shown in FIG. 13B, the horizontal connection elements using magnetoresistance effect elements linked with (0, 0) in advance are turned ON. By this, the voltage of −V, that is, "0", is output to the output line along the current path at the (0, 0) input.

Figure 13C:
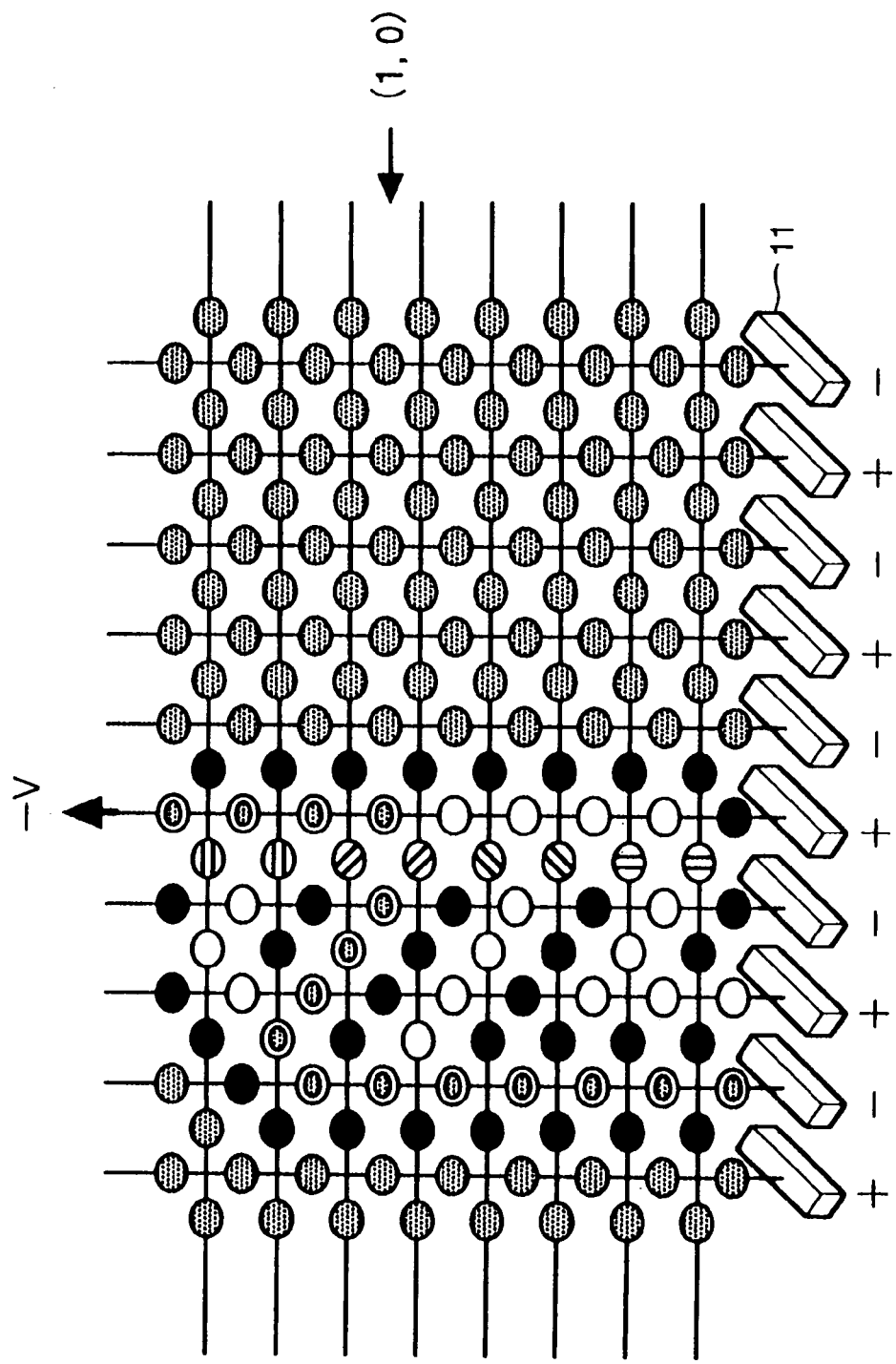

When the input signal is (1, 0) as shown in FIG. 13C, the horizontal connection elements using magnetoresistance effect elements linked with (1, 0) in advance are turned ON. By this, the voltage of −V, that is, "0", is output to the output line along the current path at the (1, 0) input.

Figure 13D:
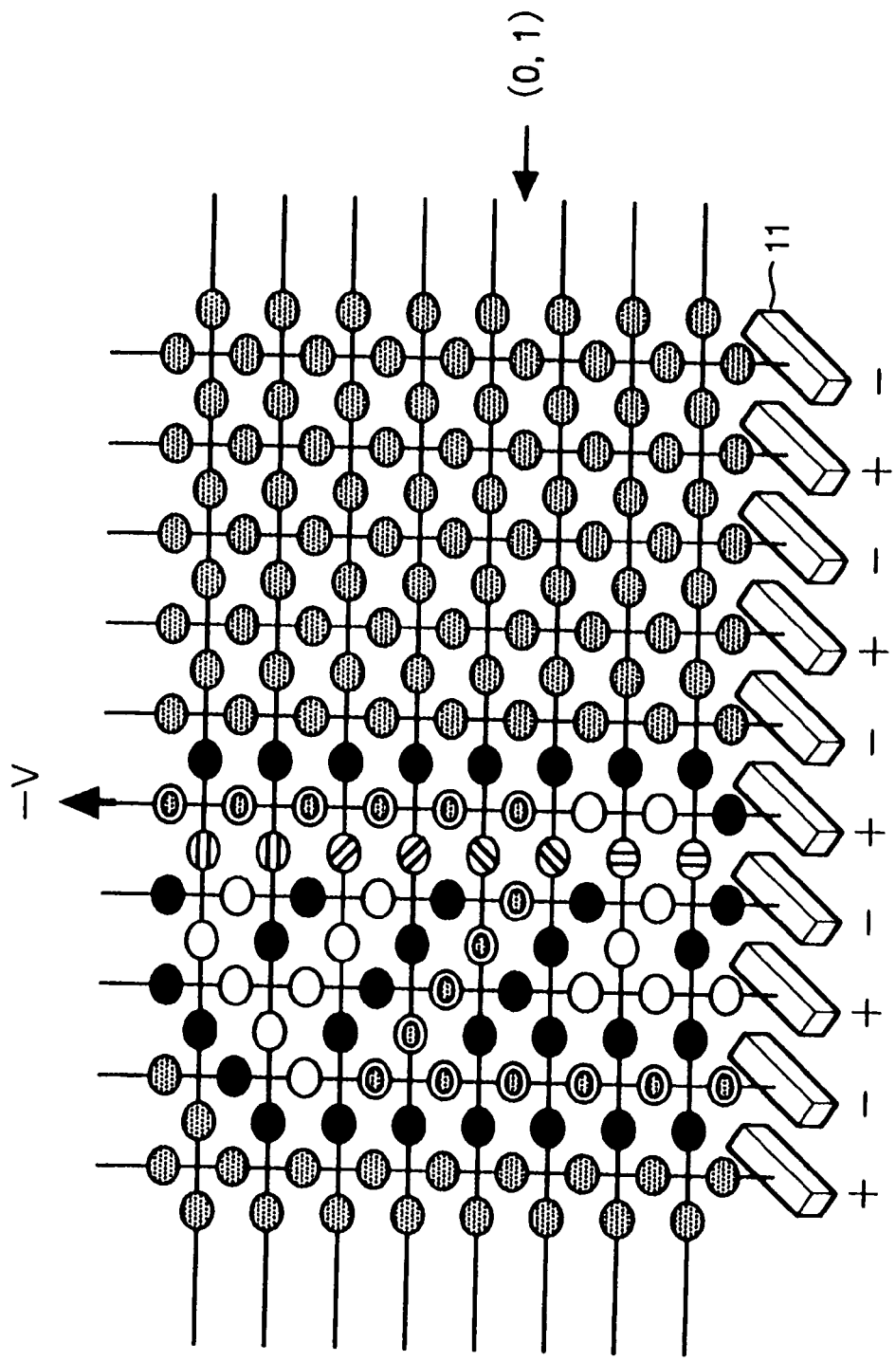

When the input signal is (0, 1) as shown in FIG. 13D, the horizontal connection elements using magnetoresistance effect elements linked with (0, 1) in advance is turned ON. By this, the voltage of −V, that is, "0", is output to the output line along the current path at the (0, 1) input.

When the input signal is (1, 1) as shown in FIG. 13E, the horizontal connection elements linked with (1, 1) in advance are turned ON. By this, the voltage of +V, that is, "1", is output to the output line along the current path at the (1, 1) input.

OR Circuit

Next, the settings for an OR (logical OR) circuit will be illustrated.

Figure 15A:
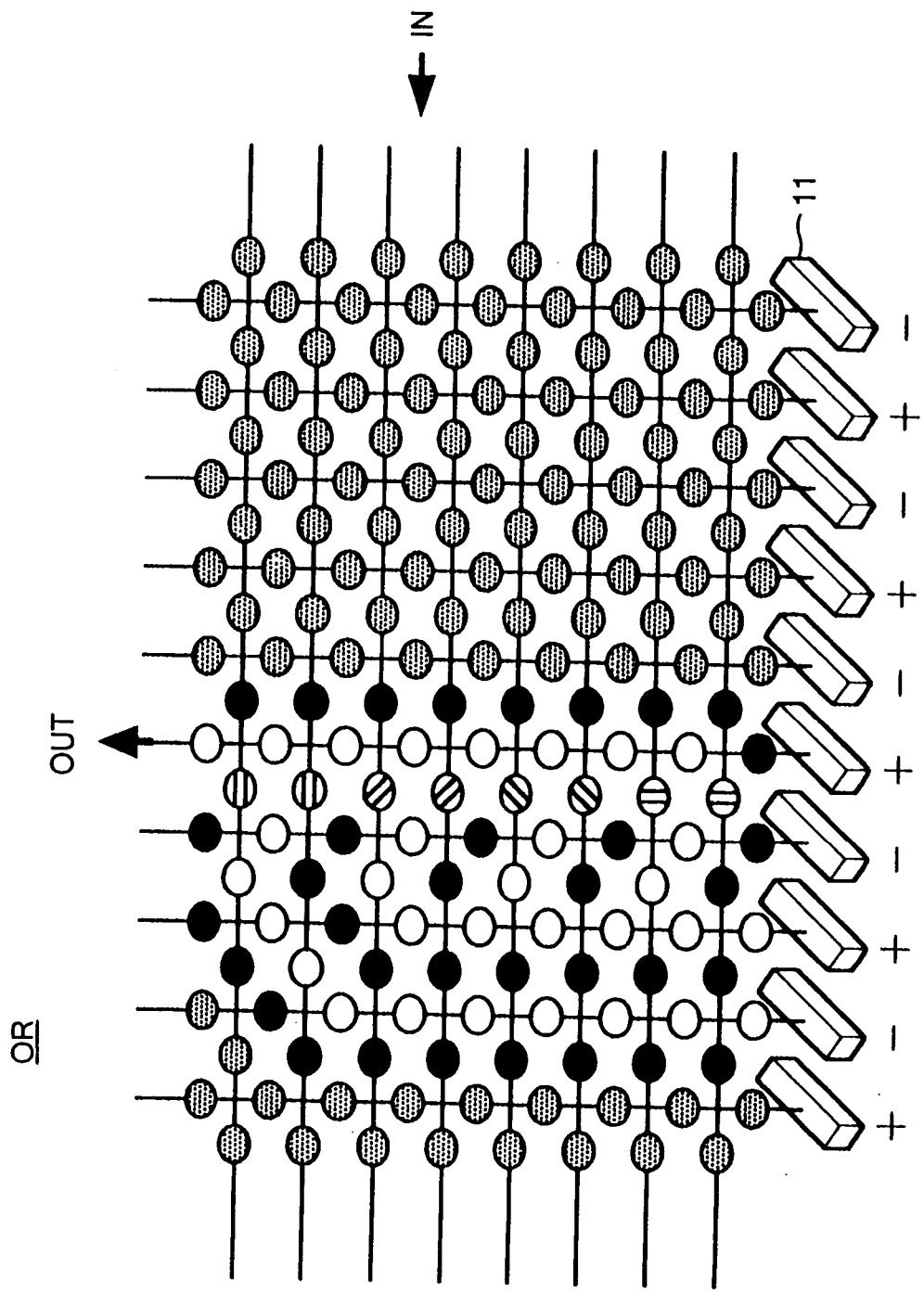
Figure 15B:
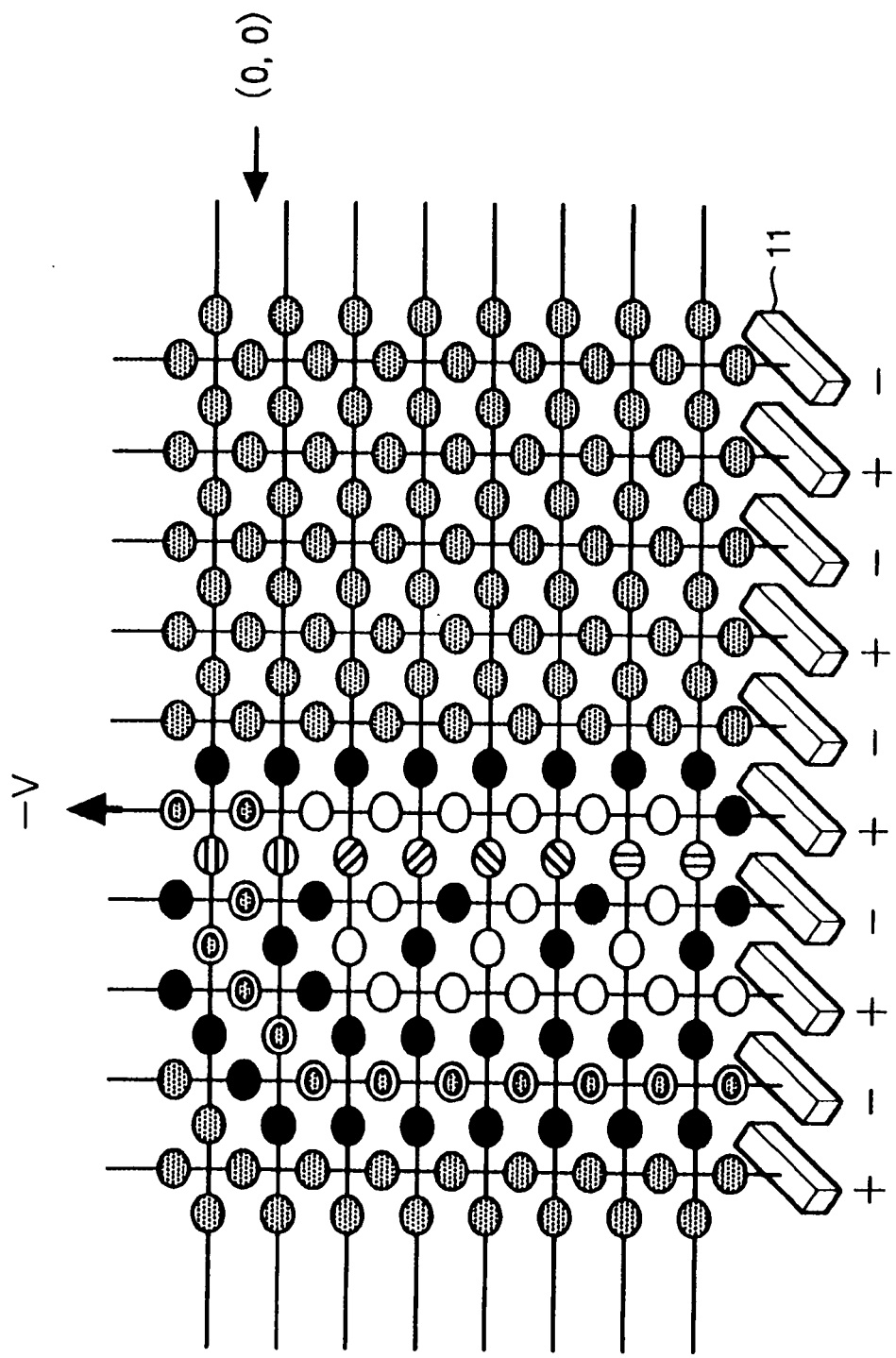
Figure 15D:
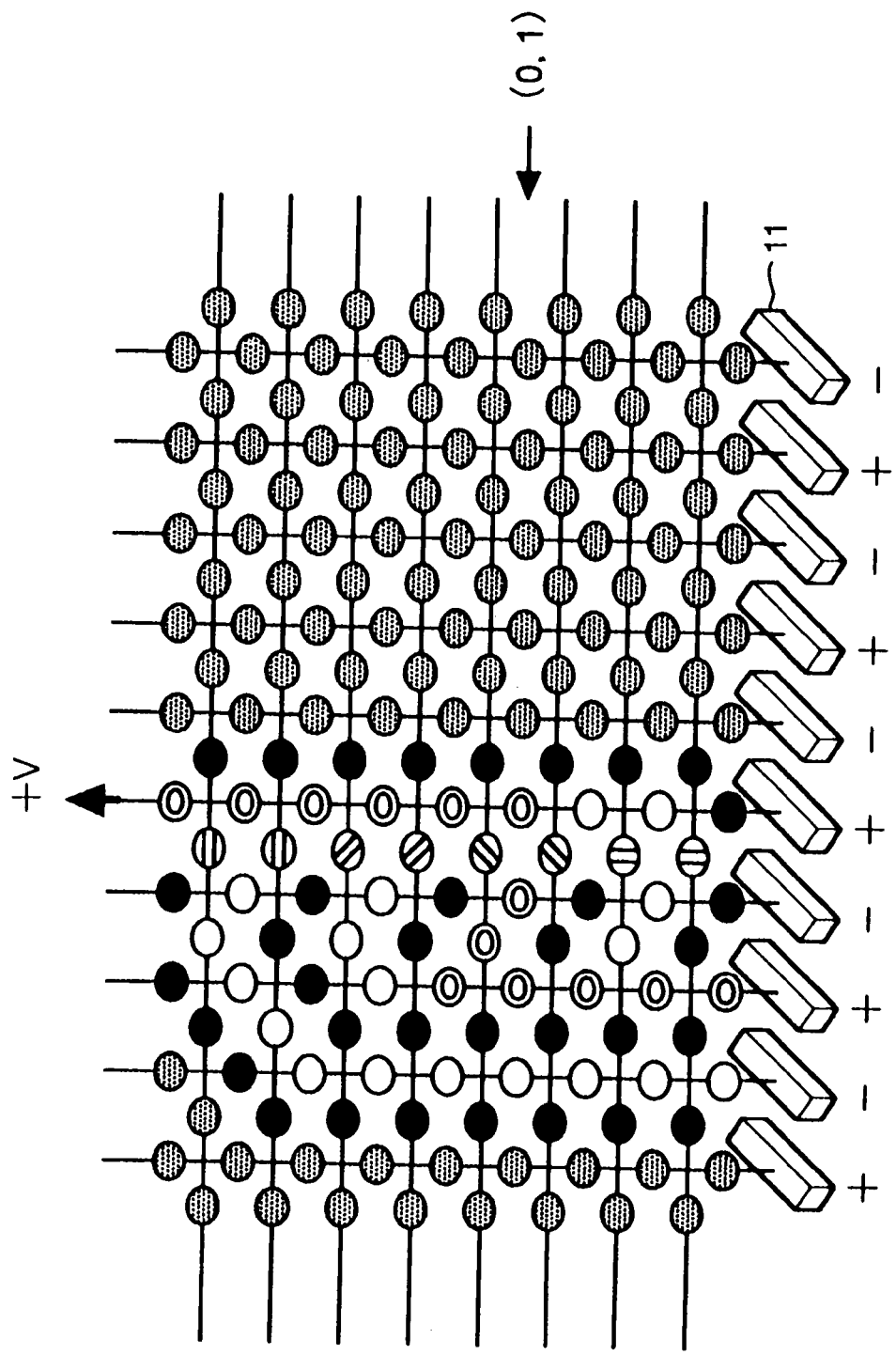
Figure 15E:
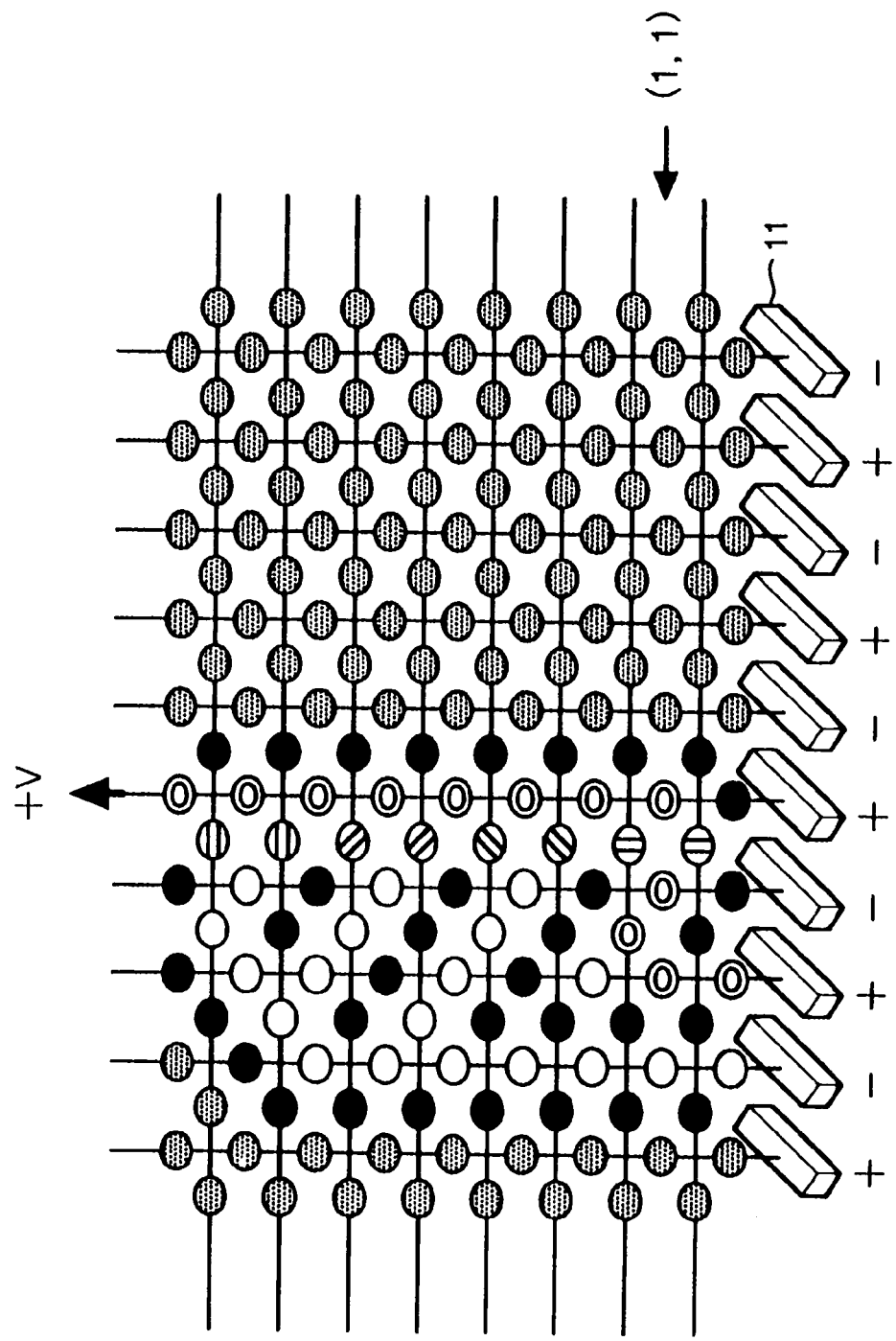

FIGS. 15E to 15E are views of the configuration of an OR circuit. FIG. 16 is a graph of the states of the elements of the OR circuit of FIG. 16.

The logic operation becomes as follows.

When the horizontal connection elements using magnetoresistance effect elements linked with the input signal (0, 0) are turned ON, −V corresponding to the output signal "0" is output. When the horizontal connection elements linked with the input signal (1, 0) are turned ON, +V corresponding to the output signal "1" is output. When the horizontal connection elements linked with the input signal (0, 1) are turned ON, +V corresponding to the output signal "1" is output. When the horizontal connection elements linked with the input signal (1, 1) are turned ON, +V corresponding to the output signal "1" is output.

The current path of the OR circuit is set as shown in FIG. 15A. In the figure, elements indicated by the white ovals show elements using magnetoresistance effect elements or resistance control elements set to form the current path.

When the input signal is (0, 0) as shown in FIG. 15B, the horizontal connection elements linked with (0, 0) in advance are turned ON. By this, the voltage of −V, that is, "0", is output to the output line along the current path at the (0, 0) input.

When the input signal is (1, 0) as shown in FIG. 15C, the horizontal connection elements linked with (1, 0) in advance are turned ON. By this, the voltage of +V, that is, "1", is output to the output line along the current path at the (1, 0) input.

When the input signal is (0, 1) as shown in FIG. 15D, the horizontal connection elements linked with (0, 1) in advance are turned ON. By this, the voltage of +V, that is, "1", is output to the output line along the current path at the (0, 1) input.

When the input signal is (1, 1) as shown in FIG. 15E, the horizontal connection elements linked with (1, 1) in advance are turned ON. By this, the voltage of +V, that is, "1", is output to the output line along the current path at the (1, 1) input.

NAND Circuit

The settings for a NAND circuit will be illustrated.

FIGS. 17A to 17E are views of the configuration of a NAND circuit. FIG. 18 is a graph of the states of the elements in the NAND circuit.

The logic operation becomes as follows.

When the horizontal connection elements using magnetoresistance effect elements linked the input signal (0, 0) are turned ON, +V corresponding to the output signal "1" is output. When the horizontal connection elements corresponding to the input signal (1, 0) are turned ON, +V corresponding to the output signal "1" is output. When the horizontal connection elements corresponding to the input signal (0, 1) are turned ON, +V corresponding to the output signal "1" is output. When the horizontal connection elements corresponding to the input signal (1, 1) are turned ON, −V corresponding to the output signal "0" is output.

Figure 17A:
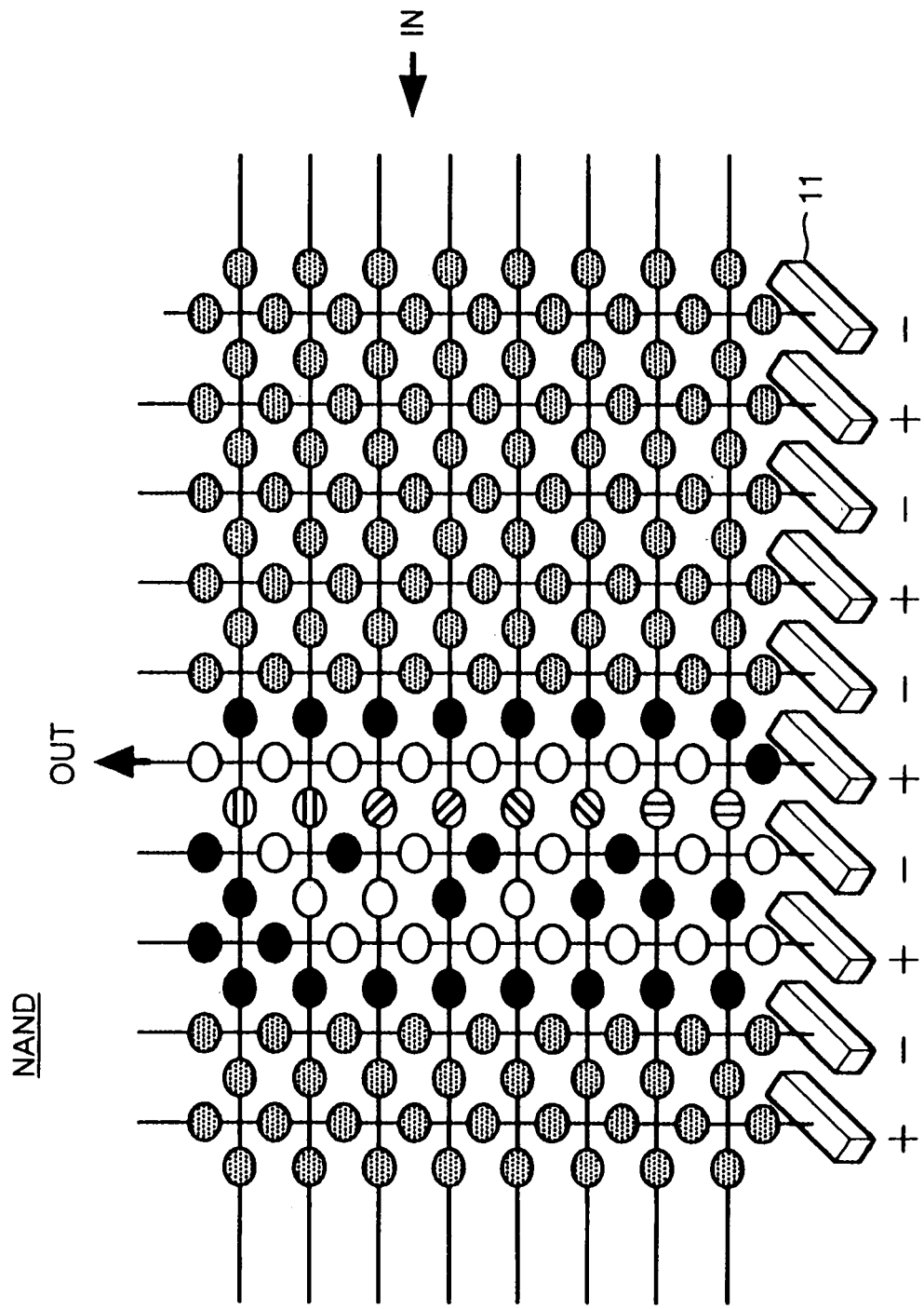

The current path of the NAND circuit is set as shown in FIG. 17A. In the figure, the elements indicated by the white ovals show elements using magnetoresistance effect elements or resistance control elements set to form the current path.

When the input signal is (0, 0) as shown in FIG. 17B, the horizontal connection elements linked with (0, 0) in advance are turned ON. By this, the voltage of +V, that is, "1", is output to the output line along the current path at the (0, 0) input.

When the input signal is (1, 0) as shown in FIG. 17C, the horizontal connection elements linked with (1, 0) in advance are turned ON. By this, the voltage of +V, that is, "1", is output to the output line along the current path at the (1, 0) input.

Figure 17D:
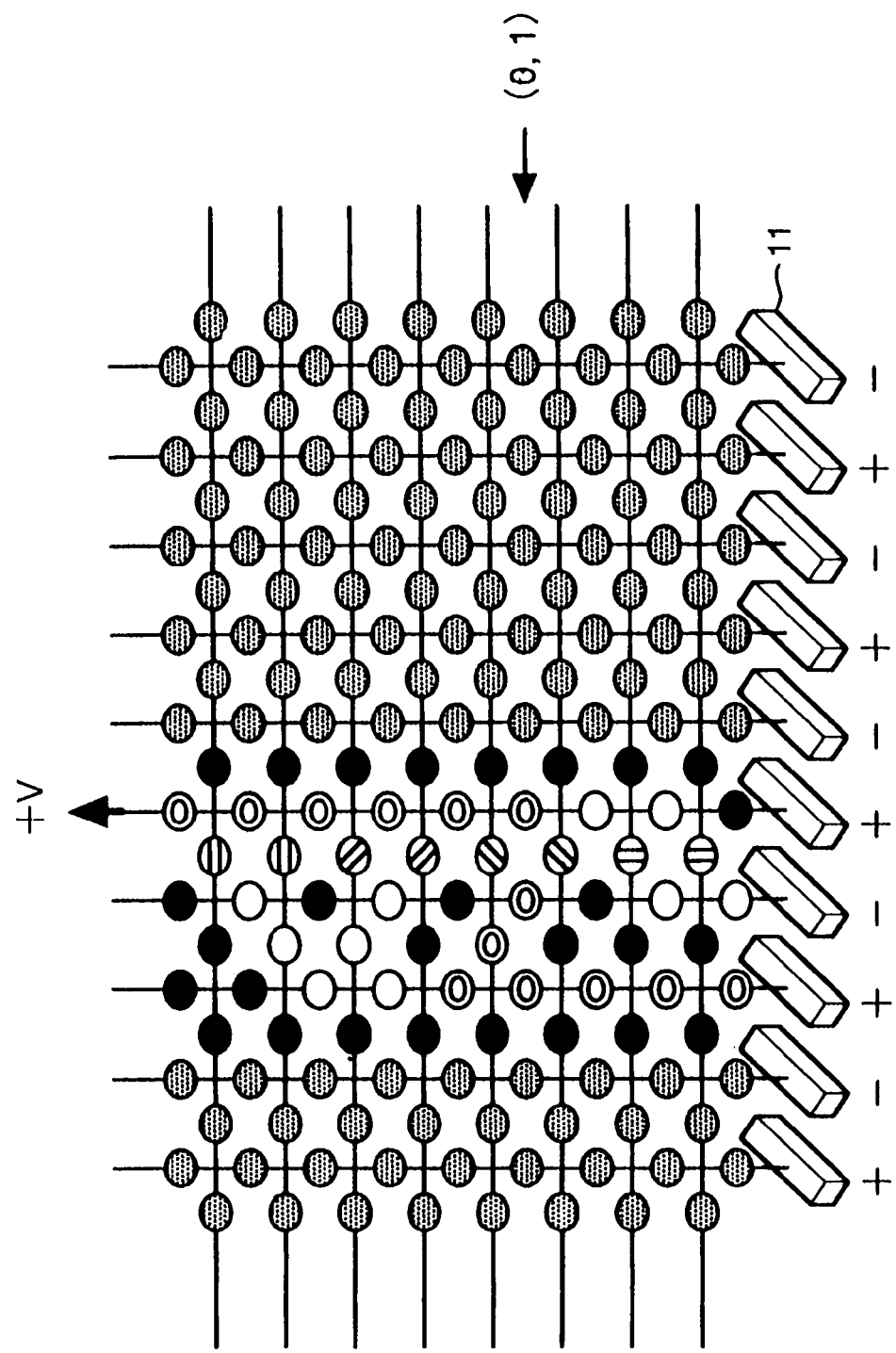

When the input signal is (0, 1) as shown in FIG. 17D, the horizontal connection elements linked with (0, 1) in advance are turned ON. By this, the voltage of +V, that is, "1", is output to the output line along the current path at the (0, 1) input.

Figure 17E:
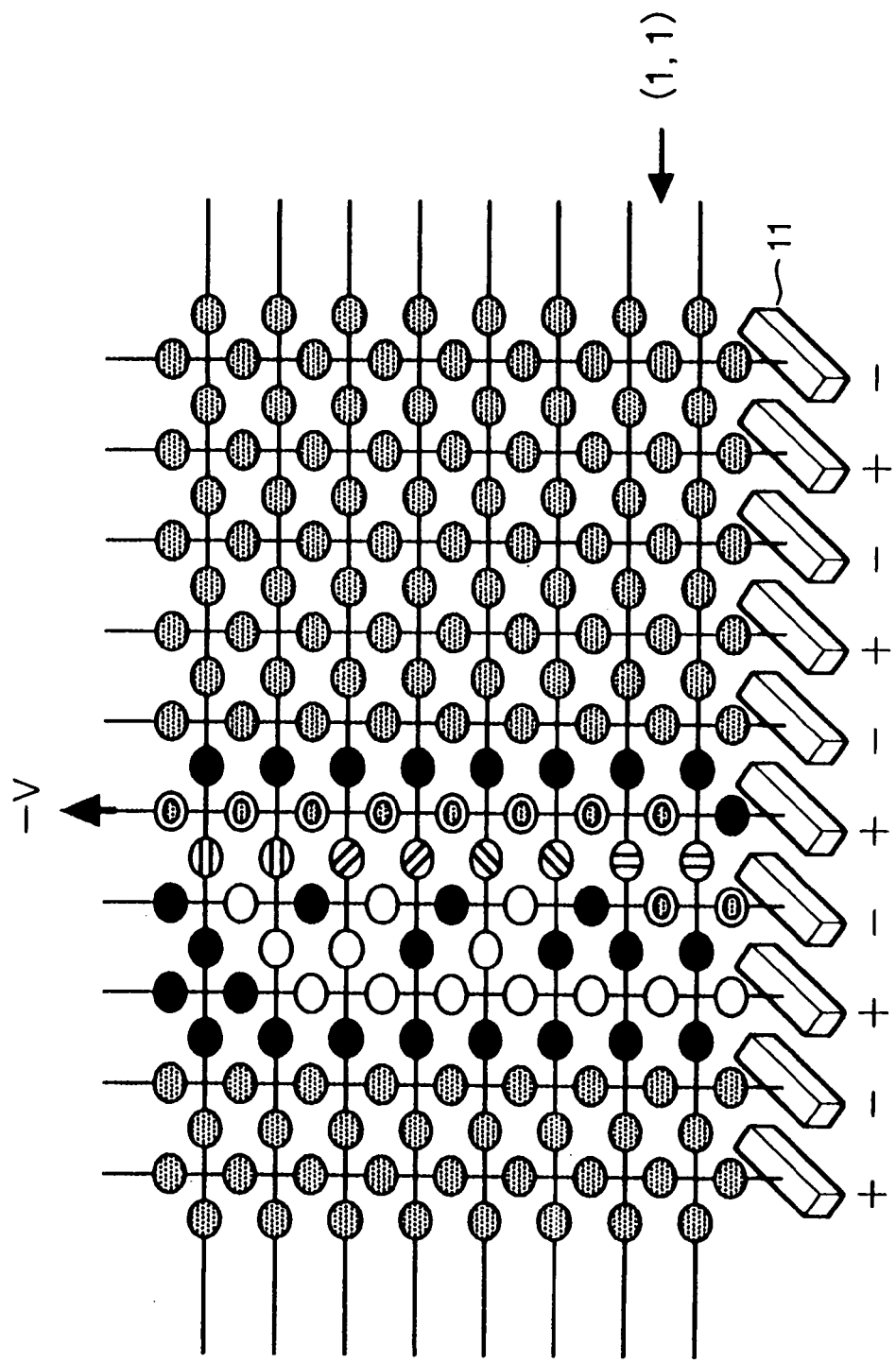

When the input signal is (1, 1) as shown in FIG. 17E, the horizontal connection elements linked with (1, 1) in advance are turned ON. By this, the voltage of −V, that is, "0", is output to the output line along the current path at the (1, 1) input.

NOR Circuit

The settings for a NOR circuit will be illustrated.

FIGS. 19A to 19E are views of the configuration of a NOR circuit. FIG. 20 is a graph of the states of the elements in the NOR circuit.

The logic operation becomes as follows.

When the horizontal connection elements using magnetoresistance effect elements or resistance control elements corresponding to the input signal (0, 0) are turned ON, +V corresponding to the output signal "1" is output.

When the horizontal connection elements corresponding to the input signal (1, 0) are turned ON, −V corresponding to the output signal "0" is output. When the horizontal connection elements corresponding to the input signal (0, 1) are turned ON, −V corresponding to the output signal "0" is output. When the horizontal connection elements corresponding to the input signal (1, 1) are turned ON, −V corresponding to the output signal "0" is output.

The current path of the NOR circuit is set as shown in FIG. 19A. In the figure, the elements indicated by the white ovals show elements using magnetoresistance effect elements or resistance control elements set so as to form the current path.

When the input signal is (0, 0) as shown in FIG. 19B, the horizontal connection elements linked with (0, 0) in advance are turned ON. By this, the voltage of +V, that is, "1", is output to the output line along the current path at the (0, 0) input.

When the input signal is (1, 0) as shown in FIG. 19C, the horizontal connection elements linked with (1, 0) in advance are turned ON. By this, the voltage of −V, that is, "0", is output to the output line along the current path at the (1, 0) input.

When the input signal is (0, 1) as shown in FIG. 19D, the horizontal connection elements linked with (0, 1) in advance are turned ON. By this, the voltage of −V, that is, "0", is output to the output line along the current path at the (0, 1) input.

When the input signal is (1, 1) as shown in FIG. 19E, the horizontal connection elements linked with (1, 1) in advance are turned ON. By this, the voltage of −V, that is, "0", is output to the output line along the current path at the (1, 1) input.

EXOR Circuit

The settings for an EXOR circuit will be illustrated.

FIGS. 21A to 21E are explanatory diagrams of an EXOR circuit. FIG. 22 is a graph of the states of the elements in the EXOR circuit.

The logic operation becomes as follows.

When the horizontal connection elements using magnetoresistance effect elements or resistance control elements corresponding to the input signal (0, 0) are turned ON, −V corresponding to the output signal "0" is output.

When the horizontal connection elements corresponding to the input signal (1, 0) are turned ON, +V corresponding to the output signal "1" is output.

When the horizontal connection elements corresponding to the input signal (0, 1) are turned ON, +V corresponding to the output signal "1" is output.

When the horizontal connection elements corresponding to the input signal (1, 1) are turned ON, −V corresponding to the output signal "0" is output.

The current path of the EXOR circuit is set as shown in FIG. 21A. In the figure, the elements indicated by the white ovals show elements using magnetoresistance effect elements or resistance control elements set so as to form the current path.

Figure 21B:
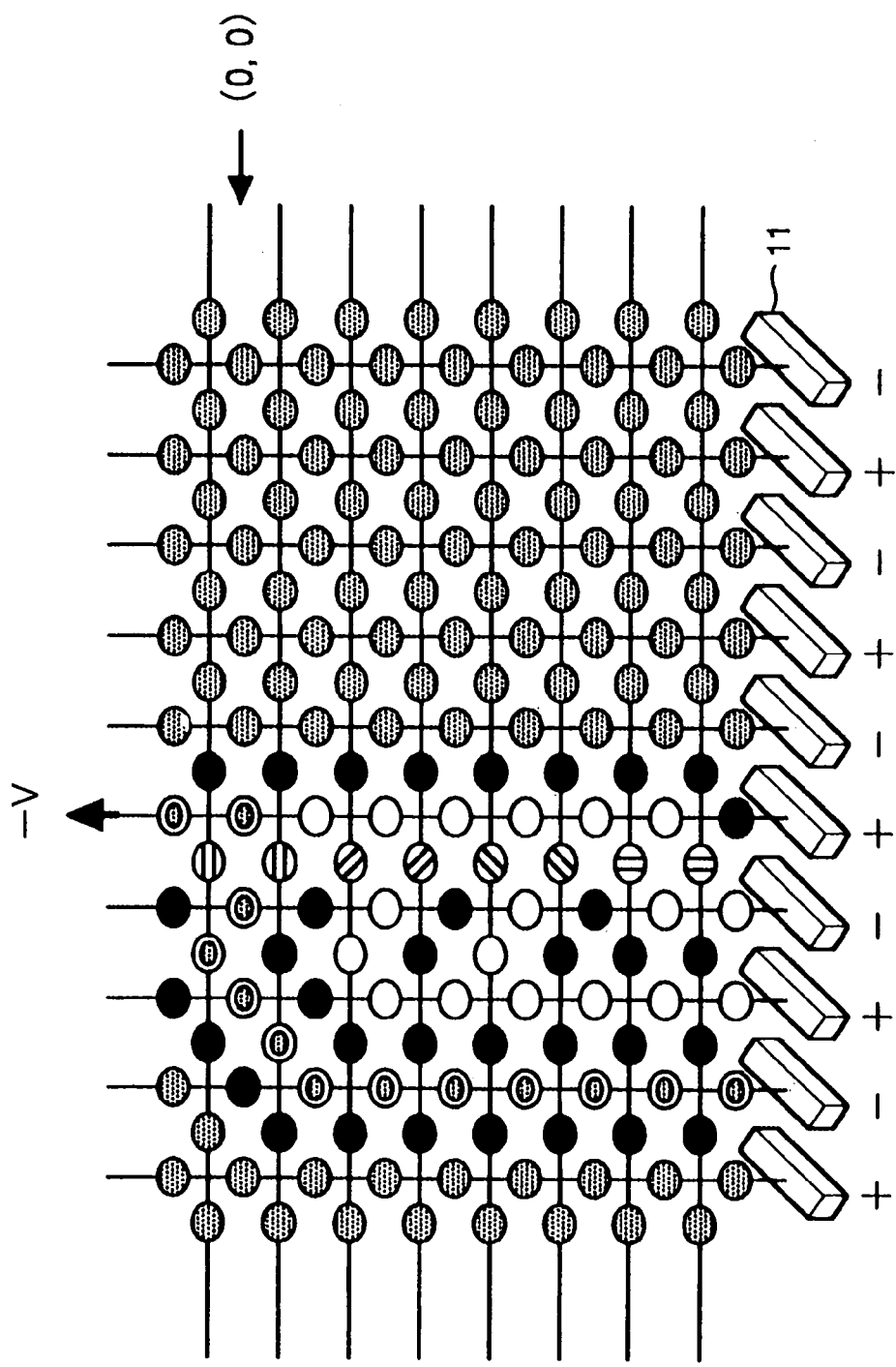

When the input signal is (0, 0) as shown in FIG. 21B, the horizontal connection elements linked with (0, 0) in advance are turned ON. By this, the voltage of −V, that is, "0", is output to the output line along the current path at the (0, 0) input.

When the input signal is (1, 0) as shown in FIG. 21C, the horizontal connection elements linked with (1, 0) in advance are turned ON. By this, the voltage of +V, that is, "1", is output to the output line along the current path at the (1, 0) input.

Figure 21D:
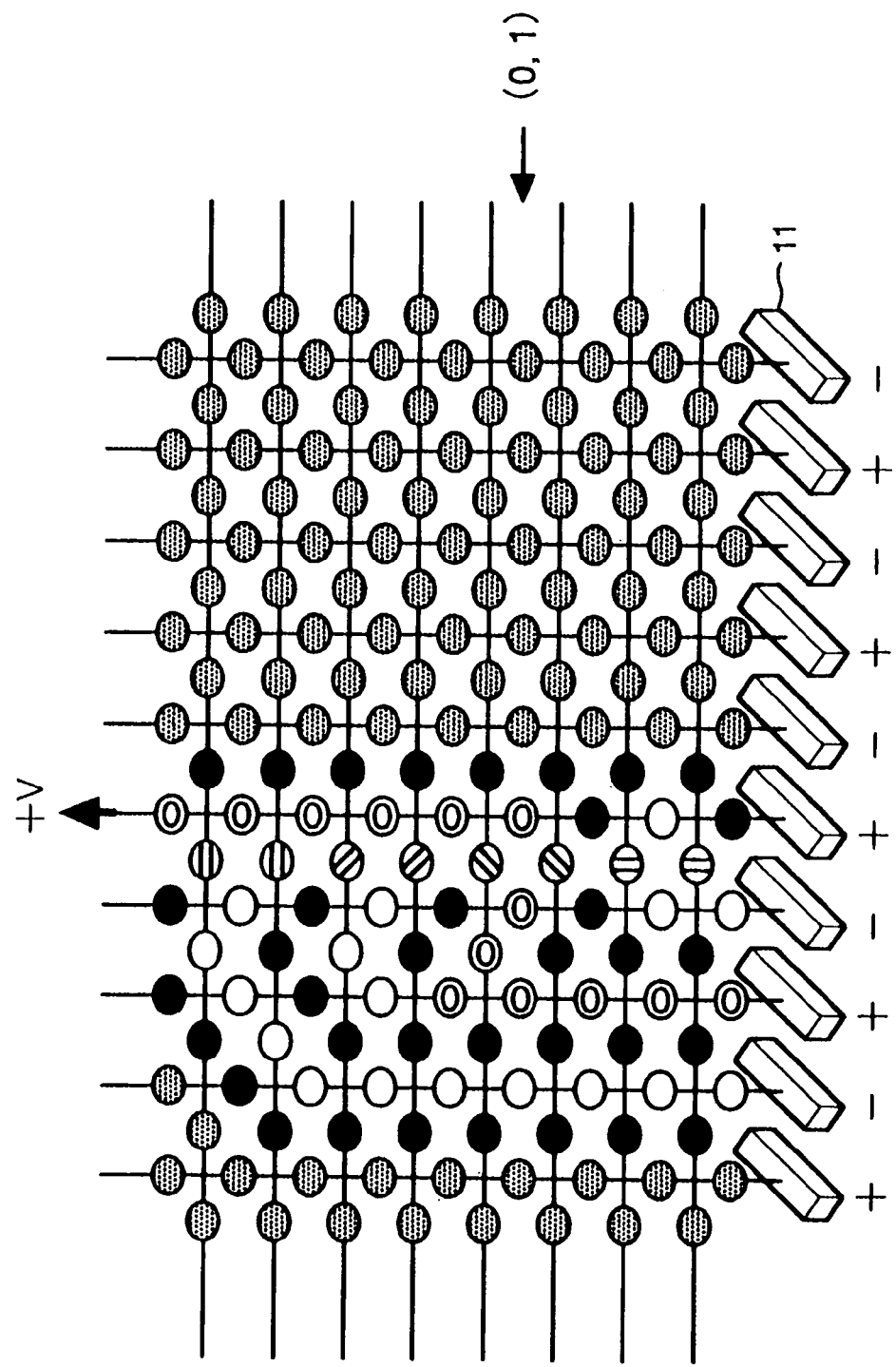

When the input signal is (0, 1) as shown in FIG. 21D, the horizontal connection elements linked with (0, 1) in advance are turned ON. By this, the voltage of +V, that is, "1", is output to the output line along the current path at the (0, 1) input.

Figure 21E:
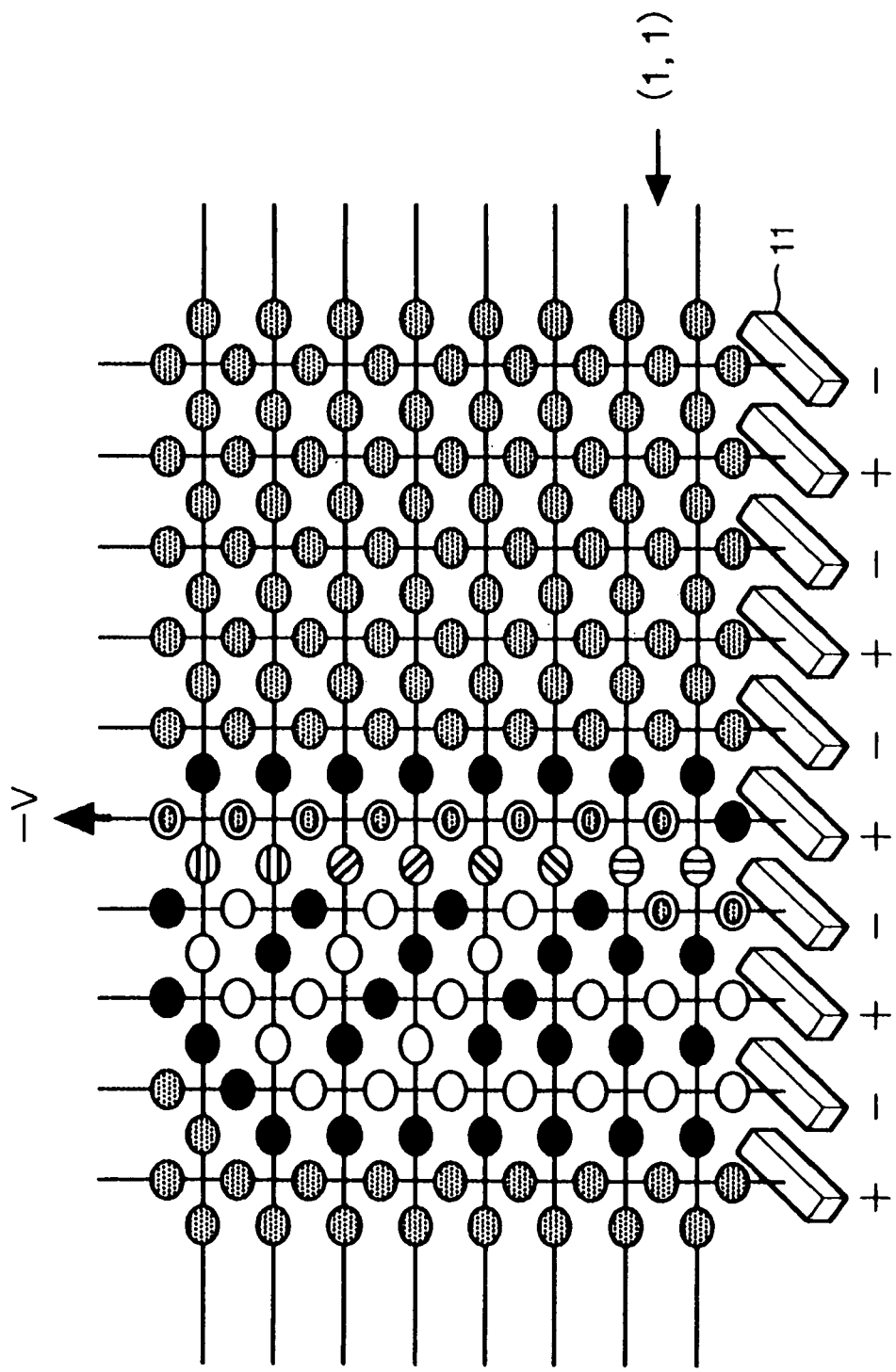

When the input signal is (1, 1) as shown in FIG. 21E, the horizontal connection elements linked with (1, 1) in advance are turned ON. By this, the voltage of −V, that is, "0", is output to the output line along the current path at the (1, 1) input.

Inclusive AND Circuit

The settings for an inclusive AND circuit will be illustrated.

FIGS. 23A to 23E are views of the configuration of an inclusive AND circuit. FIG. 24 is a graph of the states of the elements in the inclusive AND circuit.

The logic operation becomes as follows.

When the horizontal connection elements using the magnetoresistance effect elements corresponding to the input signal (0, 0) are turned ON, +V corresponding to the output signal "1" is output. When the horizontal connection elements corresponding to the input signal (1, 0) are turned ON, −V corresponding to the output signal "0" is output. When the horizontal connection elements corresponding to the input signal (0, 1) are turned ON, −V corresponding to the output signal "0" is output. When the horizontal connection elements corresponding to the input signal (1, 1) are turned ON, +V corresponding to the output signal "1" is output.

Figure 23A:
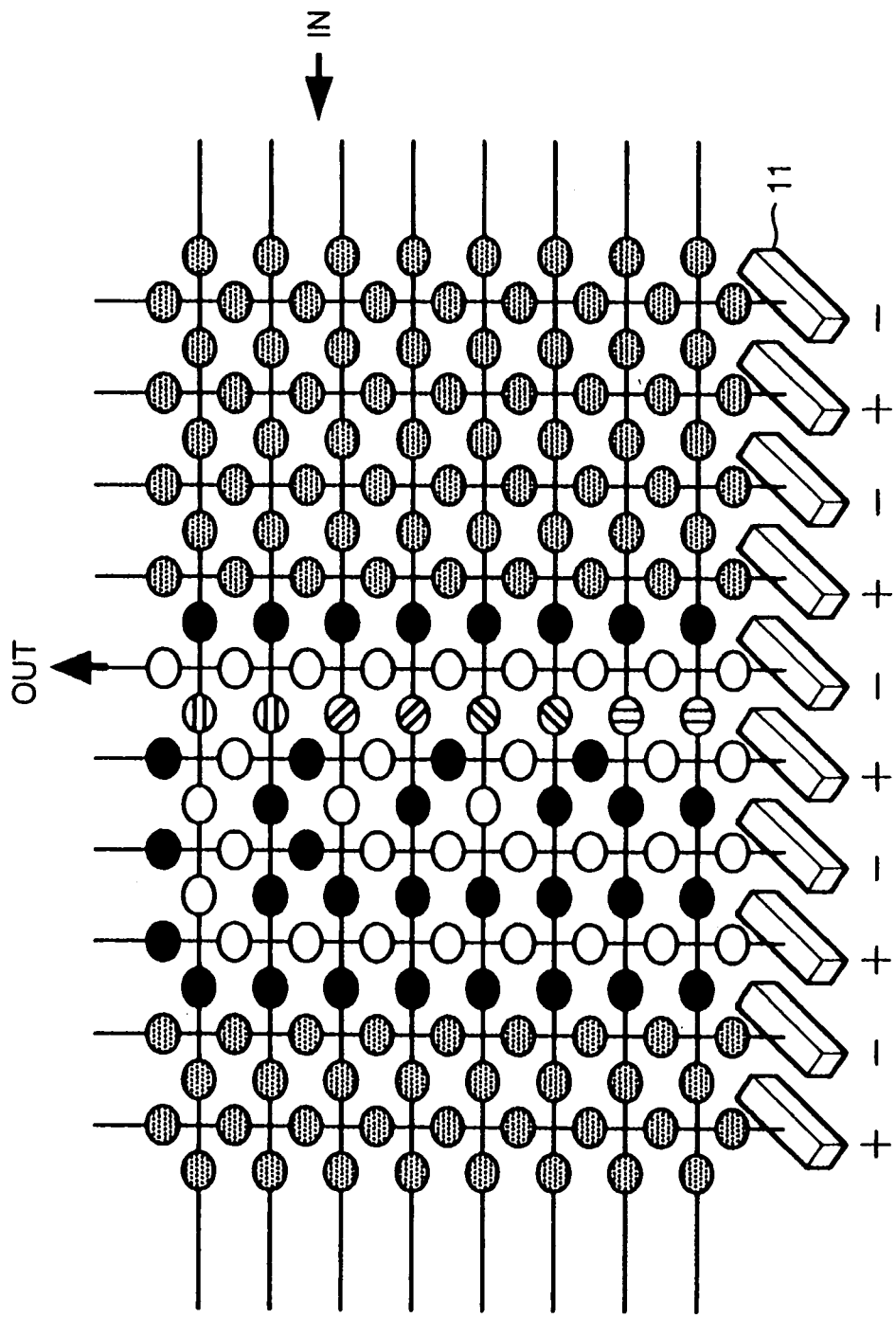

The current path of the inclusive AND circuit is set as shown in FIG. 23A. In the figure, the elements indicated by the white ovals show elements using magnetoresistance effect elements or resistance control elements set so as to form the current path.

When the input signal is (0, 0) as shown in FIG. 23B, the horizontal connection elements linked with (0, 0) in advance are turned ON. By this, the voltage of +V, that is, "1", is output to the output line along the current path at the (0, 0) input.

Figure 23C:
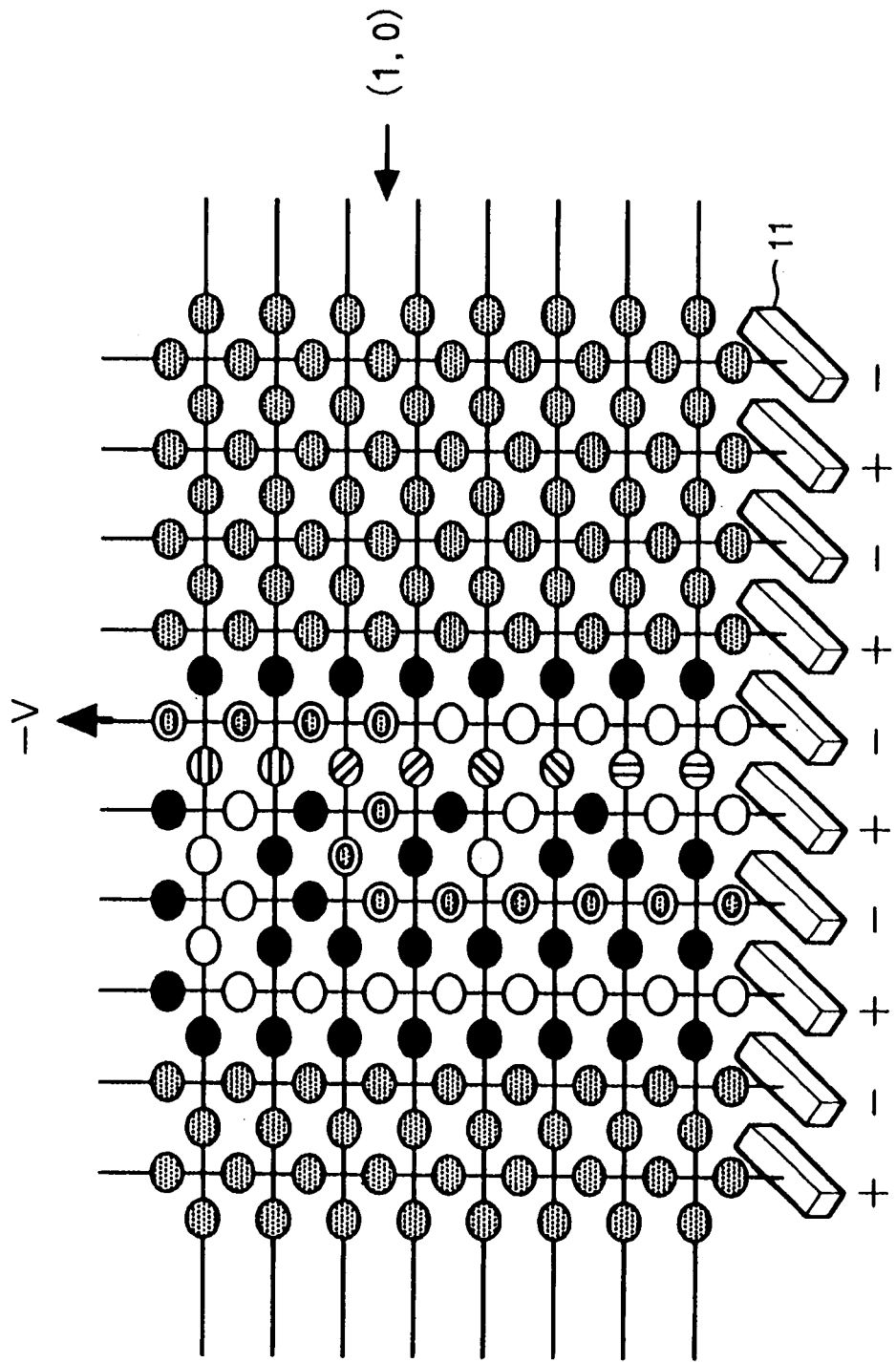

When the input signal is (1, 0) as shown in FIG. 23C, the horizontal connection elements linked with (1, 0) in advance are turned ON. By this, the voltage of −V, that is, "0", is output to the output line along the current path at the (1, 0) input.

When the input signal is (0, 1) as shown in FIG. 23D, the horizontal connection elements linked with (0, 1) are advance is turned ON. By this, the voltage of −V, that is, "0", is output to the output line along the current path at the (0, 1) input.

When the input signal is (1, 1) as shown in FIG. 23E, the horizontal connection elements linked with (1, 1) in advance are turned ON. By this, the voltage of +V, that is, "1", is output to the output line along the current path at the (1, 1) input.

Half Adder Circuit

The settings for a half adder circuit will be illustrated.

FIGS. 25A to 25E are views of the configuration of a half adder circuit. FIG. 26 is a graph of the states of the elements in the Half-Adder circuit.

The half-adder circuit calculates (0+0), (0+1), (1+0), and (1+1) by binary calculation, so is configured by 2 inputs and 2 outputs. The logic operation becomes as follows.

When the horizontal connection elements using magnetoresistance effect elements or resistance effect elements linked with a combination of the input 1 signal "0" as the most significant bit and the input 2 signal (0) as the least significant bit are turned ON, −V corresponding to "0" is output for the output 1 signal of the most significant bit, and −V corresponding (0) of the least significant bit is output for the output 2 signal.

When the horizontal connection elements corresponding to the combination of the input 1 signal (0) of the most significant bit and the input 2 signal (1) of the least significant bit are turned ON, −V corresponding to "0" is output for the output 1 signal of the most significant bit, and +V corresponding to "1" is output for the output 2 signal of the least significant bit.

When the horizontal connection elements corresponding to the combination of the input 1 signal (1) of the most significant bit and the input 2 signal (0) of the least significant bit are turned ON, −V corresponding to "0" is output for the output 1 signal of the most significant bit and +V corresponding to "1" is output for the output 2 signal of the least significant bit.

When the horizontal connection elements corresponding to the combination of the input 1 signal (1) as the most significant bit and the input 2 signal (1) as the least significant bit are turned ON, +V corresponding to "1" is output for the output 1 signal of the most significant bit and −V corresponding to "0" is output for the output 2 signal of the least significant bit.

Figure 25A:
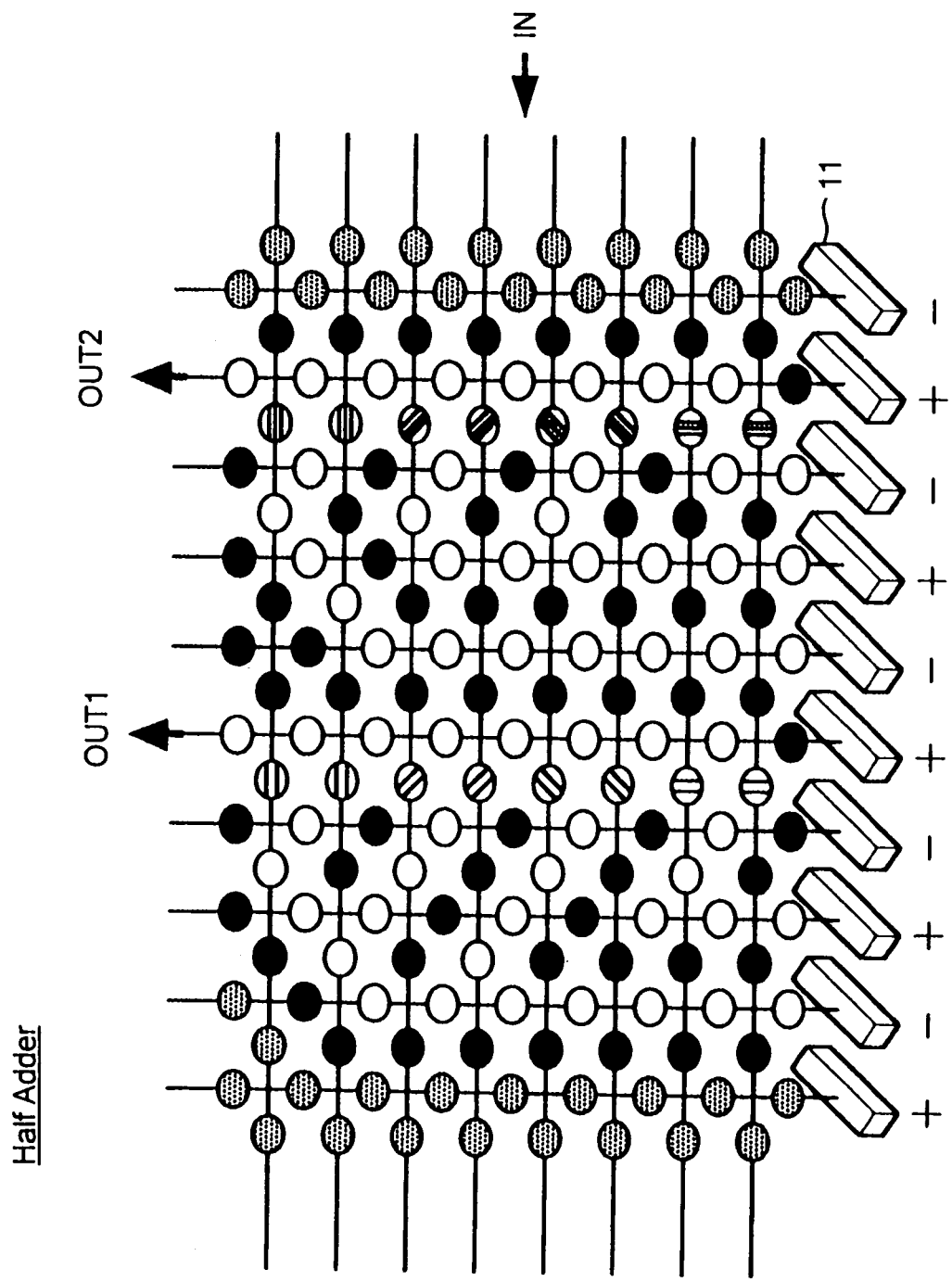

The current path of the half-adder circuit is set as shown in FIG. 25A. In the figure, the elements indicated by the white ovals show elements using magnetoresistance effect elements or resistance control elements set so as to form the current path.

When the input 1 signal is (0) and the input 2 signal is (0) as shown in FIG. 25B, the horizontal connection elements linked with this combination in advance are turned ON. By this, the voltage of −V, that is, "0", is output to the output 1 line along the current path in the (0+0) calculation, and the voltage of −V, that is, "0", is output to the output 2 line along the current path in the (0+0) calculation.

Figure 25C:
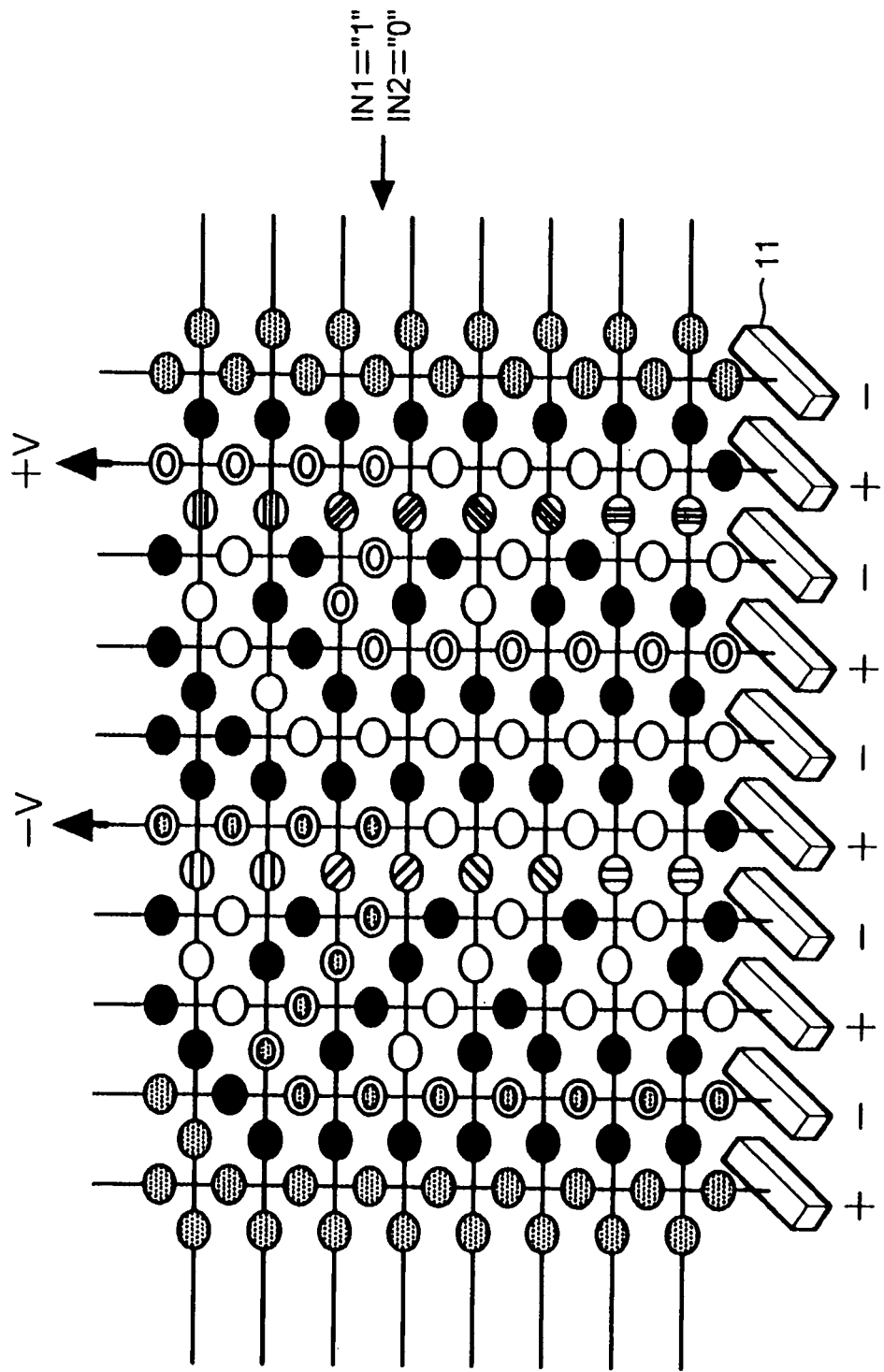

When the input 1 signal is (0) and the input 2 signal is (1) as shown in FIG. 25C, the horizontal connection elements linked with this combination in advance are turned ON. By this, the voltage of −V, that is, "0", is output to the output 1 line along the current path in the (1+0) calculation, and the voltage of +V, that is, "1", is output to the output 2 line along the current path in the (1+0) calculation.

Figure 25D:
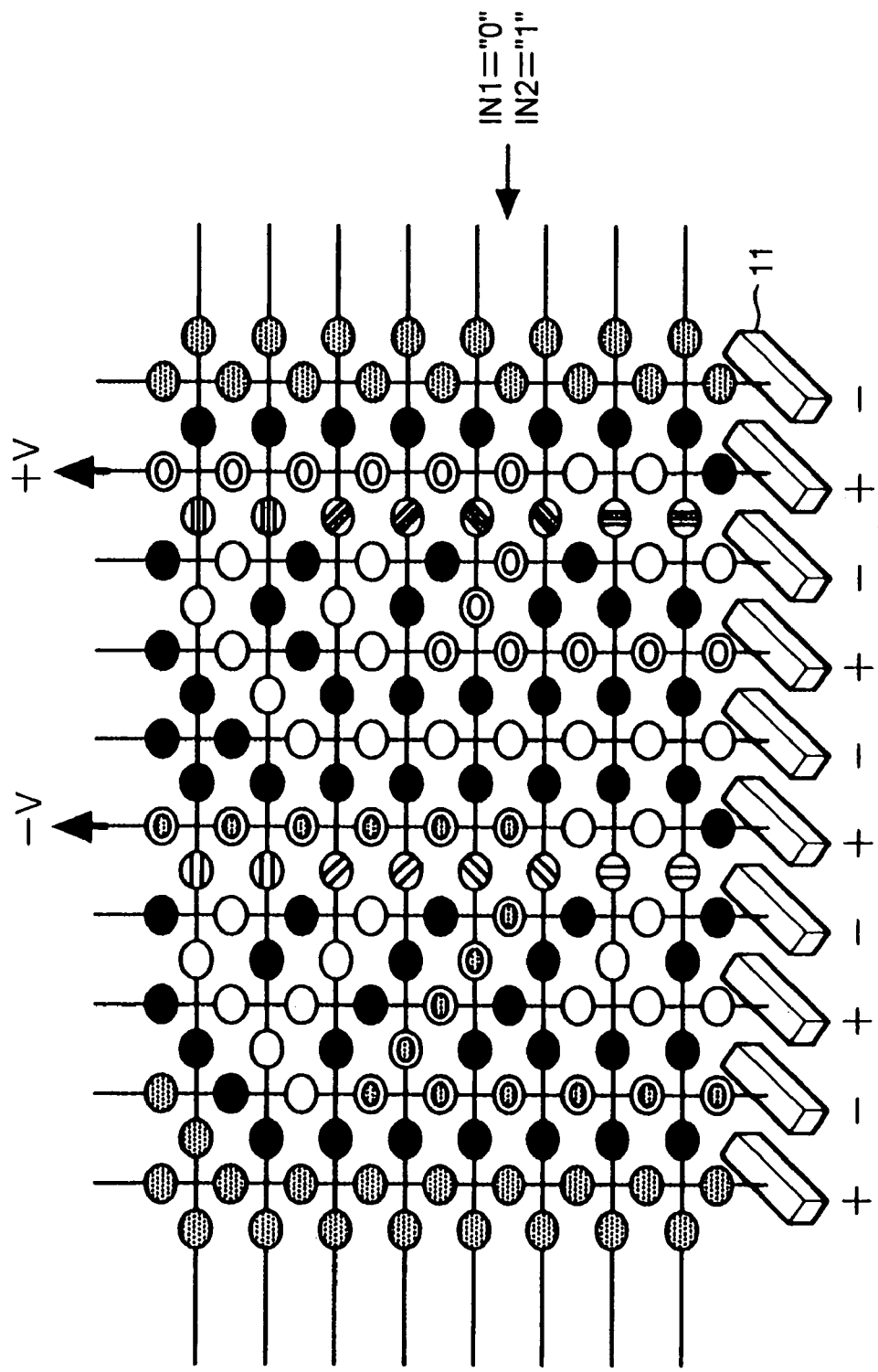

When the input 1 signal is (1) and the input 2 signal is (0) as shown in FIG. 25D, the horizontal connection elements linked with this combination in advance are turned ON. By this, the voltage of −V, that is, "0", is output to the output 1 line along the current path in the (0+1) calculation, and the voltage of +V, that is, "1", is output to the output 2 line along the current path in the (0+1) calculation.

Figure 25E:
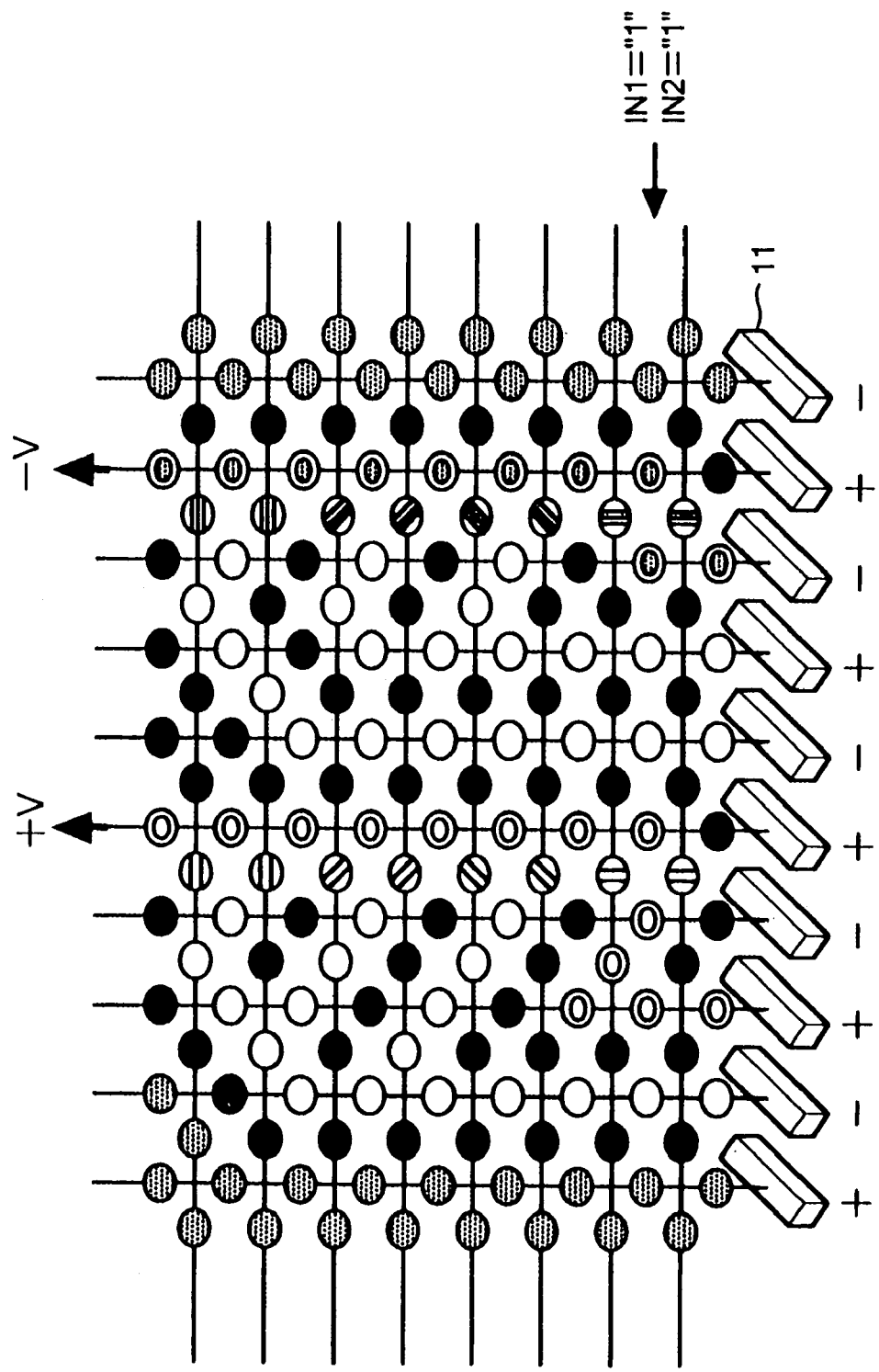

When the input 1 signal is (1) and the input 2 signal is (1) as shown in FIG. 25E, the horizontal connection elements linked with this combination in advance are turned ON. By this, the voltage of +V, that is, "1", is output to the output 1 line along the current path in the (1+1) calculation, and the voltage of +V, that is, "1", is output to the output 2 line along the current path in the (1+1) calculation.

As explained above, in the configuration in the present embodiment, in order to appropriately configure a logic circuit corresponding to a logic formula, the combination of logic circuits configured by conventional MOS transistors is not required. For example, with MOS transistors, an OR circuit is sometimes configured by three NANDs, but in the present embodiment, it is not necessary to configure the circuit by logic circuits other than OR circuits. From this viewpoint, the required area of the logic circuit can be reduced.

Memory

A case of use as a memory circuit will be explained. As explained by referring to FIG. 1, in the present embodiment, a structure of eight horizontal connection elements stacked on each other is exhibited, so 8 bits can be simultaneously stored.

An example of the memory circuit will be explained by referring to the views of the configuration of FIGS. 27A to 27C. FIG. 28 is a graph of the states of the elements in the memory circuit.

A current path for the memory function is formed as shown in FIG. 27A. In FIG. 27A, elements not yet set with functions and elements other than the elements turned OFF for forming the memory circuit are set as elements forming the current path. Here, part of the horizontal connection elements using magnetoresistance effect elements or resistance control elements is used as the memory elements. Each of the eight stacked horizontal connection elements "1" to "8" is linked with the most significant bit (MSB) to the least bit (LSB) from the top toward the bottom. The order of the arrangement of the bits may be reverse too.

As an example of the memory, an example of storing "00110101" will be shown in FIG. 27B.

The horizontal connection elements corresponding to "1" are turned ON (indicated by the bulls eye marks in the figure), while the horizontal connection elements corresponding to "0" are turned OFF (indicated by the black dots in the figure). This ends the write operation. The read operation is carried out by turning ON the vertical connection elements adjacent to the memory elements and connected to the power supply line 11 so that current passes through only the horizontal connection elements corresponding to "1", a signal corresponding to "00110101" is output to the output line. In the present invention, a power supply line 11 of +V was used, but a power supply line 11 of −V can be used too.

It is also possible to link the case of use of the power supply line +V with storage of a positive value and link the case of use of the power supply line 11 (−V) as shown in FIG. 27C with storage of a negative value. In this case, there is the effect that it is not necessary to store negative values by complement notation.

Address Allocation Method

When allocating addresses to circuit elements or connection elements in the circuits mentioned above, the addresses can be allocated not only to single functional circuits such as the AND circuit and the NOR circuit illustrated before, but also to units of functional blocks. In this case, there are three method of uses.

Figure 36A:
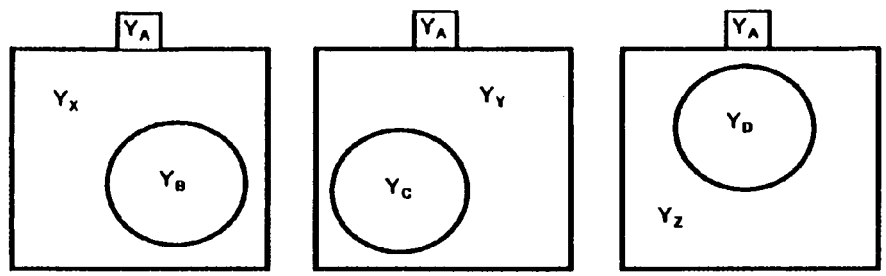
FIGS. 36A to 36C are views for explaining a circuit configuration and a mode of usage in a semiconductor integrated circuit device as a third aspect of the present invention.
Figure 36B:
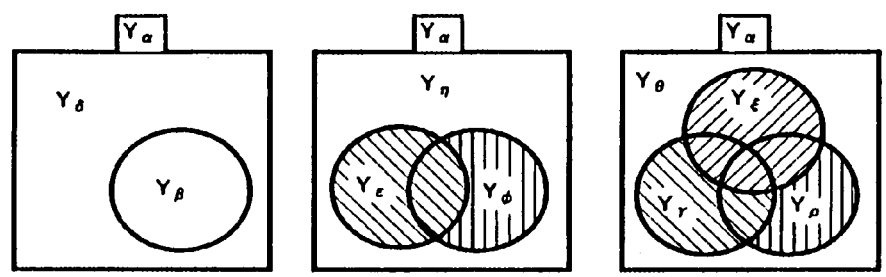

As a first method of use, by designating functional blocks provided with different functions as different address spaces in a set of elements to which addresses are allocated in advance, for example, "α" in FIG. 36B, it is possible to simultaneously execute different processings in "α". For example, explaining this by FIG. 36B, this corresponds to the fact that "ξ", "γ", and "ρ" are functional blocks different from each other.

As a second method of use, by designating functional blocks provided with the same functions as different address spaces in the set "α" of the elements to which addresses are allocated in advance, it is possible to simultaneously execute the same processings in "α". For example, explaining this by FIG. 36B, this corresponds to the fact that "ξ", "γ" and "ρ" are the same functional blocks. This case corresponds to the fact that processings of the same function can be carried out with an efficiency three times the conventional example.

As a third method of use, so-called parallel processing is realized. For example, by designating functional blocks provided with the same functions as different address spaces in the set "α" of the elements to which addresses are allocated in advance, it is possible to simultaneously execute processings in "α" linked with each other. For example, explaining this by FIG. 36B, this corresponds to the fact that "ξ", "γ", and "ρ" are the same functional blocks and client regions in the parallel processing. Further, the function of a server region in the parallel processing is allocated to a "θ" region. In this case, it is not necessary to disperse the parallel processing to four logical devices as in the conventional example. It can be realized in one set "α" of the elements.

In an instruction processing system, when there is interdependency among classes in different functional block unit, that is, where an obstacle corresponding to the pipeline hazard which plagued the conventional pipeline processing occurs, for example, in the category of pipeline hazards, when problems arise corresponding to a control hazard derived from a branch instruction or data flow dependency, inverse dependency, and output dependency concerning a data hazard, they can be avoided by the following means.

When a long waiting time is caused in a specific functional block, the addresses covered are shifted to a buffer address space, and the address space and the memory space required for the logic operation are temporarily released. Then, addresses are allocated to the functional blocks are the cause of the wait so as to cancel out the dependency. This same is also true for the case where there is an inverse dependency or output dependency. Namely, it becomes possible to process functional block units by a pipeline and possible to optimize the processing regions and the memory regions along with program execution by only changing the addresses.

This will be explained by referring to FIG. 36B. Assume that the "θ" region is not allocated any function. If a long wait time is caused in the "γ" region due to the wait for the processing of the "ρ" region, the functional block of the "γ" region is temporarily shifted to the "θ" region and the function of the "ρ" region is generated in the "γ" region. Using the "ξ" region as the server, parallel processings by the "γ" region and the "ρ" region are carried out, then the original function is returned to the "γ" region, whereby the "wait" is eliminated. In this way, even when dependency occurs in functional block units, the dependency can be immediately eliminated.

Further, when the input signal greatly fluctuates along with time and the contents of the processing of the program differ in accordance with the change of the input signal, it is possible to achieve an improvement of the processing speed. Namely, in the prior art, the optimum logic circuit is selected and executed by a branch instruction in accordance with a change of the input signal. In the process of execution, the spatially and functionally separated logic elements and the memory elements are used, so a function of predicting the change of the input signal coming next in function units cannot be added.

On the other hand, according to the present embodiment, by predicting the input/output signal and preparing the logical function which may be used next in advance, it is possible to improve the processing speed. It is also possible to parallel process a plurality of logical functional blocks with respect to further different input signals.

This will be explained by referring to FIG. 36B. The "ξ" region, the "γ" region, and the "ρ" region are allocated functional blocks predicting the change of the input signal in three ways. Here, when an input signal suited to the "ξ" region is received as input, the processing is carried out in the "ξ" region. The functions of the "ρ" region and the "γ" region are immediately eliminated by the release of their addresses, and a processing function predicting the next input signal is immediately generated. In the "θ" region, a function region for predicting the input signal and predicting the processing functional space is generated.

Next, an explanation will be given of a method of production of the integrated circuit device of the present invention by referring to sectional views of production steps.

The method of production of an integrated circuit device of the present invention is a method of production of an integrated circuit device successively repeating the generation and release of spaces acting as any circuit functions so as to divide in time and divide in space the functions of the elements and thereby provide a plurality of circuit functions, realized by a step of forming transistor regions for allocating addresses to magnetoresistance effect elements and a step of stacking and sequentially forming the magnetoresistance effect elements.

For example, this device is configured by a semiconductor substrate (for example, a silicon wafer) on which are formed a region wherein elements bearing logic circuit functions and the memory functions are comprised of stacked magnetoresistance effect elements and a peripheral circuit region comprised of MOS transistors for designating the addresses of vertical connection elements and horizontal connection elements comprised by magnetoresistance effect elements. The MOS circuit portion supplies a current for turning ON/OFF the magnetoresistance effect elements by the address designation.

The integrated circuit device may be produced sequentially according to the schematically shown layout views and partial enlarged views of FIG. 1 to FIG. 10. In FIG. 1 to FIG. 10, an arrangement of 6×6 vertical connection elements and an arrangement of 7×7 horizontal connection elements are illustrated, but this is for convenience of the explanation. There is no limitation on the numbers of the vertical connection elements and the horizontal connection elements.

Specifically, the integrated circuit device is prepared through the following steps. Below, an explanation will be given by using schematically shown sectional views of the production steps.

Figure 29A:
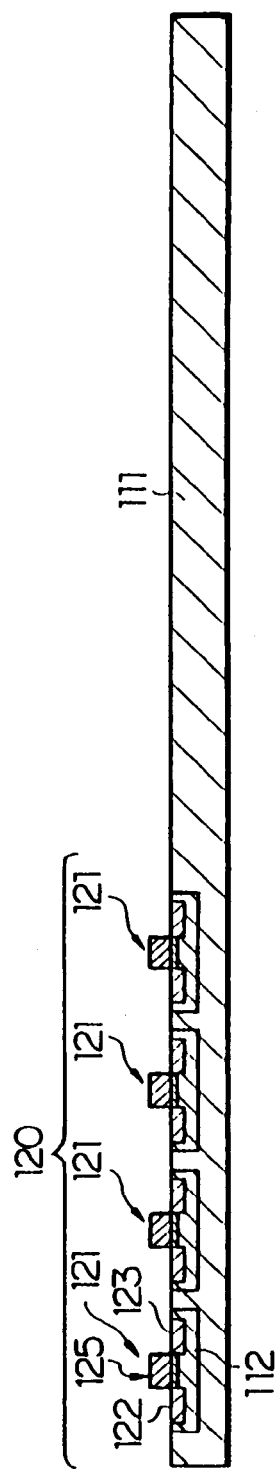
FIGS. 29A to 29I are views illustrating a method for producing the semiconductor integrated circuit device where magnetoresistance effect elements are used for the circuit elements and the connection elements as a first embodiment of the present invention.

Step 1: As shown in FIG. 29A, a semiconductor substrate (for example, a silicon wafer) 111 is provided with a peripheral circuit region 120 comprised of MOS transistors 121. Namely, a step of formation of element isolation (not illustrated), a step of formation of wells 112, a step of formation of sources 122 and drains 123, and a step of formation of gates 125 are carried out to prepare a peripheral circuit region 120 comprised of MOS transistors 121.

Figure 29B:
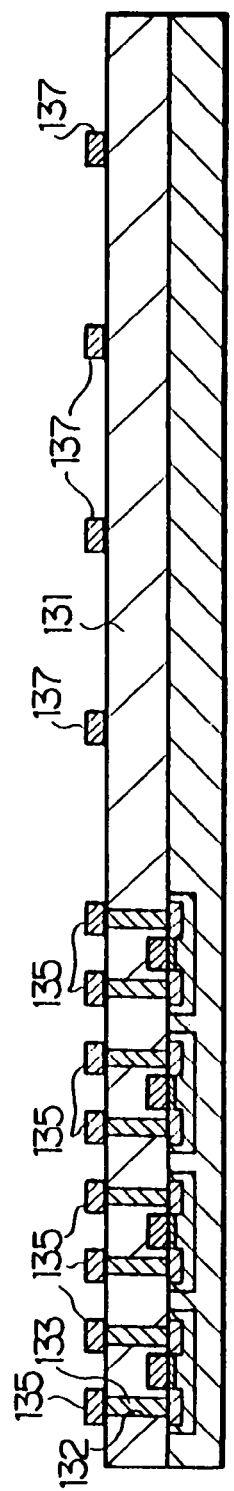

Step 2: As shown in FIG. 29B, a step of formation of an inter-layer insulating film 131, a step of formation of contact holes (via holes) 132, burial of the contact holes 132 by a conductive material, and formation of plugs 133, and a step of formation of interconnects for forming the interconnects (for example metallic interconnects) are carried out to form interconnects 135 of the MOS transistors connected to the plugs 133 and power supply lines 137 of the magnetoresistance effect elements.

Figure 29C:
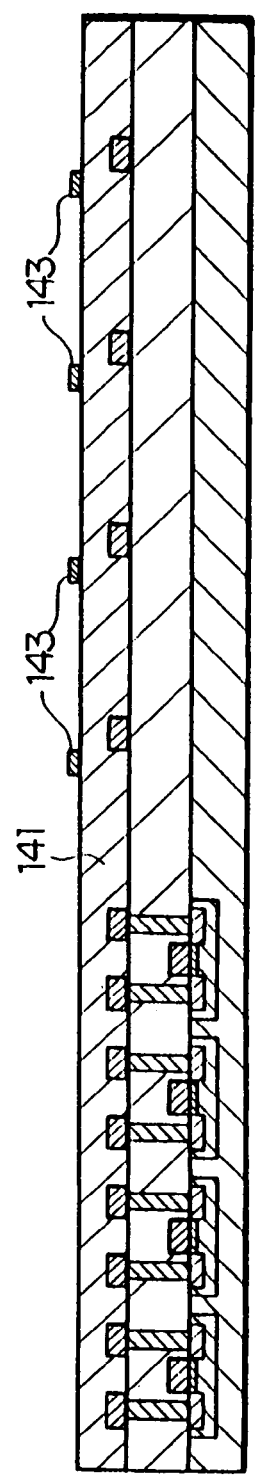

Step 3: As shown in FIG. 29C, after forming the inter-layer insulating film 141, magnetic field inversion use control lines 143 are formed.

Figure 29D:
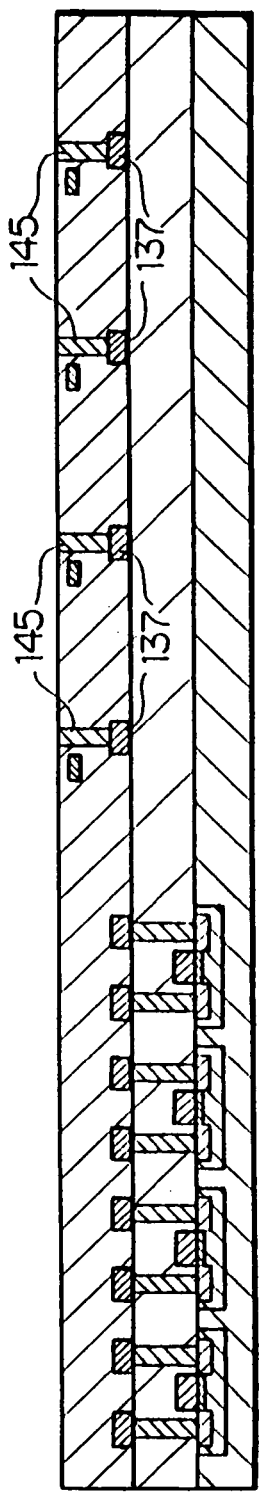

Step 4: As shown in FIG. 29D, connection use contacts 145 for connecting the magnetic field inversion functional layers of the magnetoresistance effect elements to be formed later and the power supply lines 137 are formed.

Figure 29E:
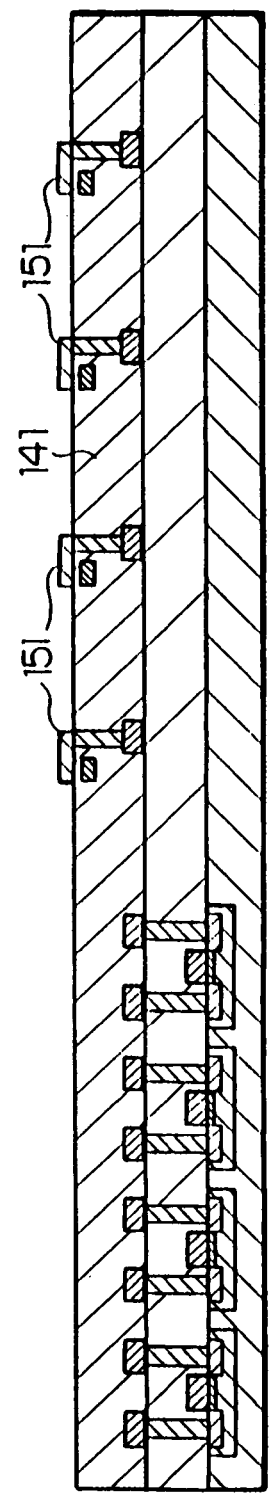

Step 5: As shown in FIG. 29E, magnetic field inversion functional layers 151 are formed on the inter-layer insulating film 141.

Figure 29F:
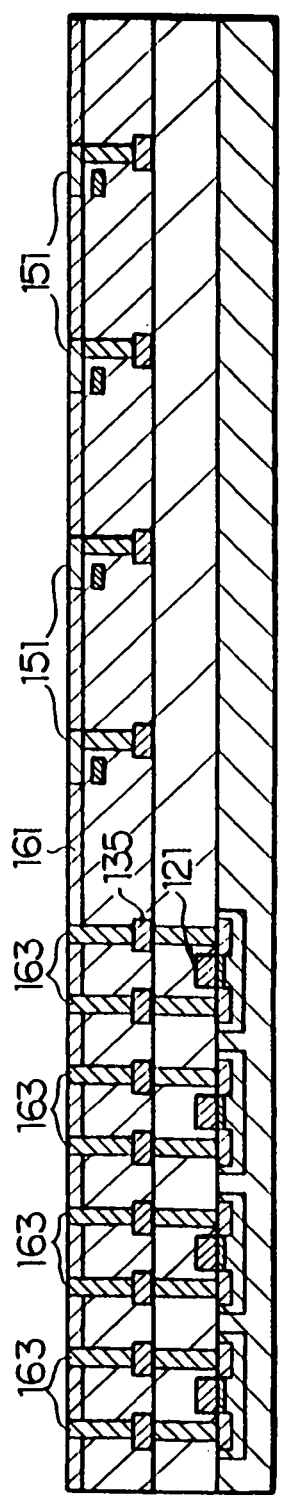

Step 6: As shown in FIG. 29F, an inter-layer insulating film 161 is formed so that the magnetic field inversion functional layers 151 are exposed, then via holes reaching the interconnects 135 connected to the MOS transistors 121 of the peripheral circuit region are formed, then plugs 163 for burying the via holes are formed.

Figure 29G:
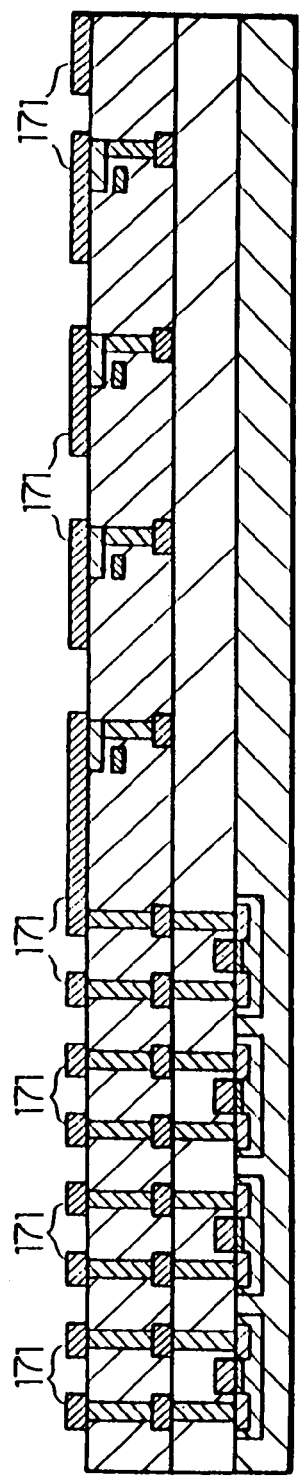

Step 7: As shown in FIG. 29G, second interconnects (for example, metallic interconnects) 171 of the MOS transistors 121 of the peripheral circuit region and magnetoresistance effect elements 151 are formed.

Figure 29H:
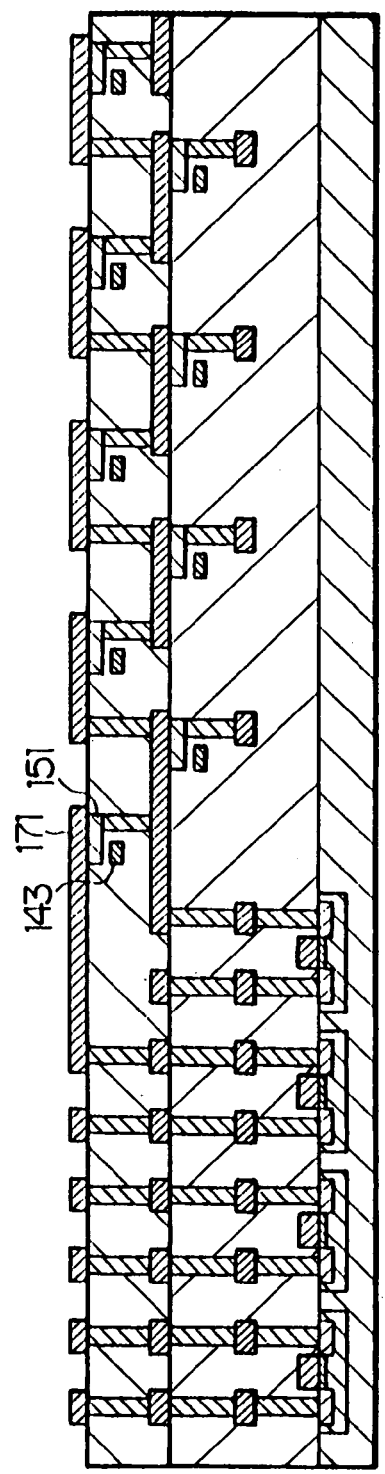

Step 8: As shown in FIG. 29H, by repeating the process from step 3 to step 7, the magnetic field inversion use control lines 143, the magnetoresistance effect elements 151, and the second interconnects (for example, metallic interconnects) 171 of the MOS transistors 121 and the magnetoresistance effect elements 151 are formed by stacking.

Figure 29I:
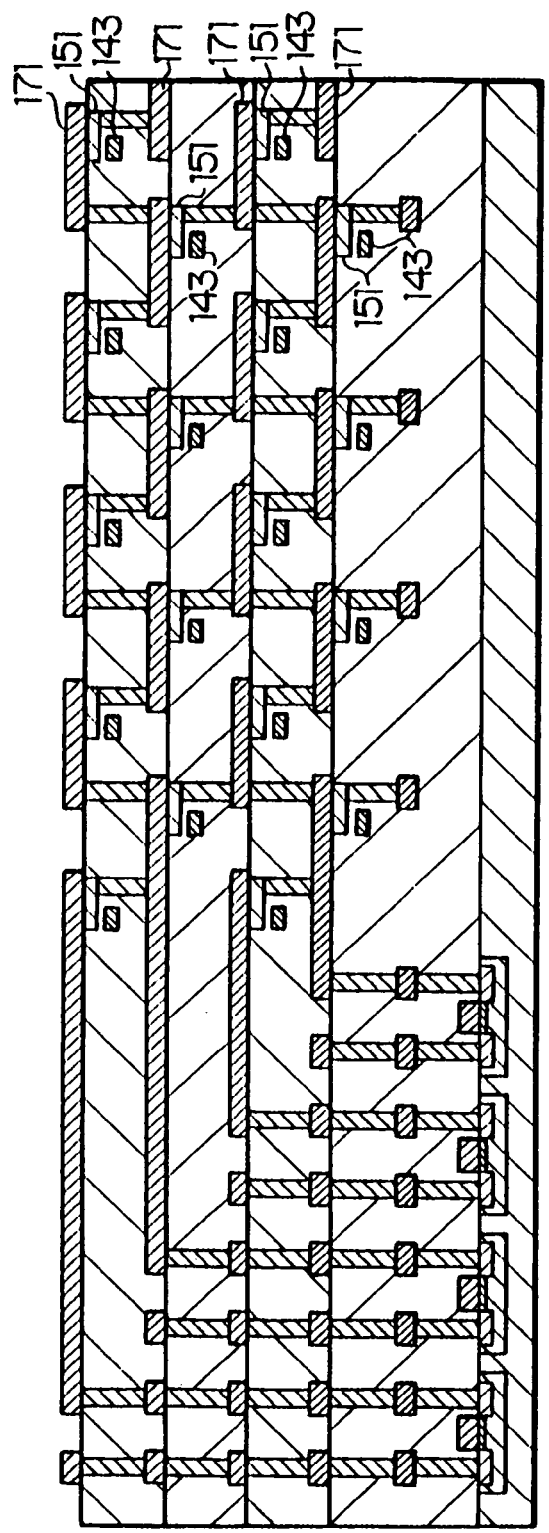

Step 9: As shown in FIG. 29I, as a result of further repeating the process from step (3) to step (7), the magnetoresistance effect elements 151 and the second interconnects (for example, metallic interconnects) of the MOS transistors 121 of the peripheral circuit region and the magnetoresistance effect elements 151 are formed stacked in four layers. FIG. 29I shows a case where the process from step (3) to step (7) is repeated two times from the state shown in FIG. 29F.

According to the above method of production of the integrated circuit device, by repeating the process from step (3) to step (7), it is possible to repeatedly stack functional structures of the power supply line, nine layers of vertical connection elements, and eight layers of horizontal connection elements and thereby form an 8-bit configuration. Further, by repeatedly stacking structures of 17 layers of the vertical connection elements and 16 layers of the horizontal connection elements, it is also possible to form a 16-bit configuration. Further, by repeatedly stacking structures of 33 layers of the vertical connection elements and 32 layers of the horizontal connection elements, it is also possible to form a 32-bit configuration.

Figure 30:
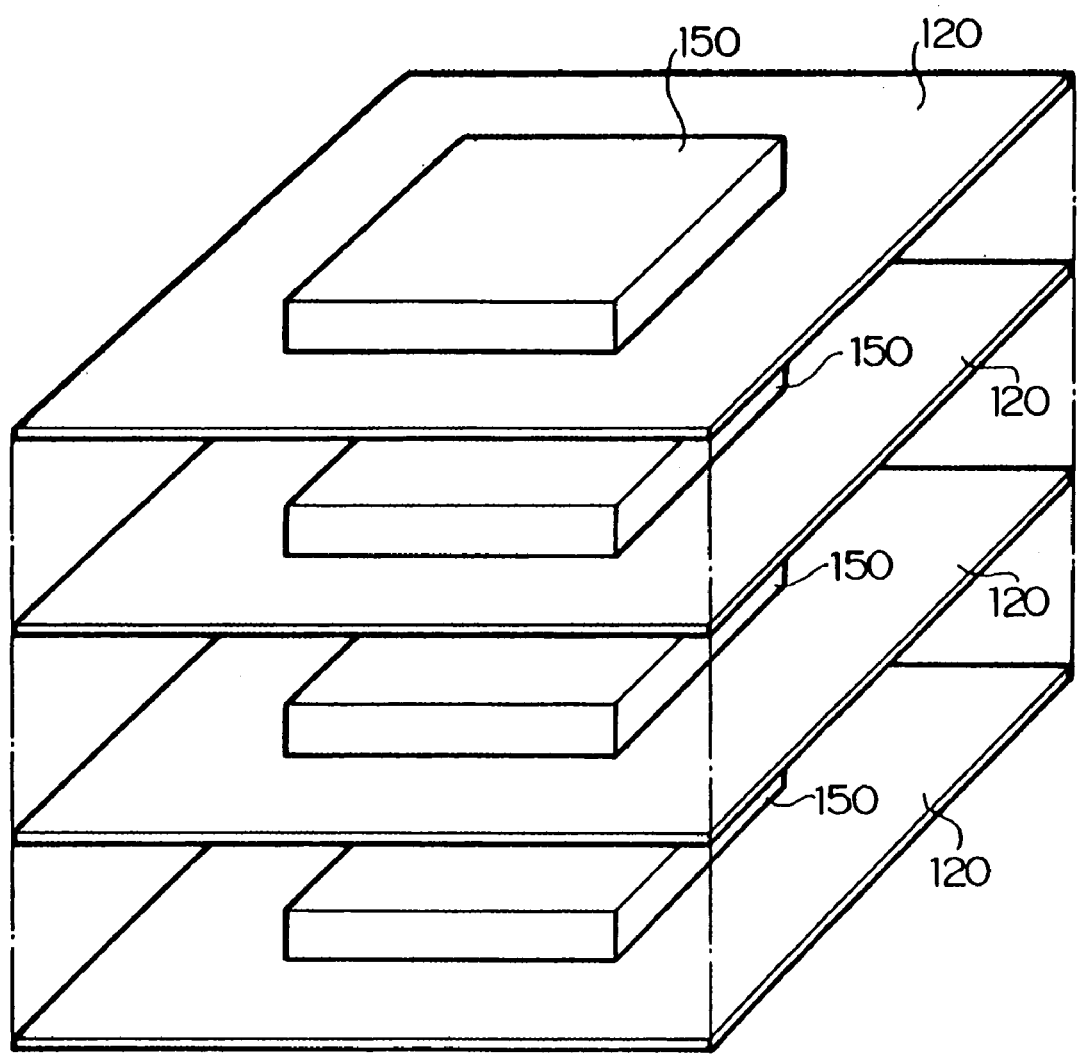
FIG. 30 is a view illustrating a concept of the configuration of the semiconductor integrated circuit device produced according to the method of production of a semiconductor integrated circuit device illustrated in FIGS. 29A to 29I.

Further, in a configuration repeatedly stacking functional structures of a power supply line, 9 layers of the vertical connection elements, and 8 layers of the horizontal connection elements, by epitaxially growing silicon between adjacent functional structures, as shown in the views of the configuration of FIG. 29I and FIG. 30, a peripheral circuit region 120 comprised of MOS transistors can be formed for every functional structure layer. In FIG. 30, the peripheral circuit region 120 constituted by the MOS transistors is formed with the logical function and the memory function region 150 constituted by the magnetoresistance effect elements. A plurality of layers (4 layers in the figure) are stacked.

Figure 31:
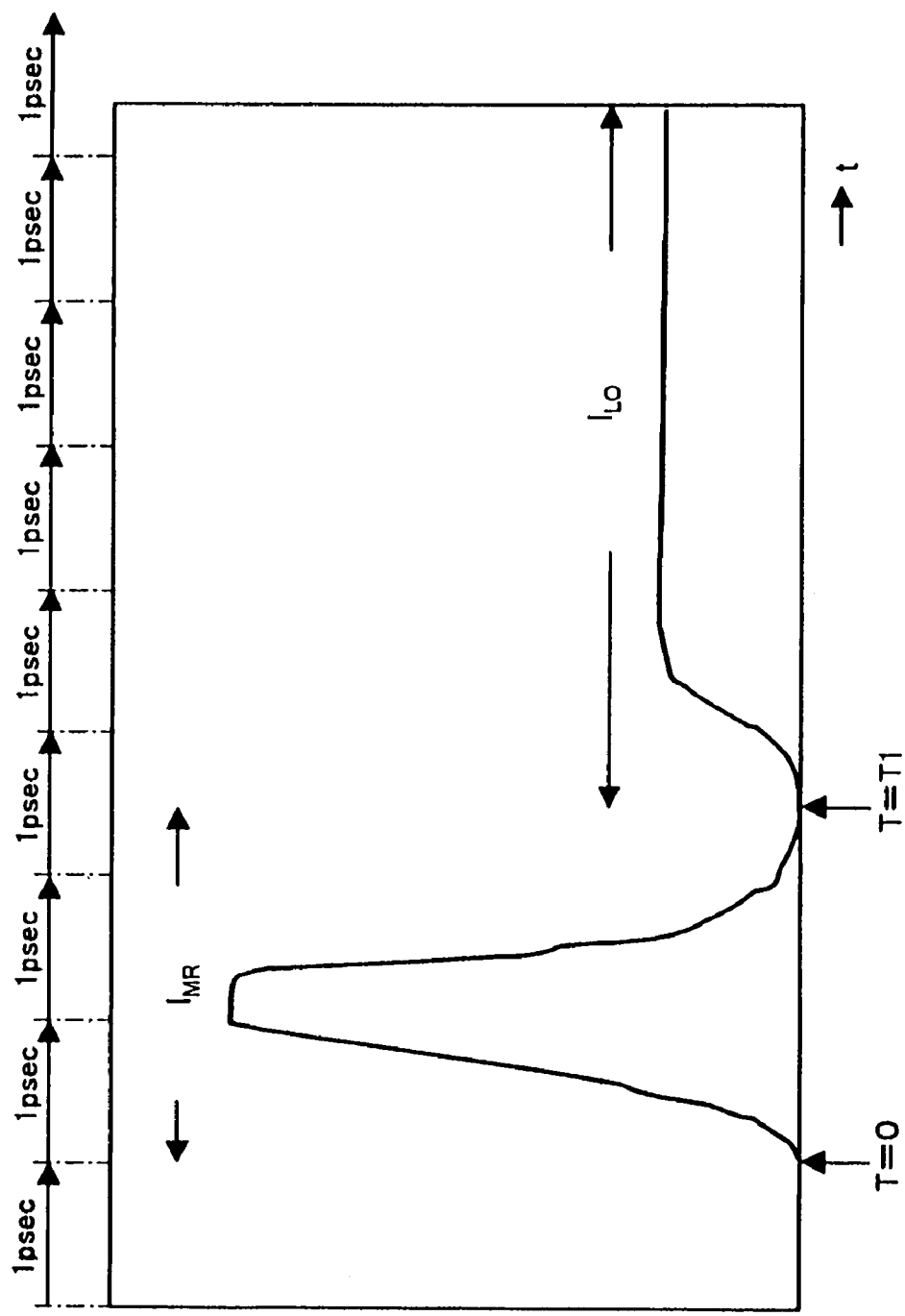
FIG. 31 is a graph illustrating the operating characteristics of the circuit elements in the semiconductor integrated circuit device of the present invention.

The time required for magnetic field inversion of a magnetoresistance effect element is about a pico-second (psec). For this reason, a switching speed of 100 GHz becomes possible. Therefore, an example of the current according to the timing of flowing through the magnetoresistance effect element in a case of combination with a MOS transistor of the peripheral portion which can be driven at 10 GHz will be shown in FIG. 31. As shown in FIG. 31, by the horizontal connection elements repeatedly turning ON and OFF and frequently passing a magnetic field inversion current $I_{MR}$, the magnetic field inversion current also flows through the output line, but the voltage required for the magnetic field inversion and the power supply voltage are different, so the magnetic field inversion current IMR and the logic circuit operation current $I_{LO}$ can be easily distinguished. This is clear also from the figure wherein the current is the magnetic field inversion current $I_{MR}$ from T=0 to T=T1 and the logic circuit operation current $I_{LO}$ after T=T1.

Referring to FIG. 32A to 32I, another method of production of an integrated circuit device of the present invention will be explained below.

This method of production of an integrated circuit device is a method of production of an integrated circuit device successively repeatedly generating and releasing spaces acting as any circuit functions so as to dividing in time and divide in space the functions of the elements and thereby provide a plurality of circuit functions, realized by a step of forming transistor regions for allocating addresses to for example resistance control elements and a step of sequentially forming the resistance control elements by stacking.

For example, this device is configured by a semiconductor substrate (for example, a silicon wafer) on which are formed a region wherein elements bearing logic circuit functions and the memory functions are comprised of stacked resistance control elements and a peripheral circuit region comprised of MOS transistors for designating the addresses of vertical connection elements and horizontal connection elements comprised by resistance control elements. The MOS circuit portion supplies a current for turning ON/OFF the resistance control elements by the address designation.

Specifically, the integrated circuit device is prepared through the following steps. Below, an explanation will be given by using schematically shown sectional views of production steps.

Figure 32A:
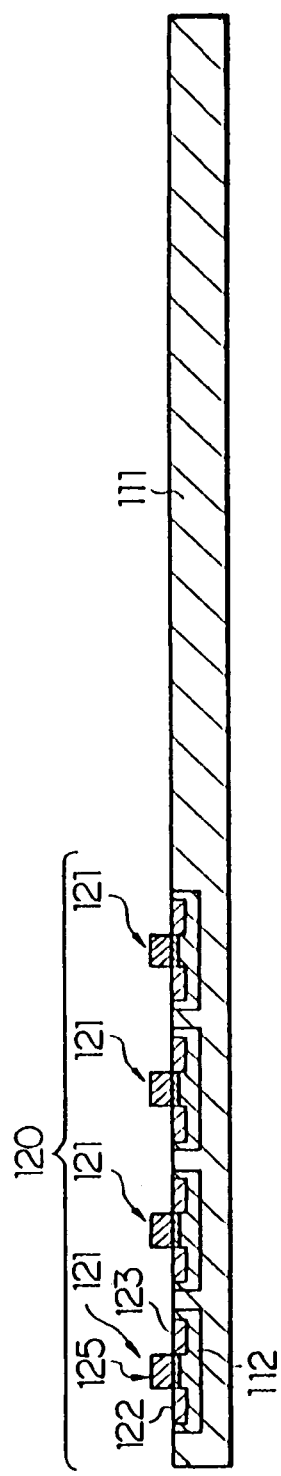
FIGS. 32A to 32I are views illustrating a method for producing a semiconductor integrated circuit device where resistance control elements are used for the circuit elements and the connection elements as a second embodiment of the present invention.

Step 1: As shown in FIG. 32A, the semiconductor substrate (for example silicon wafer) 111 is provided with a peripheral circuit region 120 comprised of MOS transistors 121. Namely, the step of formation of element isolation (not illustrated), a step of formation of wells 112, a step of formation of sources 122 and drains 123, and a step of formation of gates 125 are carried out to prepare a peripheral circuit region 120 comprised of the MOS transistors 121.

Figure 32B:
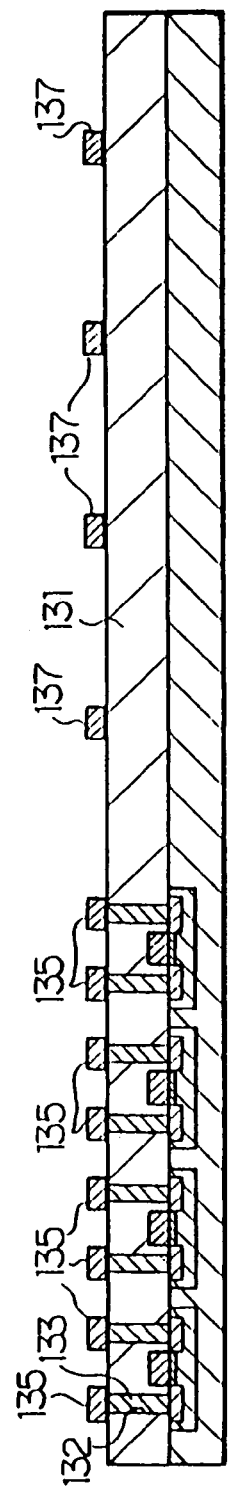

Step 2: As shown in FIG. 32B, a step of formation of an inter-layer insulating film 131, a step of formation of contact holes, burial of the contact holes 132 by a conductive material, and formation of plugs 133, and a step of formation of interconnects for forming the interconnects (for example metallic interconnects) are carried out to form interconnects 135 of the MOS transistors connected to the plugs 133 and power supply lines 137 of the resistance control elements.

Figure 32C:
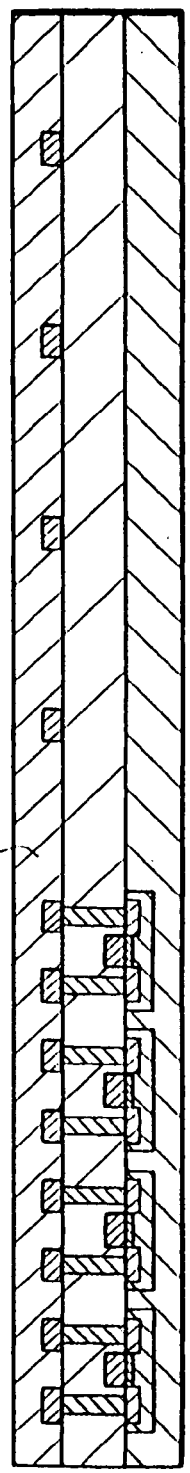

Step 3: As shown in FIG. 32C, an inter-layer insulating film 141 is formed.

Figure 32D:
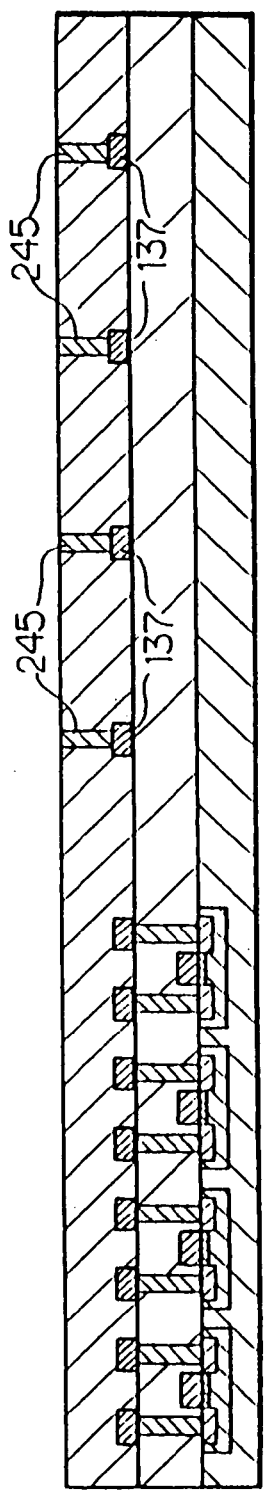

Step 4: As shown in FIG. 32D, contacts 245 for connecting the resistance control elements and the power supply lines and for a heater are formed.

Figure 32E:
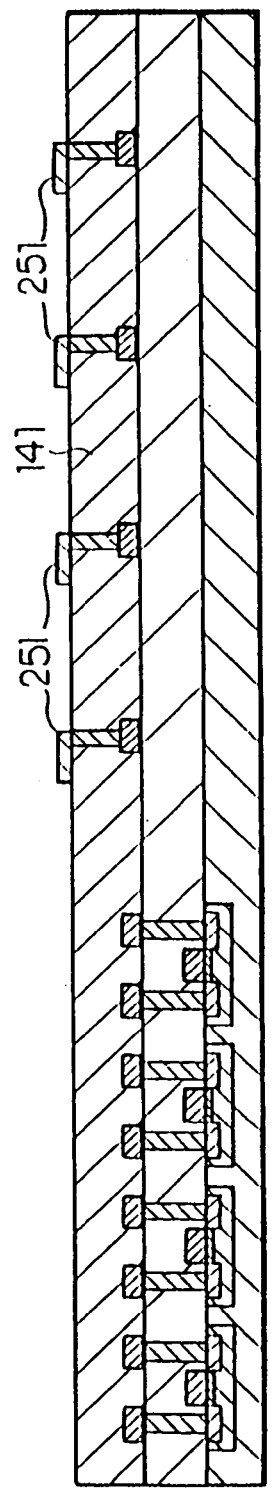

Step 5: As shown in FIG. 32E, chalcogenide layers 251 of the resistance control elements are formed on the inter-layer insulating film 141.

Figure 32F:
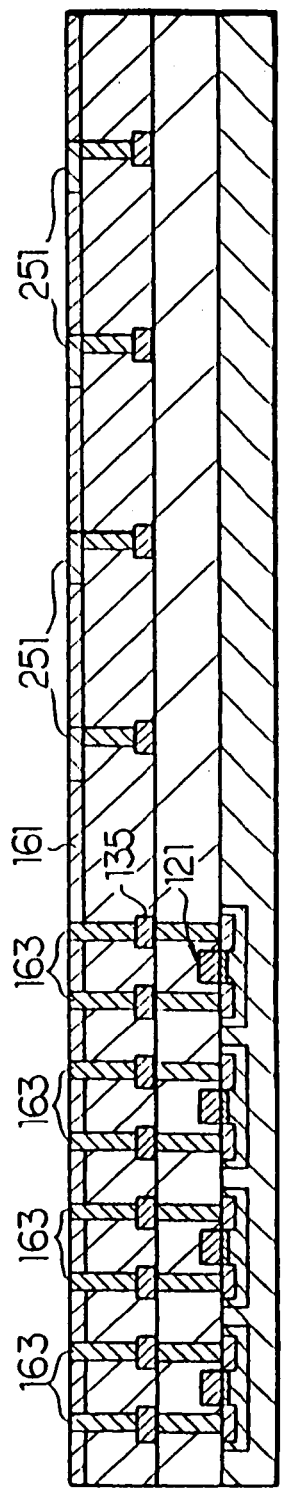

Step 6: As shown in FIG. 32F, an inter-layer insulating film 161 is formed so that the chalcogenide layer 251 surfaces of the resistance control elements are exposed, then via holes reaching the interconnects 135 connected to the MOS transistors 121 of the peripheral circuit region are formed, then plugs 163 burying the via holes are formed.

Figure 32G:
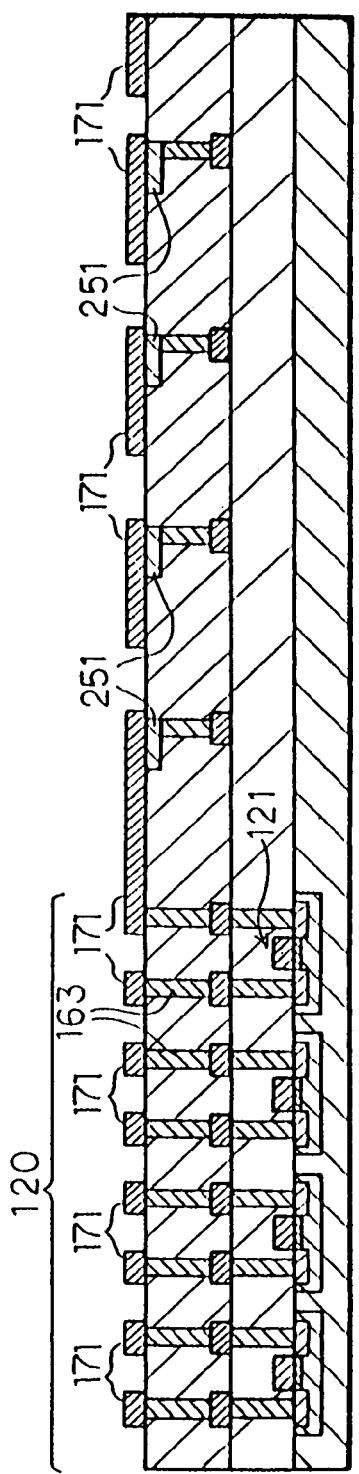

Step 7: As shown in FIG. 32G, second interconnects (for example metallic interconnects) 171 of the peripheral circuit region 120 are formed so as to be connected to the buried plugs 163 and, at the same time, second interconnects (for example metallic interconnects) 171 to be connected to the chalcogenide layers 251 of the resistance control elements are formed.

Step 8: As shown in FIG. 32G, the process from the step 3 to the step 7 is repeated so as to form stacked the buried plugs 163 of the peripheral circuit region 120, heater use contacts 245 of the resistance control elements, chalcogenide layers 251 of the resistance control elements, second interconnects (for example, metallic interconnects) of the peripheral circuit region 120, and second interconnects (for example, metallic interconnects) 171 of the resistance control elements.

Figure 32H:
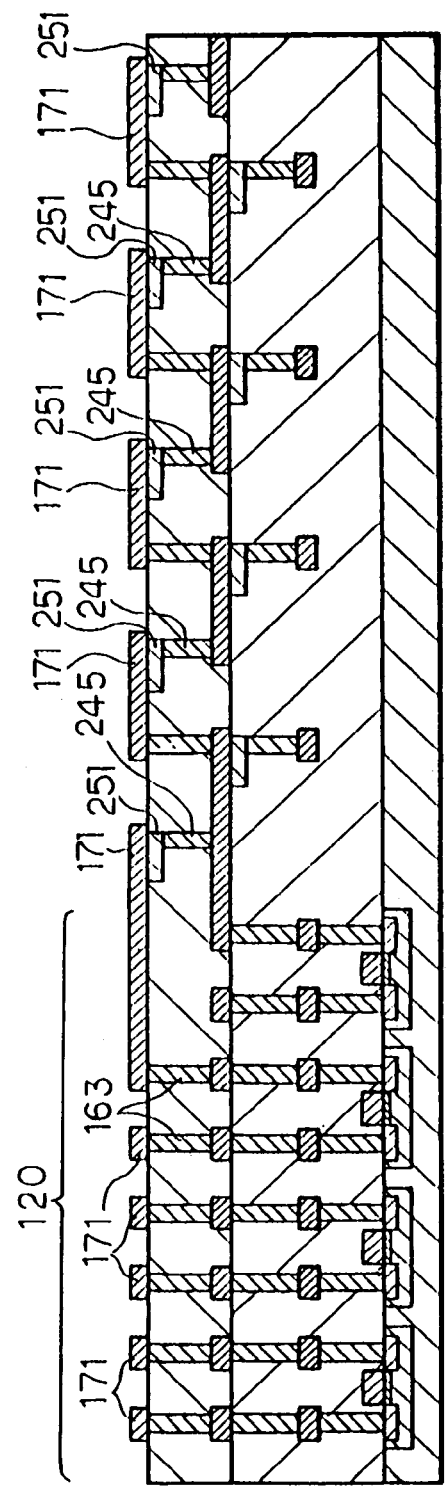
Figure 32I:
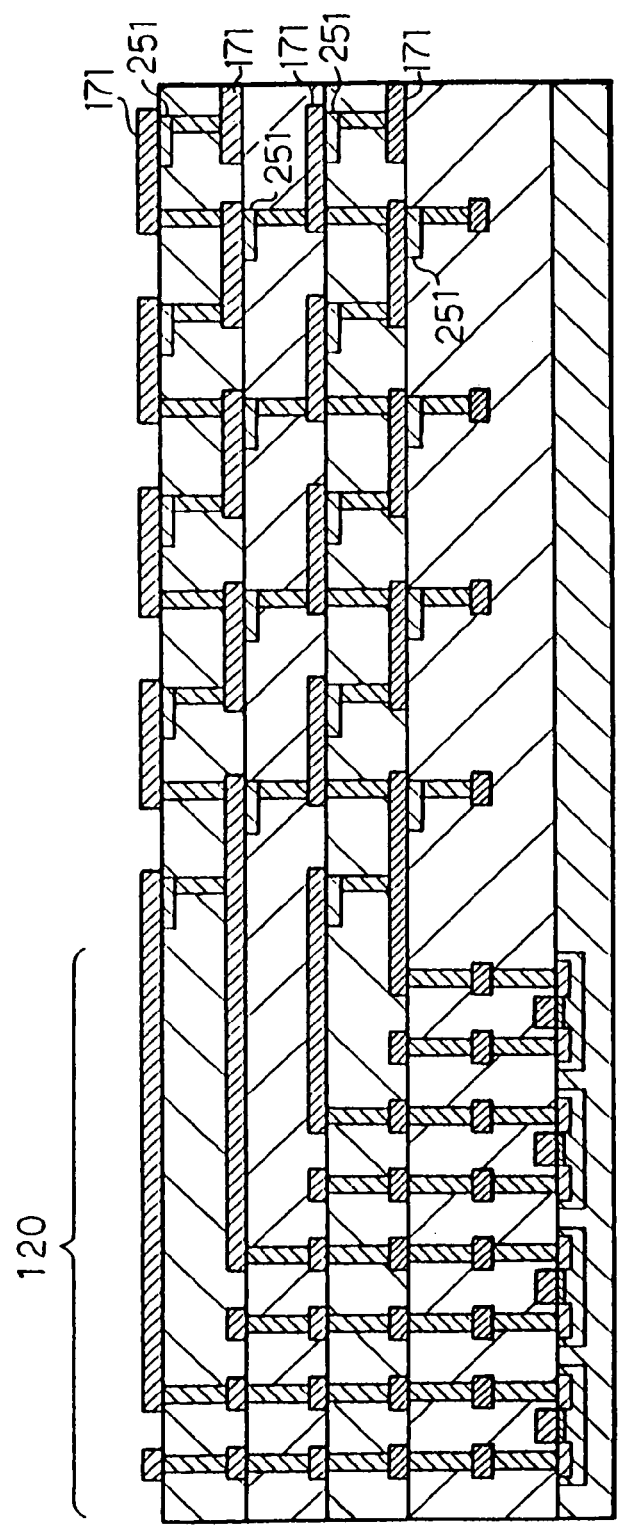

Step 9: As shown in FIG. 32H, further, as a result of the repetition of the process from step 3 to step 7, the chalcogenide layers 251 of the resistance control elements and the second interconnects (for example, metallic interconnects) of the peripheral circuit region 120 and the resistance control elements are formed in a state stacked in four layers. FIG. 32I shows a case where the process from step 3 to step 7 is repeated two times from the state shown in FIG. 32G.

According to the above method of production of the integrated circuit device, by repeating the process from step 3 to step 7, the functional structures of the power supply line, 9 layers of vertical connection elements, and 8 layers of horizontal connection elements are repeatedly stacked to thereby form an 8-bit configuration. Further, by repeatedly stacking structures of 17 layers of the vertical connection elements and 16 layers of the horizontal connection elements, it is also possible to form a 16-bit configuration. Further, by repeatedly stacking structures of 33 layers of the vertical connection elements and 32 layers of the horizontal connection elements, it is also possible to form a 32-bit configuration.

Figure 33:
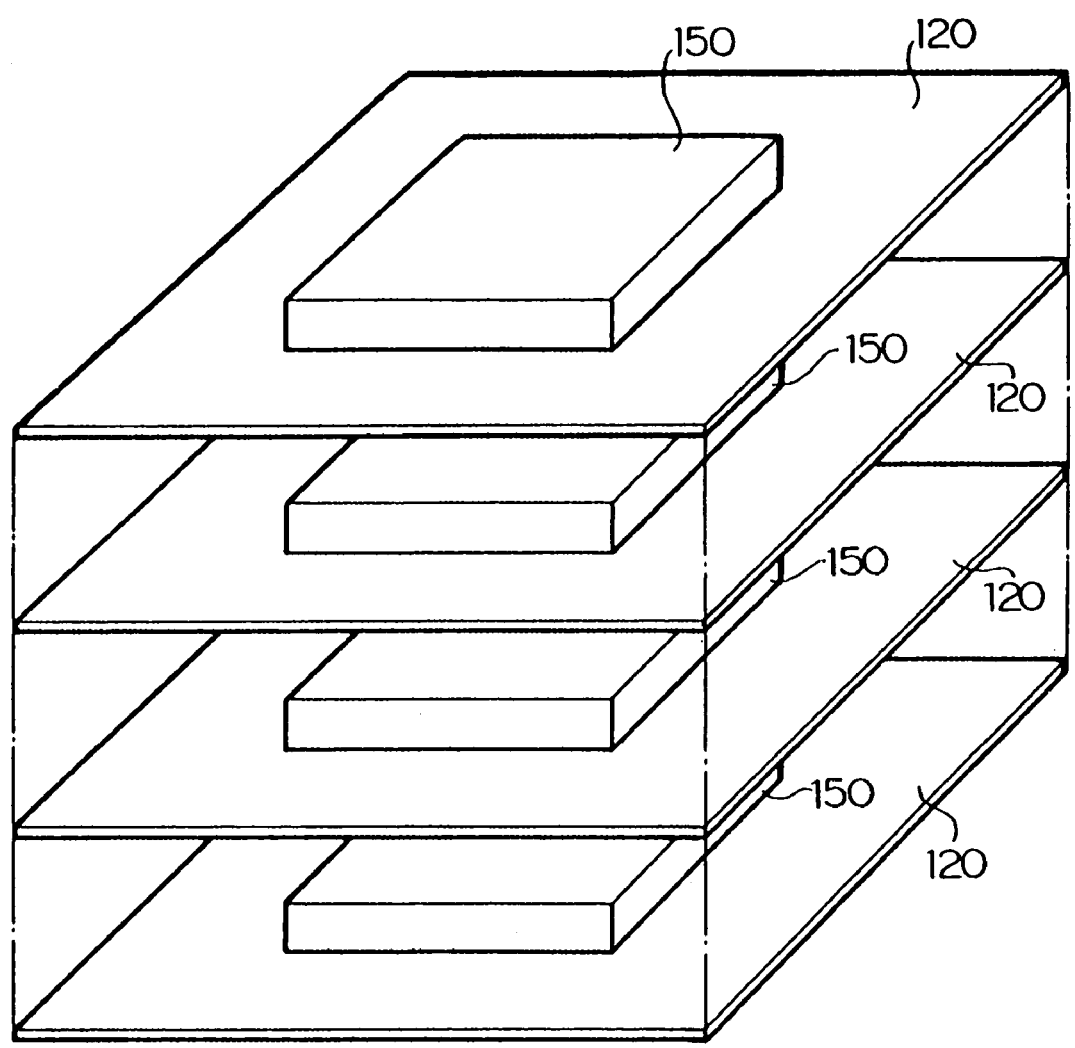
FIG. 33 is a view illustrating the concept of the configuration of the semiconductor integrated circuit device produced according to the method of production of a semiconductor integrated circuit device illustrated in FIGS. 32A to 32I.

Further, in a configuration repeatedly stacking functional structures of a power supply line, 9 layers of the vertical connection elements, and 8 layers of the horizontal connection elements, by epitaxially growing silicon between adjacent functional structures, as shown in the views of the configuration of FIG. 32I and FIG. 33, a peripheral circuit region 120 comprised of MOS transistors can be formed for every functional structure layer. In FIG. 33, the peripheral circuit region 120 constituted by the MOS transistors is formed with the logical function and the memory function region 150 constituted by the resistance control elements. A plurality of layers (4 layers in the figure) are stacked.

In the above method of production, each layer was formed by a logic function and memory function region 150 comprised of resistance control elements, but it is also possible to form any layer by a logic function and memory function region 150 comprised of the magnetoresistance effect elements explained before. Namely, in one integrated circuit device, it is also possible to mix logic function and memory function regions 150 constituted by magnetoresistance effect elements and constituted by resistance control elements.

As explained above, according to the architecture of the integrated circuit of the present invention, logic elements are not allocated in a fixed manner to space for every function as in the prior art and the functions of logic elements can be obtained by dynamically securing and releasing addresses along with time (clock advance) and repeating this. By this, it becomes possible for one logic element to have a plurality of functions, so the functional capacity can be increased without increasing the spatial volume of the integrated circuit. Further, by employing a three-dimensional cubic structure as the structure of the integrated circuit, the spatial volume for realizing functions can be remarkably increased. Accordingly, it becomes possible to configure a multi-functional integrated circuit by a configuration of the minimum extent of elements.

According to the architecture of the integrated circuit device of the present invention, integrated circuits are not allocated in a fixed manner to space for every function as in the prior art and the functions of integrated circuits and the functions of elements of the integrated circuits can be obtained by dynamically securing and releasing addresses along with time (clock advance) and repeating this. By this, one integrated circuit or element of an integrated circuit can have a plurality of functions, so the functional capacity can be increased without increasing the spatial volume of the integrated circuit device. Further, by employing a three-dimensional cubic structure as the structure of the integrated circuit device, the spatial volume for realizing functions can be remarkably increased. Accordingly, it becomes possible to configure a multi-functional integrated circuit device by a configuration of the minimum extent of integrated circuits.

According to the method of operation of an integrated circuit device of the present invention, integrated circuits are not allocated in a fixed manner to space for every function as in the prior art and the functions of the integrated circuits and elements of the integrated circuits can be obtained by dynamically securing and releasing addresses along with time (clock advance) and repeating this. By this, one integrated circuit or element of an integrated circuit can be given a plurality of functions, so the functional capacity can be increased without increasing the spatial volume of the integrated circuit device. Further, by employing a three-dimensional cubic structure as the structure of the integrated circuit device, the spatial volume for realizing functions can be remarkably increased. Accordingly, it becomes possible to configure a multi-functional integrated circuit device by a configuration of the minimum extent of elements or possible to configure a multi-functional integrated circuit device by a configuration of the minimum extent of integrated circuits.

According to the integrated circuit device of the present invention, the device is operated releasing all of the integrated circuits, operated releasing part of the integrated circuits, or operated releasing part and releasing all of the integrated circuits and is operated releasing all of the elements of the integrated circuits, operated releasing part of them, or operated releasing part and releasing all of them, therefore the integrated circuits are not allocated in a fixed manner to space for every function as in the prior art and the functions of the integrated circuits are obtained by dynamically securing and releasing addresses along with time (clock advance) and repeating this. By this, one integrated circuit or element of an integrated circuit can be given a plurality of functions, so it becomes possible to increase the functional capacity without increasing the spatial volume of the integrated circuit device. Further, by employing a three-dimensional cubic structure as the structure of the integrated circuit device, the spatial volume for realizing functions can be remarkably increased. Accordingly, it becomes possible to configure a multi-functional integrated circuit device by a configuration of the minimum extent of elements and by a configuration of the minimum extent of integrated circuits.

According to the method of production of an integrated circuit device of the present invention, a step of forming transistor regions for allocating addresses to either or both of magnetoresistance effect elements and resistance control elements and a step of sequentially forming either or both of magnetoresistance effect elements and resistance control elements by stacking are carried out, so the structure of an integrated circuit device of a three-dimensional cubic structure can be realized. By this, it becomes possible to remarkably increase the spatial volume of the integrated circuit device. Further, logic elements are not allocated in a fixed manner to space for every function as in the prior art. It is possible to configure integrated circuits or elements having the function of dynamically securing and releasing addresses along with time (clock advance) and repeating this. By this, it becomes for one integrated circuit or element to be given a plurality of functions, so it becomes possible to increase the functional capacity without increasing the spatial volume of the integrated circuit device. Further, there is a remarkable effect that the logic circuit functions can be extended without being limited by the exposure area of the exposure apparatus.

The architecture of the integrated circuit successively repeatedly generates and releases spaces acting as any circuit functions so as to divide in time and divide in space the functions of the elements. A logic element of the circuit function is dynamically set in function along with the advance of the clock frequency, that is, along with the elapse of the time in advance. The set state dynamically disappears after the end of its action. A memory element of the circuit function suitably dynamically sets and then eliminates addresses without spatial distinguishing between logic elements and memory elements. Namely, by not unambiguously setting specific elements with specific functions, but setting functions for any element at any time, it becomes possible to remarkably increase the spatial volume for realizing the function of dynamically securing and releasing addresses along with time (clock advance) and repeating this.

The above description will be explained more generally below.

The architecture of a representative integrated circuit of the present invention is a set of elements differing in circuit functions along with the elapse of time $t_n$ (n=0, 1, . . . , n), where the portion of the circuit functions differing along with the elapse of time $t_n$ is the entire set of the elements. Namely, the integrated circuit is configured by elements having circuit functions changing along with the elapse of time $t_n$, where the portion of the circuit functions differing along with the elapse of time $t_n$ is all of the elements.

The architecture of a second integrated circuit is a set of elements differing in circuit functions along with the elapse of time $t_n$ (n=0, 1, . . . , n), where the portion differing in circuit functions along with the elapse of time $t_n$ is a partial set of any number of elements. Namely, the integrated circuit is configured by elements having circuit functions changing along with the elapse of time $t_n$, where the portion of the circuit functions differing along with the elapse of time $t_n$ is any number of elements among all elements.

The architecture of a third integrated circuit is a set of elements differing in circuit functions along with the elapse of time $t_0, t_1, t_2, t_3, \ldots t_n$ (where, n is any integer), where the portion differing in circuit functions along with the elapse of time $t_0, t_1, t_2, t_3, \ldots t_n$ is the entire set at any elapsed time $t_k$ and is a partial set of any number of elements at any elapsed time $t_h$, (where, kγh). Namely, the integrated circuit is configured by elements changing in circuit functions along with the elapse of time $t_0, t_1, t_2, t_3, \ldots t_n$, where, when any time has passed, the portion of the circuit functions differing along with the elapse of time $t_0, t_1, t_2, t_3, \ldots t_n$ extends over all elements and, when another time has passed, the portion of the circuit functions differing along with the elapse of time $t_0, t_1, t_2, t_3, \ldots t_n$ becomes any number of elements among all elements.

Next, the architecture of the integrated circuit device of the present invention repeatedly successively generates and releases spaces acting as any circuit functions so as to divide in time and divide in space the functions of the elements. A logic circuit of the circuit function described above is dynamically set up in function along with the advance of the clock frequency in advance and dynamically disappears after the end of its action. A memory circuit of the circuit function is dynamically set in address appropriately and disappears without spatial differentiation between the logic circuit and the memory circuit. Namely, by not unambiguously setting functions for specific circuits, but setting functions for any elements at any time, it becomes possible to remarkably increase the spatial volume for realizing the function of dynamically securing and releasing addresses along with the elapse of time (clock advance) and repeating this.

The architecture of a first integrated circuit device is a set of integrated circuits differing in functions along with the elapse of time $t_0, t_1, t_2, t_3, \ldots t_x$ (where, x is any integer), where the portion differing in function along with the elapse of time $t_0, t_1, t_2, t_3, \ldots t_x$ is all of the set of the integrated circuits. Namely, the integrated circuit device is configured by integrated circuits changing in circuit functions along with the elapse of time $t_0, t_1, t_2, t_3, \ldots t_n$, where the portion differing in circuit functions along with the elapse of time $t_0, t_1, t_2, t_3, \ldots t_n$ is all of the integrated circuits. Further, the integrated circuits are configured by any of the architectures of the first to third integrated circuits explained before.

The architecture of a second integrated circuit device is a set of integrated circuits differing in function along with the elapse of time $t_0, t_1, t_2, t_3, \ldots t_x$ (where, x is any integer), the portion differing in function along with the elapse of time $t_0, t_1, t_2, t_3, \ldots t_x$ is a partial set of any number of elements. Namely, the integrated circuit device is configured by integrated circuits changing in circuit functions along with the elapse of time $t_0, t_1, t_2, t_3, \ldots t_n$, where the portion differing in circuit functions along with the elapse of time $t_0, t_1, t_2, t_3, \ldots t_n$ is any number of circuits among all of the integrated circuits. Further, the integrated circuits are configured by any of the architectures of the first to third integrated circuits explained before.

The architecture of a third integrated circuit device is a set of integrated circuits differing in function along with the elapse of time $t_0, t_1, t_2, t_3, \ldots t_x$ (where, x is any integer), where the portion differing in functions along with the elapse of time $t_0, t_1, t_2, t_3, \ldots t_f$ is the entire set at any elapsed time $t_k$ and is a partial set of any number of circuits at any elapsed time $t_g$ (where, fγg). Namely, the integrated circuit device is configured by integrated circuits changing in circuit functions along with the elapse of time $t_0, t_1, t_2, t_3, \ldots t_n$, where the portion differing in circuit functions along with the elapse of time $t_0, t_1, t_2, t_3, \ldots t_n$ is all of the integrated circuits at any elapsed time and the portion differing in circuit functions along with the elapse of time $t_0, t_1, t_2, t_3, \ldots t_n$ is any number of circuits among all integrated circuits at another elapsed time. Further, the integrated circuits are configured by any of the architectures of the first to third integrated circuits explained before.

It is also possible to use the architectures of the first to third integrated circuits alone or appropriately combine them with the architectures of the first to third integrated circuit devices for use. Namely, in the elapse of time $T_1, T_2, T_3, \ldots T_m$, at any elapsed time $T_q$ (at $T_q$, the elapse of the further divided elapse of time $t_0, t_1, t_2, t_3, \ldots t_n$), any of the architectures of the first to third integrated circuits can be used. Alternatively, it is also possible to use the architecture of the first integrated circuit by appropriately combining it with the architectures of the first to third integrated circuits. Alternatively, it is also possible to use the architecture of the second integrated circuit by appropriately combining the same with the architectures of the first to third integrated circuits. Alternatively, it is also possible to use the architecture of the third integrated circuit by appropriately combining the same with the architectures of the first to third integrated circuits.

Next, an explanation will be given of the method of operation of the first integrated circuit of the present invention by FIG. 34A.

As shown in FIG. 34A, first, addresses are allocated to individual elements configuring a set "A" of elements. Next, an address is designated for a scheduled region for setting a circuit function so as to generate a circuit function region of a plurality of "Bi" (where, i=1, 2, 3, . . . ) designated in addresses in "A". By doing this, a first stage of generating a space where a "B" region acts as any circuit function is carried out. The above circuit function region is represented by the following relation:

$$A\rho(B=\Sigma Bi) \text{ (where}, i=1, 2, 3, \ldots )$$

It is possible that the partial sets "Bi" in the "B" region of the first stage comprise "Bip" spaces acting as logic circuit functions and "Biq" spaces acting as memory circuit functions as represented by $B=\Sigma Bi=\Sigma Bip+\Sigma Biq$ (where, ip=1, 2, 3, ..., iq=1, 2, 3, ..., and $ip+iq \leq i$).

Alternatively, it is also possible to constitute a space wherein all of the partial sets "Bi" in the "B" region of the first stage act as logic circuit functions.

Alternatively, it is also possible to constitute a space wherein all of the partial sets "Bi" in the "B" region of the first stage act as memory circuit functions.

Then, after performing the arithmetic processing and information processing by using "Bi", the address of the circuit function of the entire region "B" constituted by "Bi" (where, i=1, 2, 3, ...) is released.

Next, by designating an address for a scheduled region for setting the circuit function, a circuit function region of a plurality of "Cj" (where, j=1, 2, 3, ...) designated in addresses in "A" is generated. By doing this, a second stage of generating a space wherein a "C" region acts as any circuit function is carried out. The circuit function region is represented by the following relation:

$$A\rho(C=\Sigma Cj) \text{ (where, } j=1, 2, 3, \ldots)$$

It is possible that partial sets "Cj" in the "C" region of the second stage comprise "Cjr" spaces acting as the logic circuit functions and "Cjs" spaces acting as the memory circuit functions as represented by $$C=\Sigma Cj=\Sigma Cjr+\Sigma Cjs \text{ (where, } jr=1, 2, 3, \ldots, js=1, 2, 3, \ldots, \text{ and } jr+js \leq j).$$

Alternatively, it is also possible to constitute a space wherein all of the partial sets "Cj" in the "C" region of the second stage act as logic circuit functions.

Alternatively, it is also possible to constitute a space wherein all of the partial sets "Cj" in the "C" region of the second stage act as memory circuit functions.

Then, after performing the arithmetic processing and the information processing by using "Cj", the address of the circuit function of the entire region "C" constituted by "Cj" (where, j=1, 2, 3, ...) is released.

Next, by designating an address for a scheduled region for setting the circuit function, a circuit function region of a plurality of "Dk" (where, k=1, 2, 3, ...) designated in addresses in "A" is generated. By doing this, a third stage of generating a space wherein the "D" region acts as any circuit function is carried out. The circuit function region is represented by the following relation:

$$A\rho(D=\Sigma Dk) \text{ (where, } k=1, 2, 3, \ldots)$$

It is possible that partial sets "Cj" in the "C" region of the third stage comprise "Dkt" spaces acting as the logic circuit functions and "Dku" spaces acting as the memory circuit functions as represented by $$D=\Sigma Dk=\Sigma Dkt+\Sigma Dku \text{ (where, } kt=1, 2, 3, \ldots, ku=1, 2, 3, \ldots, \text{ and } kt+ku \leq k).$$

Alternatively, it is also possible to constitute a space wherein all of the partial sets "Dk" in the "D" region of the third stage act as logic circuit functions.

Alternatively, it is also possible to constitute a space wherein all of the partial sets "Dk" in the "D" region of the third stage act as memory circuit functions.

Then, after performing the arithmetic processing and the information processing by using the "Dk", the address of the circuit function of the entire region "D" constituted by "Dk" (where, k=1, 2, 3, ...) is released.

Further, by similarly performing the fourth stage, fifth stage, and further n-th stage (where, n=1, 2, 3, ...) in order to repeatedly successively generate and release spaces acting as any circuit functions, the functions of the elements can be used divided in time.

Figure 35:
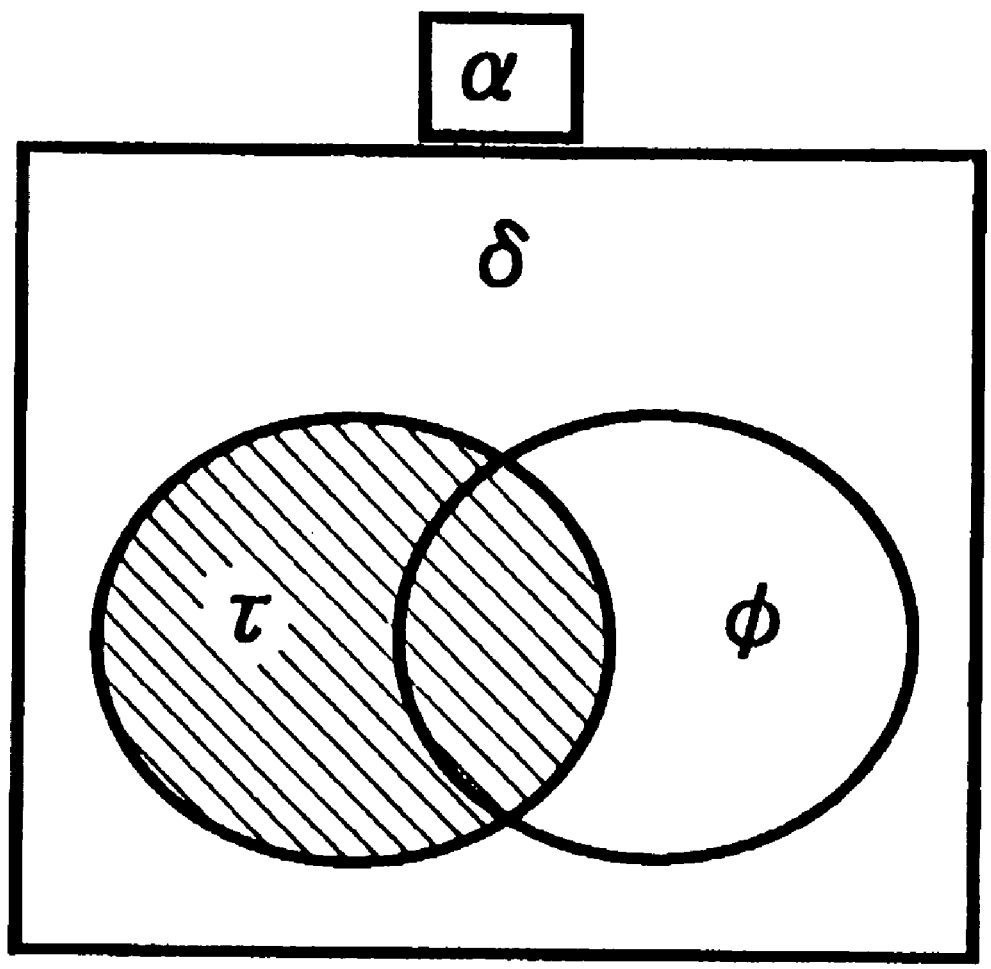
FIG. 35 is a view for explaining a circuit configuration and mode of usage in a semiconductor integrated circuit device as a second aspect of the present invention.

Next, an explanation will be given of the method of operation of the second integrated circuit of the present invention by FIG. 34B and FIG. 35.

As shown in FIG. 34B, by designating an address for any region of the set "α" of elements to which addresses are allocated in advance, a first circuit function formation scheduled region of the partial sets "βi" (where, i=1, 2, 3, ...) of "α" is generated. By doing this, the first stage of generating a space wherein the "βi" region acts as any circuit function is carried out. The first circuit function formation scheduled region is represented by the following relation:

$$\alpha\rho(\beta=\Sigma\beta i) \text{ (where, } i=1, 2, 3, \ldots)$$

Here, the partial sets "βi" in the "β" region comprise "βip" spaces acting as the logic circuit functions and "βiq" spaces acting as the memory circuit functions. This space is represented by the following relation:

$$\beta=\Sigma\beta i=\Sigma\beta ip+\Sigma\beta iq \text{ (where, } ip=1, 2, 3, \ldots, iq=1, 2, 3, \ldots, \text{ and } ip+iq \leq i)$$

Alternatively, it is also possible to constitute a space wherein all of the partial sets "βi" in the "β" region act as logic circuit functions.

Alternatively, it is also possible to constitute a space wherein all of the partial sets "βi" in the "β" region act as memory circuit functions.

Here, each "βi" region is a functional group constituted by basic logic circuits or a group providing a memory function as will be explained later. The logic function of a "βi" is a basic logic element such as an AND circuit or OR circuit at the minimum. Alternatively, it is a memory element for storing the minimum bits. Alternatively, in the logic function of "βi", it may be also a functional unit for realizing a desired object too, for example, an image processing micro-unit, an audio processing micro-unit, an analog/digital conversion micro-unit, or a digital/analog conversion micro-unit. Alternatively, the memory function of "βi" may be also a functional unit such as a cache memory or a buffer memory.

Next, after using the logic circuit functions and memory circuit functions of "βi" (where, i=1, 2, 3, ...), the address is released. It is possible to release the address for the entire region of the logic circuit functions and memory circuit functions of "β" or in the logic circuit function and memory circuit function regions for part of "βi" (where, i=1, 2, 3, ...) in the "β" region. The region where an address is not designated at this stage is "τ4δ" constituted by the region "τ" released from "β" shown in FIG. 2 and the region "δ" of a complementary set of "β". In this region of "τ4δ", a new circuit function formation scheduled region "ε" is formed. "ε" is constituted by a plurality of circuit function formation scheduled regions. As shown in (b) of FIG. 1, a second circuit function formation scheduled region constituted by the region "ε" and a "φ" (φ$\bar{\beta}$) region remaining not released from "β" is generated. By doing this, a second stage for generating a space wherein the "ε4φ" region acts as any circuit function is carried out. The second circuit function formation scheduled region can be represented by the following relation:

$$(\epsilon 4\phi=\Sigma\lambda j)\bar{\alpha} \text{ (where, } j=1, 2, 3, \ldots)$$

Here, the partial sets "λj" in the "ε4φ" region comprise "λjr" spaces acting as logic circuit functions and "λjs"

spaces acting as memory circuit functions. This constitution can be represented by the following relation:

$$\epsilon 4\phi = \Sigma \lambda j = \Sigma \lambda jr + \Sigma \lambda js \text{ (where, } jr=1, 2, 3, \ldots, js=1, 2, 3, \ldots, \text{ and } jr+js \leq j)$$

Alternatively, it is also possible to constitute a space wherein all of the partial sets "λi" in the "ε4φ" region act as logic circuit functions.

Alternatively, it is also possible to constitute a space wherein all of the partial sets "λi" in the "ε4φ" region act as memory circuit functions.

Here, "ε" performs arithmetic processing independently from or linked with the region "φ" whose address is not released from the "β" region and remains.

Next, after using the logic circuit functions and the memory circuit functions of "λj" (where, j=1, 2, 3, . . . ), the addresses of "λj" comprising "ε4φ" are released. The addresses can be released for the entire region of the logic circuit function and the memory circuit function of "ε4φ" or for the logic circuit function and memory circuit function region for part of "λj" (where, j=1, 2, 3, . . . ) in the "ε4φ" region.

Next, a third circuit function formation scheduled region constituted by a region "ξ" comprised by a region released from "ε4φ", a region "η" of the complementary set of "ε4φ", and "γ" (where, $\gamma \bar{\epsilon}$) and "ρ" (where, $\rho \bar{\alpha}$) regions not released from "ε4φ" and remaining is generated. By doing this, a third stage of generating a space wherein the "ξ4γ4ρ" region acts as any circuit function is carried out. The third circuit function formation scheduled region is represented by the following relation:

$$(\xi 4\gamma 4\rho = \Sigma \zeta m)\bar{\alpha} \text{ (where, } k=1, 2, 3, \ldots)$$

The partial sets "ζk" in the "ξ4γ4ρ" region comprise "ζkt" spaces acting as logic circuit functions and "ζku" spaces acting as memory circuit functions. This constitution can be represented by the following relation:

$$\xi 4\gamma 4\rho = \Sigma \zeta k = \Sigma \zeta kt + \Sigma \zeta ku$$

(where, $kt=1, 2, 3, \ldots, ku=1, 2, 3, \ldots$, and $kt+ku \leq k$)

Alternatively, it is also possible to constitute a space wherein all of the partial sets "ζk" in the "ξ4γ4ρ" region act as logic circuit functions.

Alternatively, it is also possible to constitute a space wherein all of the partial sets "ζk" in the "ξ4γ4ρ" region act as memory circuit functions.

"ξ" performs arithmetic processing independently from or linked with the region "φ" whose address is not released from the "β" region and remains and the region "γ" whose address is not released from the "ε" region and remains.

Further, by similarly performing the fourth stage, the fifth stage, and further the n-th stage (where, n=1, 2, 3, . . . ) to repeatedly successively generate and release spaces acting as the logic circuit function and memory circuit function or spaces acting as the logic circuit function or the memory circuit function, the functions of the elements can be used divided in time.

Next, an explanation will be given of the method of operation of the third integrated circuit of the present invention by FIG. 34C.

As shown in FIG. 34C, by designating an address for any region of the set "Λ" of elements to which addresses are allocated in advance, a first circuit function formation scheduled region of the partial sets "φi" (where, i=1, 2, 3, . . . ) of "Λ" is generated. By doing this, a first stage for generating a space wherein the "φ" region acts as any circuit function is carried out. The first circuit function formation scheduled region is represented by the following relation:

$$\Lambda \rho(\phi = \Sigma \phi i) \text{ (where, } i=1, 2, 3, \ldots)$$

The partial sets "φi" in the "Λ" region of the first stage comprise "φip" spaces acting as logic circuit functions and "φiq" spaces acting as memory circuit functions as represented by $\phi = \Sigma \phi i = \Sigma \phi ip + \Sigma \phi iq$ (where, ip=1, 2, 3, . . . , iq=1, 2, 3, . . . , and ip+iq ≤ i).

Alternatively, it is also possible to constitute a space wherein all of the partial sets "φi" in the "φ" region of the first stage act as logic circuit functions.

Alternatively, it is also possible to constitute a space wherein all of the partial sets "φi" in the "φ" region of the first stage act as memory circuit functions.

Then, after performing the arithmetic processing and the information processing by using the above "φi", the address of the circuit function of the entire region "φ" constituted by "φi" (where, i=1, 2, 3, . . . ) is released.

Next, by designating an address for the scheduled region for setting the circuit functions, a circuit function region of a plurality of "ψj" (where, j=1, 2, 3, . . . ) designated in addresses in "Λ" is generated. By doing this, a second stage for generating a space wherein the "ψ" region acts as any circuit function is carried out. This circuit function region is represented by the following relation:

$$\Lambda \rho(\psi = \Sigma \psi j) \text{ (where, } j=1, 2, 3, \ldots)$$

The partial sets "ψj" in the "ψ" region comprise "ψjr" spaces acting as logic circuit functions and "ψjs" spaces acting as memory circuit functions as represented by $\psi = \Sigma \psi j = \Sigma \psi jr + \Sigma \psi js$ (where, jr=1, 2, 3, . . . , js=1, 2, 3, . . . , and jr+js ≤ j).

Alternatively, it is also possible to constitute a space wherein all of the partial sets "ψj" in the "ψ" region of the second stage act as the logic circuit functions.

Alternatively, it is also possible to constitute a space wherein all of the partial sets "ψj" in the "ψ" region of the second stage act as memory circuit functions.

Then, after performing the arithmetic processing and the information processing by using "ψj", the address of the circuit function of the entire region "ψ" constituted by "ψj" (where, j=1, 2, 3, . . . ) or the circuit function according to part of "ψj" (where, j=1, 2, 3, . . . ) in the "ψ" region is released.

Next, a region "Θ" comprised by a region released from "ψ" and the region "Λ" of the complementary set of "ψ" and a "Ω" (where, $\Omega \bar{\psi}$) region which is not released from "ψ" and remains are generated. By doing this, a third stage for generating a space wherein the "Θ4 Ω" region acts as any circuit function is carried out. The circuit function region is represented by the following relation:

$$(\theta 4 \, \Omega = \Sigma Yk)\bar{\Lambda} \text{ (where, } k=1, 2, 3, \ldots)$$

The partial sets "Yk" in the "θ4 Ω" region of the third stage comprise "Ykt" spaces acting as logic circuit functions and "Yks" spaces acting as memory circuit functions as represented by θ4 Ω=ΣYk=ΣYkr+ΣYks (where, kr=1, 2, 3, . . . , ks=1, 2, 3, . . . , and kr+ks ≤ k).

Alternatively, it is also possible to constitute a space wherein all of the partial sets "Yk" in the "θ4 Ω" region of the third stage act as logic circuit functions.

Alternatively, it is also possible to constitute a space wherein all of the partial sets "Yk" in the "θ4 Ω" region of the third stage act as memory circuit functions.

By similarly continuously or alternately repeating the second stage and the third stage appropriately and performing the n-th stage (where, n=1, 2, 3, . . . ) to repeatedly successively generate and release spaces acting as any circuit function, the functions of the elements can be used divided in time.

The logic circuit function in the methods of operation of the first to third integrated circuits explained above is comprised by at least one type of function among an integer operation function, floating point operation function, image processing operation function, audio processing operation function, analog/digital conversion function, digital/analog conversion function, input/output function, pipeline processing function, and VLIW (very long instruction word) processing function. Further, the memory circuit function is comprised by at least one type of function of a cache memory function, a primary cache memory function, a secondary cache memory function, a buffer memory function, a main memory function, a nonvolatile memory function, a data temporary storage function for eliminating dependency and an instruction temporary storage function for eliminating dependency.

On the other hand, in a conventional memory element, in general, during execution of the program, the memory space is secured according to need. When it becomes unnecessary, the memory space is released. These functions correspond to the memory region into which the data can be written or from which the data can be read being appropriately set. In the prior art, a memory element is allocated an address. On the other hand, a logic element, which is a functional element other than a memory element, cannot be allocated an address since it uses MOS transistors of a two-dimensional structure. Accordingly, it is essential to spatially divide the logic element and the circuit function using the logic element for every function. In the architectures of the integrated circuits explained above, an address is not allocated to the logic element and the circuit function per se using a logic element as in the prior art. For the function of a logic element, the address is dynamically secured and released along with the elapse of time (clock advance) and this repeated. By this, it becomes possible to remarkably increase the spatial volume for realizing the logical function and the memory function using the three-dimensional cubic structure of the structure of the integrated circuit device.

Next, an explanation will be given of the method of operation of the first integrated circuit device of the present invention by FIG. 36A.

As shown in FIG. 36A, first addresses are allocated to individual integrated circuits configuring a set "$Y_A$" of integrated circuits. Next, by designating an address for the scheduled region for forming the integrated circuit functions, an integrated circuit function circuit of a plurality of "$Y_B i$" (where, i=1, 2, 3, . . . ) whose addresses are designated among the "$Y_A$" is generated. By doing this, a first stage of generating a space wherein the "$Y_B$" region acts as any integrated circuit function region is carried out. The integrated circuit function region is represented by the following relation:

$$Y_A \rho(Y_B = \Sigma Y_B i) \text{ (where, } i=1, 2, 3, \ldots )$$

After performing the arithmetic processing and the information processing by using the partial sets "$Y_B i$" in the integrated circuit region of "$Y_B$" of the first stage, the address of the integrated circuit function of the entire integrated circuit region "$Y_B$" constituted by "$Y_B i$" (where, i=1, 2, 3, . . . ) is released Next, by designating the address for the scheduled region for setting the integrated circuit function, an integrated circuit function region of a plurality of "$Y_C j$" (where, j=1, 2, 3, . . . ) designated in address among "$Y_A$" is generated. By doing this, a second stage for generating a space wherein the "$Y_C$" region acts as any integrated circuit region is carried out. This integrated circuit function region is represented by the following relation:

$$Y_A \rho(Y_C = \Sigma Y_C j) \text{ (where, } j=1, 2, 3, \ldots )$$

After performing the arithmetic processing and the information processing by using the partial sets "$Y_C j$" in the integrated circuit region of "$Y_C$" of the second stage, the address of the integrated circuit function of the entire integrated circuit region "$Y_C$" constituted by "$Y_C j$" (where, j=1, 2, 3, . . . ) is released.

Next, by designating an address for the scheduled region for setting the integrated circuit function, an integrated circuit function region of a plurality of "$Y_D k$" (where, k=1, 2, 3, . . . ) designated in address among "$Y_A$" is generated. By doing this, a third stage for generating a space wherein the "$Y_D$" region acts as any integrated circuit region is carried out. This integrated circuit function region is represented by the following relation:

$$Y_A \rho(Y_D = \tau Y_D k) \text{ (where, } k=1, 2, 3, \ldots )$$

After performing the arithmetic processing and the information processing by using the partial sets "$Y_D k$" in the integrated circuit region of "$Y_D$" of the third stage, the address of the integrated circuit function of the entire integrated circuit region "$Y_D$" constituted by "$Y_D k$" (where, k=1, 2, 3, . . . ) is released.

Further, by similarly sequentially performing the fourth stage, the fifth stage, and further the n-th stage (where, n=1, 2, 3, . . . ) to repeatedly successively generate and release spaces acting as any circuit function, the functions of the elements can be used divided in time.

Figure 37:
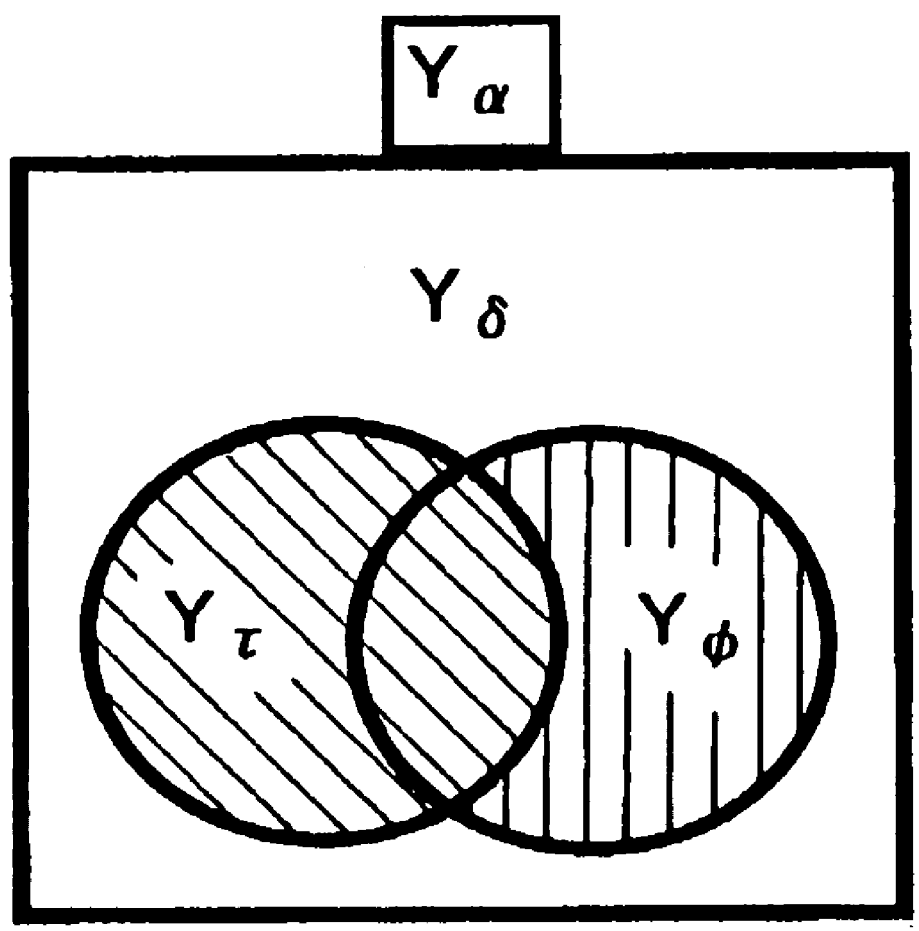
FIG. 37 is a view for explaining a circuit configuration and a mode of usage in a semiconductor integrated circuit device as a fourth aspect of the present invention.
Figure 38:
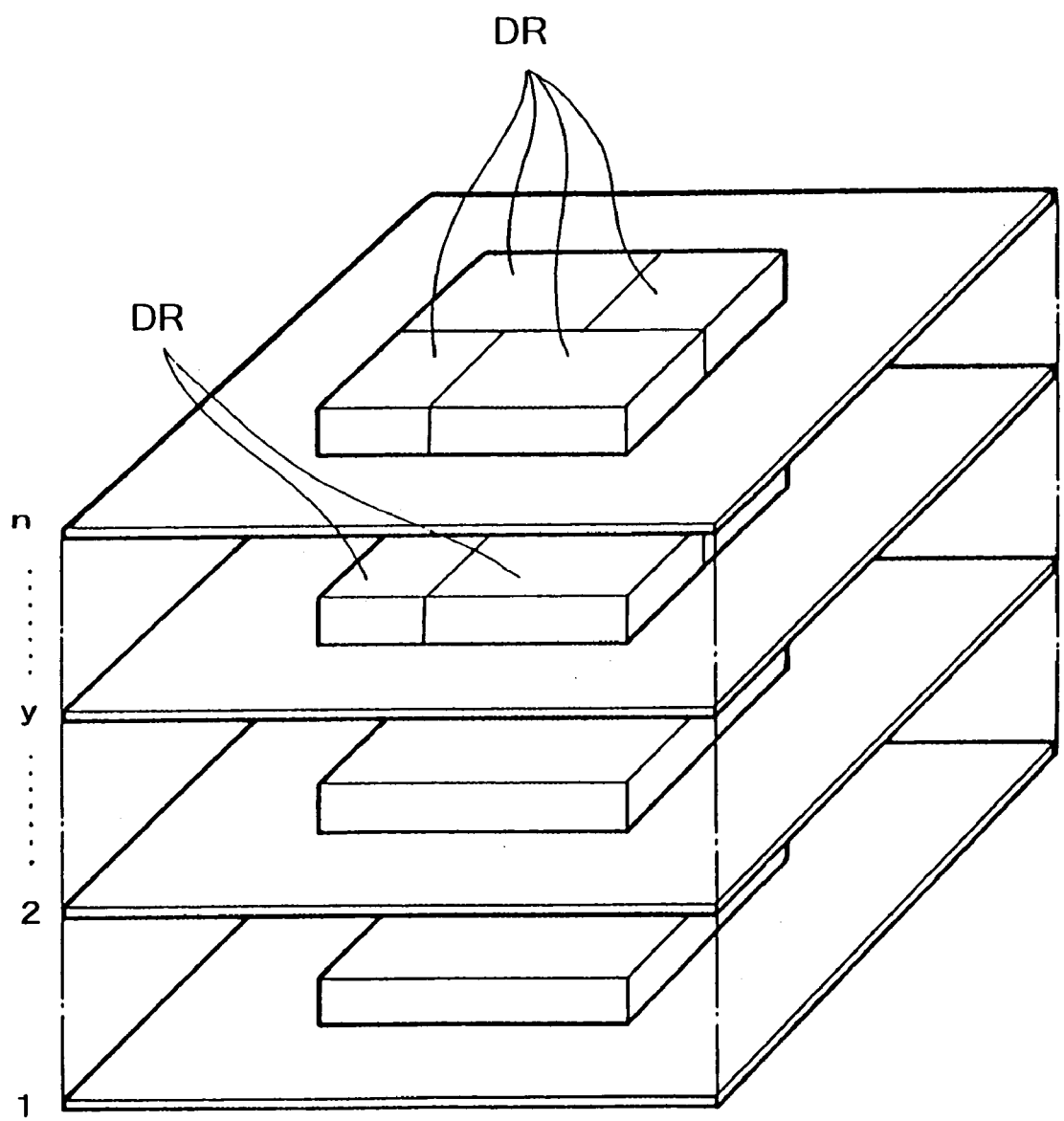
FIG. 38 is a view for explaining the circuit configurations and the modes of usage in the semiconductor integrated circuit devices in the first to fourth aspects of the present invention.

Next, an explanation will be given of the method of operation of the second integrated circuit device of the present invention by FIG. 36B and FIG. 37.

As shown in FIG. 36B, by designating an address for any region of the set "$Y_\alpha$" of integrated circuits to which addresses are allocated in advance, a first integrated circuit function formation scheduled region of the partial sets "$Y_\alpha i$" (where, i=1, 2, 3, . . . ) of "$Y_\alpha$" is generated. By doing this, a first stage of generating a space wherein the "$Y_\alpha i$" regions act as any integrated circuit function is carried out. This first integrated circuit function formation scheduled region is represented by the following relation:

$$Y_\alpha \rho(Y_\beta = \Sigma Y_\beta i) \text{ (where, } i=1, 2, 3, \ldots )$$

After performing the arithmetic processing and the information processing by using the partial sets "$Y_\alpha i$" in the integrated circuit function formation scheduled region of "$Y_\alpha$" of the first stage, the address is released. The address may be released for the entire integrated circuit function formation scheduled region of "$Y_\beta$" or for the integrated circuit regions relating to part of the "$Y_\beta i$" (where, i=1, 2, 3, . . . ) in the integrated circuit region of "$Y_\alpha$". The integrated circuit region not designated in address at this stage is "$Y_\tau 4 Y_\delta$" constituted by the integrated circuit region "$Y_\tau$" released from "$Y_\alpha$" shown in FIG. 4 and the integrated circuit region "$Y_\delta$" of the complementary set of "$Y_\beta$". In this integrated circuit region of "$Y_\tau 4 Y_\delta$", a new integrated circuit function formation scheduled region "$Y_\epsilon$" is formed. "$Y_\epsilon$" is constituted by a plurality of integrated circuit function formation scheduled regions. As shown in FIG. 36B, a second integrated circuit function formation scheduled region constituted by an integrated circuit region "$Y_\epsilon$" and an integrated circuit region "$Y_\phi$" (where, $(Y_\phi \overline{Y}_\alpha)$ which is not released from "$Y_\alpha$" and remains is generated. By doing this, a second stage for generating a space wherein the integrated circuit region of "$Y_\epsilon \overline{Y}_\phi$" acts as any integrated circuit function is carried out. This second integrated circuit function formation scheduled region can be represented by the following relation:

$$(Y_\epsilon 4 Y_\phi = \Sigma Y_\epsilon j \overline{Y}_\alpha) \text{ (where, } j=1, 2, 3, \ldots)$$

Here, "$Y_\epsilon$" performs the arithmetic processing independently from or linked with the region "$Y_\phi$" whose address is not released from the integrated circuit region of "$Y_\alpha$" and remains.

After performing the arithmetic processing and the information processing by using the partial sets "$Y_\epsilon j$" in the integrated circuit region of "$Y_\epsilon 4Y_\phi$" of the second stage, the addresses of "$Y_\epsilon j$" composing "$Y_\epsilon 4Y_\phi$" are released. It is possible to release the address of the entire integrated circuit region of the integrated circuit function of "$Y_\epsilon 4Y_\phi$" or to release the addresses in the integrated circuit function regions relating to part of the "$Y_\lambda j$" (where, $j=1, 2, 3, \ldots$) in the integrated circuit region of "$Y_\epsilon 4Y_\phi$".

Next, a third integrated circuit function formation scheduled region constituted by an integrated circuit region "$Y_\xi$" comprised of an integrated circuit region released from "$Y_\epsilon 4Y_\phi$" and the integrated circuit region "$Y_\eta$" of the complementary set of "$Y_\epsilon 4Y_\phi$" and an integrated circuit region of "$Y_\gamma$" (where, "$Y_\gamma \overline{Y}_\epsilon$") which is not released from "$Y_\epsilon 4Y_\phi$" and remains and "$Y_\rho$" (where, $Y_\rho \overline{Y}_\alpha$) is generated. By doing this, a third stage for generating a space wherein the integrated circuit region of "$Y_\xi 4 Y_\gamma 4 Y_\rho$" acts as any integrated circuit function is carried out. This third integrated circuit function formation scheduled region is represented by the following relation:

$$(Y_\xi 4 Y_\gamma 4 Y_\rho = \Sigma Y_{\xi m}) \overline{Y}_\alpha) \text{ (where, } m=1, 2, 3, \ldots)$$

Here, "$Y_\xi$" performs the arithmetic processing independently from or linked with the integrated circuit region "$Y_\phi$" whose address is not released from the integrated circuit region of "$Y_\alpha$" and remains and the integrated circuit region "$Y_\gamma$" whose address is not released from the integrated circuit region "$Y_\epsilon$" and remains.

Further, by similarly sequentially performing the fourth stage, the fifth stage, and further the n-th stage (where, $n=1, 2, 3, \ldots$) to repeatedly successively generate and release the spaces acting as any circuit functions, the functions of the elements can be used divided in time.

Next, an explanation will be given of the method of operation of the third integrated circuit device of the present invention by FIG. 36C.

Figure 36C:
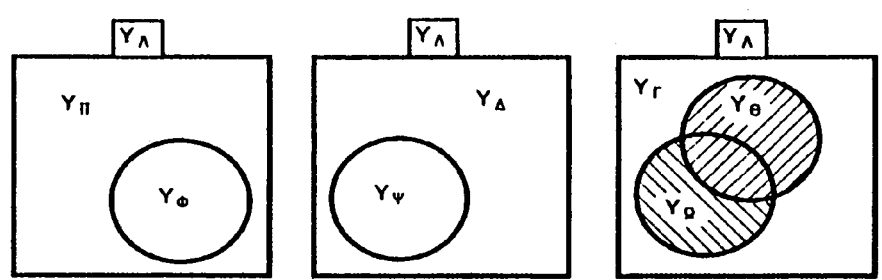

As shown in FIG. 36C, by designating an address for any integrated circuit region of the set "$Y_\Lambda$" of the integrated circuits to which addresses are allocated in advance, a first integrated circuit function formation scheduled region of the partial sets "$Y_\phi i$" (where, $i=1, 2, 3, \ldots$) of integrated circuits of "$Y_\Lambda$" is generated. By doing this, a first stage for generating a space wherein the integrated circuit region of "$Y_\phi$" acts as any integrated circuit function is carried out. This first integrated circuit function formation scheduled region is represented by the following relation:

$$Y_\Lambda \rho(Y_\phi = \Sigma Y_\phi i) \text{ (where, } i=1, 2, 3, \ldots)$$

After performing the arithmetic processing and the information processing by using the partial sets "$Y_\phi i$" in the integrated circuit region of "$Y_\phi$" of the first stage, the address of the integrated circuit function of the entire integrated circuit region "$Y_\phi$" comprised by "$Y_\phi i$" (where, $i=1, 2, 3, \ldots$) is released.

Next, by designating an address for the scheduled region for setting the integrated circuit function, an integrated circuit function region of a plurality of "$Y_\psi j$" (where, $j=1, 2, 3, \ldots$) whose addresses are designated among "$Y_\Lambda$" is generated. By doing this, a second stage for generating a space wherein the integrated circuit region of "$Y_\psi$" acts as any integrated circuit function is carried out. This integrated circuit function region is represented by the following relation:

$$Y_\Lambda \rho(Y_\psi = \Sigma Y_\psi j) \text{ (where, } j=1, 2, 3, \ldots)$$

After performing the arithmetic processing and the information processing by using the partial sets "$Y_\psi j$" in the integrated circuit region of "$Y_\psi$" of the second stage, the address of the integrated circuit function of the entire integrated circuit region "$Y_\psi$" comprised by "$Y_\psi j$" (where, $j=1, 2, 3, \ldots$) or the integrated circuit function of part of "$Y_\psi j$" (where, $j=1, 2, 3, \ldots$) in the integrated circuit region of "$Y_\psi$" is released.

Next, an integrated circuit region constituted by an integrated circuit region "$Y_\theta$" comprised of an integrated circuit region released from "$Y_\psi$" and the integrated circuit region "$Y_\Lambda$" of the complementary set of "$Y_\psi$" and an integrated circuit region of "$Y_\Omega$" (where, $Y_\Omega \overline{Y}_\psi$) which is not released from "$Y_\psi$" and remains is generated. By doing this, a third stage for generating a space wherein the integrated circuit region of "$Y_\theta 4 Y_\Omega$" acts as any integrated circuit function is carried out. This integrated circuit function region is represented by the following relation:

$$(Y_\theta 4 Y_\Omega = \Sigma Y_\gamma k) \overline{Y}_\Lambda \text{ (where, } k=1, 2, 3, \ldots)$$

The arithmetic processing and the information processing are carried out by using the partial sets "$Y_\gamma k$" in the integrated circuit region of "$Y_\gamma$" of the third stage.

By continuously or alternately repeating the fourth stage and the fifth stage appropriately and performing the n-th stage (where, $n=1, 2, 3, \ldots$) to repeatedly successively generate and release the spaces acting as any integrated circuit function, the functions of the elements can be used divided in time.

It is possible to use these methods of operation of the first to third integrated circuits alone and possible to appropriately combine them with the methods of operation of the first to third integrated circuit devices. Namely, in the elapse of time $T_1, T_2, T_3, \ldots T_m$, at any elapsed time $T_q$ (at $T_q$, the elapse of the further divided elapse of time $t_0, t_1, t_2, t_3, \ldots t_n$), any of the methods of operation of the first to third integrated circuits can be used. Alternatively, it is also possible to use the method of operation of the first integrated circuit by appropriately combining it with the methods of operation of the first to third integrated circuits. Alternatively, it is also possible to use the method of operation of the second integrated circuit by appropriately combining it with the methods of operation of the first to third integrated circuits. Alternatively, it is also possible to use the method of operation of the third integrated circuit by appropriately combining it with the methods of operation of the first to third integrated circuits.

The first integrated circuit device of the present invention is an integrated circuit device configured by a plurality of elements. In this first integrated circuit device, at the first stage, by designating an address expressed by $A\rho(\Sigma=SBi)$ (where, $i=1, 2, 3, \ldots$) for any region of the set "A" of the elements to which addresses are allocated in advance, partial sets of "A", that is, "Bi" (where, $i=1, 2, 3, \ldots$) regions, are generated to thereby generate a space wherein the "B" region acts as any circuit function. Next, in the second stage, after using any circuit function of "Bi" (where, i=1, 2, 3, . . . ) the address of the circuit function of the entire region "B" of "Bi" (where, i=1, 2, 3, . . . ) is released, and "Cj" (where, j=1, 2, 3, . . . ) regions, which are partial sets of "A", represented by $A\rho(C=\Sigma Cj)$ (where, j=1, 2, 3, . . . ) are generated, thereby to generate a space wherein the "C" region acts as any circuit function. Next, in the third stage, after using the circuit function of "Cj" (where, j=1, 2, 3, . . . ), the address of the circuit function of the entire region "C" of Cj (where, j=1, 2, 3, . . . ) is released, and a "Dk" (where, k=1, 2, 3, . . . ) region which is the partial set of "A" represented by $A\rho(D=\Sigma Dk)$ (where, k=1, 2, 3, . . . ) is generated to thereby generate a space wherein the "D" region acts as any circuit function. Further, by similarly performing the fourth stage, the fifth stage, and further the n-th (where, n=1, 2, 3, . . . ) stage, it is possible to repeatedly successively generate and release spaces acting as any circuit function, and the functions of the elements can be used divided in time and divided in space.

A second integrated circuit device of the present invention is an integrated circuit device configured by a plurality of elements. This second integrated circuit device generates, in the first stage, a partial set "βi" (where, i=1, 2, 3, . . . ) region of "α" by designating an address represented by $\alpha\rho(\beta=\Sigma\beta i)$ (where, i=1, 2, 3, . . . ) for any region of the set "α" of the elements to which addresses are allocated in advance, and thereby generates a space wherein the "β" region acts as any circuit function. Next, in the second stage, after using any circuit function of "βi" (where, i=1, 2, 3, . . . ), the address of the circuit function of the entire region "β" of "βi" (where, i=1, 2, 3, . . . ) or the circuit function relating to part of "βi" (where, i=1, 2, 3, . . . ) in the "β" region is released, a region represented by $(\epsilon 4\phi=\Sigma\lambda j)\overline{\alpha}$ (where, j=1, 2, 3, . . . ) and constituted by a region "ε" comprised by a region released from "α" and the region "δ" of the complementary set of "α" and the "φ" (where, $\phi\overline{\alpha}$) region which is not released from "α" and remains is generated, thereby to generate a space wherein the "ε4φ" region acts as any circuit function. Next, in the third stage, after using the circuit functions of "λj" (where, j=1, 2, 3, . . . ), the addresses of the circuit functions of the entire region "ε4φ" of "λj" (where, j=1, 2, 3, . . . ) or the circuit functions relating to part of the "λj" (where, j=1, 2, 3, . . . ) in the "ε4φ" region are released, a region represented by $(\xi 4\gamma 4\rho=\Sigma\zeta k)\overline{\alpha}$ (where, k=1, 2, 3, . . . ) and constituted by the region "ξ" comprised by the region released from "ε4φ", and the region "η" of the complementary set of "ε4φ", and "γ" (where, $\gamma\overline{\epsilon}$) which is not released from "ε4φ" and remains and "ρ" (where, $\rho\overline{\alpha}$) regions is generated, to thereby generate a space wherein the "ξ4γ4ρ" region acts as any circuit function. Further, by similarly performing the fourth stage, the fifth stage, and further the n-th (where, n=1, 2, 3, . . . ) stage, it is possible to successively generate and release spaces acting as any circuit function, whereby the functions of the elements function divided in time and space.

A third integrated circuit device of the present invention is an integrated circuit device configured by a plurality of elements. This third integrated circuit device generates, in the first stage, partial set "φi" (where, i=1, 2, 3, . . . ) regions of "Λ" by designating an address represented by $\Lambda\rho(\phi=\Sigma\phi i)$ (where, i=1, 2, 3, . . . ) for any region of the set "Λ" of the elements to which the addresses are allocated in advance, to thereby generate a space wherein the "φ" region acts as any circuit function. Next, in the second stage, after using any circuit function of "φi" (where, i=1, 2, 3, . . . ), the address of the circuit function of the entire region "φ" of "φi" (where, i=1, 2, 3, . . . ) is released, a "ψj" (where, j=1, 2, 3, . . . ) region which is the partial set of "Λ" represented by $\Lambda\rho(\psi=\Sigma\psi j)$ (where, j=1, 2, 3, . . . ) is generated, and thereby a space wherein the "ψ" region acts as any circuit function is generated. Next, in the third stage, after using the circuit function of "ψj" (where, j=1, 2, 3, . . . ), the addresses of the circuit function of the entire region "ψ" of "ψj" (where, j=1, 2, 3, . . . ), or the circuit function according to part of "ψj" (where, j=1, 2, 3, . . . ) in the "ψ" region are released, a region represented by $(\Theta 4\Omega=\Sigma Yk)$ $\overline{\Lambda}$ (where, k=1, 2, 3, . . . ), and constituted by the region "Θ" comprised by a region released from "ψ" and the region "Λ" of the complementary set of "ψ" and the "Ω" (where, $\Omega\overline{\psi}$) region which is not released from "ψ" and remains is generated, thereby to generate a space wherein the "Θ4Ω" region acts as any circuit function. Further, by similarly continuously or alternately repeating the second stage and the third stage appropriately and performing the n-th stage (where, n=1, 2, 3, . . . ) to repeatedly successively generate and release the space acting as any circuit function, the functions of the elements can be used divided in time and divided in space.

A fourth integrated circuit device of the present invention is provided with x number of integrated circuits. A y-th $(1 \leq y \leq x)$ integrated circuit among the x number of integrated circuits is provided with the same integrated circuit function or different integrated circuit function and exchanges data or instructions or data and instructions with the integrated circuits. This fourth integrated circuit device, in the first stage, designates an address represented by $(Y_B=\Sigma Y_B i)$ $\overline{Y}_A$ (where, i=1, 2, 3, . . . ) for any integrated circuit of the set "$Y_A$" of the integrated circuits where addresses are allocated to individual integrated circuits in advance to generate a set of integrated circuits of "$Y_B i$" (where, i=1, 2, 3, . . . ) comprised of a partial set of "$Y_A$" and generate a space wherein a set of the integrated circuits of "$Y_B$" exhibits any function. Next, in the second stage, after using any integrated circuit function of "$Y_B i$" (where, i=1, 2, 3, . . . ), the address of the set "$Y_B$" of all integrated circuits of "$Y_B i$" (where, i=1, 2, 3, . . . ) is released, a set of the integrated circuits such as the partial set "$Y_C j$" (where, j=1, 2, 3, . . . ) of "$Y_A$" represented by $(Y_C=\Sigma Y_C j)$ $\overline{Y}_A$ (where, i=1, 2, 3, . . . ) is generated, and thereby a space wherein the set of the integrated circuits of "$Y_C$" exhibits any integrated circuit function is generated. Next, in the third stage, after using the integrated circuit function of "$Y_C j$" (where, j=1, 2, 3, . . . ), the address of the set "$Y_C$" of all integrated circuits of "$Y_C j$" (where, j=1, 2, 3, . . . ) is released, a set of the integrated circuits such as the partial set "$Y_D k$" (where, k=1, 2, 3, . . . ) of "$Y_A$" represented by $(Y_D=\Sigma Y_D k)$ $\overline{A}$ (where, k=1, 2, 3, . . . ) is generated, and thereby a space wherein the set of the integrated circuits such as "$Y_D$" exhibits any integrated circuit function is generated. Further, by similarly performing the fourth stage, the fifth stage, and further the n-th (where, n=1, 2, 3, . . . ) stage in that order to repeatedly successively generate and release spaces exhibiting the function of any integrated circuit, the functions of the integrated circuits are used divided in time and divided in space.

In addition, the above integrated circuit is configured by a plurality of elements and, in the first stage, designates an address expressed by $A\rho(B=\Sigma Bi)$ (where, i=1, 2, 3, . . . ) for any region of the set "A" of the elements of the integrated circuit to which the addresses are allocated in advance to generate the "Bi" (where, i=1, 2, 3, . . . ) region comprised of a partial set of "A" and generate a space wherein the "B" region acts as any circuit function. Next, in the second stage, after using any circuit function of "Bi" (where, i=1, 2, 3, . . . ), it releases the address of the circuit function of the entire region "B" of "Bi" (where, i=1, 2, 3, . . . ), generates the "Cj" (where, j=1, 2, 3, . . . ) region comprised of the partial set of "A" represented by Aρ(C=ΣCj) (where, j=1, 2, 3, . . . ), and thereby generates a space wherein the "C" region acts as any circuit function. Next, in the third stage, after using the circuit function of "Cj" (where, j=1, 2, 3, . . . ), the integrated circuit releases the address of the circuit function of the entire region "C" of "Cj" (where, j=1, 2, 3, . . . ), generates the partial set "Dk" region (where, k=1, 2, 3, . . . ) of "A" represented by Aρ(D=ΣDk) (where, k=1, 2, 3, . . . ), and thereby generates a space wherein the "D" region acts as any circuit function. Further, by similarly performing the fourth stage, the fifth stage, and further the n-th stage (where, n=1, 2, 3, . . . ) in order to repeatedly successively generate and release the space acting as any circuit function, the functions of the elements are used divided in time and divided in space.

A fifth integrated circuit device of the present invention is provided with x number of integrated circuits. The y-th ($1 \leq y \leq x$) integrated circuit among these x number of integrated circuits, in the first stage, designates an address represented by $(Y_\beta = \Sigma Y_\beta i) \overline{Y}_\alpha$ (where, i=1, 2, 3, . . . ) for any integrated circuit of the set "$Y_\alpha$" of the integrated circuits wherein addresses are allocated to individual integrated circuits in advance to generate a set of integrated circuits of "$Y_\beta i$" (where, i=1, 2, 3, . . . ) comprised of the partial set of "$Y_\alpha$" and generate a space wherein the "$Y_\beta$" set of integrated circuits exhibits any integrated circuit function. Next, in the second stage, after using any integrated circuit function of "$Y_\beta i$" (where, i=1, 2, 3, . . . ), it releases the addresses of the integrated circuit function of the set "$Y_\beta$" of all integrated circuits of "$Y_\beta i$" (where, i=1, 2, 3, . . . ) or the addresses of the integrated circuit function of part of "$Y_\beta i$" (where, i=1, 2, 3, . . . ) in the set of the integrated circuits of "$Y_\beta$", generates the set of integrated circuits of "$Y_\xi$" represented by $(Y_\xi 4 Y_\phi = \Sigma Y_\lambda j) \overline{Y}_\alpha$ (where, j=1, 2, 3, . . . ) and comprised by the set of integrated circuits released from "$Y_\beta$" and the complementary set "$Y_\delta$" of "$Y_\beta$" and the set of the integrated circuits constituted by the set "$Y_\phi$" ($Y_\phi \overline{Y}_\alpha$) of the integrated circuits which are not released from "$Y_\beta$" and remain, thereby to generate a space wherein the set of integrated circuits such as "$Y_\epsilon 4 Y_\phi$" exhibits any integrated circuit function. Next, in the third stage, after using the integrated circuit function of "$Y_\lambda j$" (where, j=1, 2, 3, . . . ), it releases the addresses of the integrated circuit function of the set "$Y_\epsilon 4 Y_\phi$" of all integrated circuits of "$Y_\lambda j$" (where, j=1, 2, 3, . . . ) or the addresses of part of the integrated circuit functions of "$Y_\lambda j$" (where, j=1, 2, 3, . . . ) in the set of integrated circuits of "$Y_\epsilon 4 Y_\phi$", generates the set of the integrated circuits represented by $(Y_\xi 4 Y_\gamma 4 Y_\rho = \Sigma Y_\zeta k) \overline{Y}_\alpha$ (where, k=1, 2, 3, . . . ) constituted by the set of integrated circuits of "$Y_\xi$" comprised of the set of the integrated circuits released from "$Y_\epsilon 4 Y_\phi$" and the complementary set "$Y_\eta$" of "$Y_\epsilon 4 Y_\phi$", and "$Y_\gamma$" (where, $Y_\gamma \overline{Y}_\epsilon$) and "$Y_\rho$" (where, $Y_\rho \overline{Y}_\alpha$) regions which are not released from "$Y_\epsilon 4 Y_\phi$" and remain, to thereby generate a space wherein the set of integrated circuits of "$Y_\xi 4 Y_\gamma 4 Y_\rho$" acts as any integrated circuit function. Further, by similarly performing the fourth stage, the fifth stage, and further the n-th (where, n=1, 2, 3, . . . ) stage to repeatedly successively generate and release spaces acting as any circuit function, the functions of the integrated circuits are used divided in time and divided in space.

In addition, the above integrated circuit is configured by a plurality of elements and, in the first stage, designates an address expressed by Aρ(B=ΣBi) (where, i=1, 2, 3, . . . ) for any region of the set "A" of the elements of the integrated circuit to which the addresses are allocated in advance to generate the "Bi" (where, i=1, 2, 3, . . . ) region comprised of a partial set of "A" and generate a space wherein the "B" region acts as any circuit function. Next, in the second stage, after using any circuit function of "Bi" (where, i=1, 2, 3, . . . ), it releases the address of the circuit function of the entire region "B" of "Bi" (where, i=1, 2, 3, . . . ), generates the "Cj" (where, j=1, 2, 3, . . . ) region comprised of the partial set of "A" represented by Aρ(C=ΣCj) (where, j=1, 2, 3, . . . ), and thereby generates a space wherein the "C" region acts as any circuit function. Next, in the third stage, after using the circuit function of "Cj" (where, j=1, 2, 3, . . . ), the integrated circuit releases the address of the circuit function of the entire region "C" of "Cj" (where, j=1, 2, 3, . . . ), generates the partial set "Dk" region (where, k=1, 2, 3, . . . ) of "A" represented by Aρ(D=ΣDk) (where, k=1, 2, 3, . . . ), and thereby generates a space wherein the "D" region acts as any circuit function. Further, by similarly performing the fourth stage, the fifth stage, and further the n-th stage (where, n=1, 2, 3, . . . ) in order to repeatedly successively generate and release the space acting as any circuit function, the functions of the elements are used divided in time and divided in space.

A sixth integrated circuit device of the present invention is provided with x number of integrated circuits. The y-th ($1 \leq y \leq x$) integrated circuit among these x integrated circuits, in the first stage, designates an address represented by $(Y_\phi = \Sigma Y_\phi i) \overline{Y}_\Lambda$ (where, i=1, 2, 3, . . . ) for any integrated circuit of the set "$Y_\Lambda$" of the integrated circuits wherein the addresses are allocated to individual integrated circuits in advance to generate a set of integrated circuits of "$Y_\phi i$" (where, i=1, 2, 3, . . . ) comprised of a partial set of "$Y_\Lambda$" and generate a space wherein the set of integrated circuits of "$Y_\phi$" exhibits any function. Next, in the second stage, after using any integrated circuit function of "$Y_\phi i$" (where, i=1, 2, 3, . . . ), it releases the addresses of the integrated circuit function of the set "$Y_\phi$" of all integrated circuits of "$Y_\phi i$" (where, i=1, 2, 3, . . . ) and generates the set of integrated circuits of "$Y_\psi j$" (where, j=1, 2, 3, . . . ) compared of a partial set of "$Y_\Lambda$" represented by $(Y_\psi = \Sigma Y_\psi j) \overline{Y}_\Lambda$ (where, j=1, 2, 3, . . . ) and generates a space wherein the set of integrated circuits of "$Y_\psi$" exhibits any integrated circuit function. Next, in the third stage, after using the integrated circuit function of "$Y_\psi j$" (where, j=1, 2, 3, . . . ), it releases the addresses of the integrated circuit function of the set "$Y_\psi$" of all integrated circuits of "$Y_\psi j$" (where, j=1, 2, 3, . . . ) or the addresses of the function of "$Y_\psi j$" (where, j=1, 2, 3, . . . ) of part of the "$Y_\psi$" region, generates the set of the integrated circuits represented by $(Y_\Theta 4 Y_\Omega = Y_\gamma k) \overline{Y}_\Lambda$ (where, k=1, 2, 3, . . . ) and constituted by the set "$Y_\Theta$" of integrated circuits comprised by the set of the integrated circuits released from "$Y_\psi$" and the complementary set "$Y_\Lambda$" of "$Y_\psi$", and the set of "$Y_\Omega$" ($Y_\Omega \overline{Y}_\psi$) which is not released from "$Y_\psi$" and remains, thereby to generate a space wherein the set of integrated circuits of $Y_\Theta 4 Y_\Omega$" exhibits any function. Further, by similarly performing the fourth stage, the fifth stage, and further the n-th (where, n=1, 2, 3, . . . ) stage in that order to repeatedly successively generate and release spaces acting as any integrated circuit function, the functions of the integrated circuits are used divided in time and divided in space.

In addition, the above integrated circuit is configured by a plurality of elements and, in the first stage, designates an address expressed by Aρ(B=ΣBi) (where, i=1, 2, 3, . . . ) for any region of the set "A" of the elements of the integrated circuit to which the addresses are allocated in advance to generate the "Bi" (where, i=1, 2, 3, . . . ) region comprised of a partial set of "A" and generate a space wherein the "B" region acts as any circuit function. Next, in the second stage, after using any circuit function of "Bi" (where, i=1, 2, 3, . . . ), it releases the address of the circuit function of the entire region "B" of "Bi" (where, i=1, 2, 3, . . . ), generates the "Cj" (where, j=1, 2, 3, . . . ) region comprised of the partial set of "A" represented by $A\rho(C=\Sigma Cj)$ (where, j=1, 2, 3, . . . ), and thereby generates a space wherein the "C" region acts as any circuit function. Next, in the third stage, after using the circuit function of "Cj" (where, j=1, 2, 3, . . . ), the integrated circuit releases the address of the circuit function of the entire region "C" of "Cj" (where, j=1, 2, 3, . . . ), generates the partial set "Dk" region (where, k=1, 2, 3, . . . ) of "A" represented by $A\rho(D=\Sigma Dk)$ (where, k=1, 2, 3, . . . ), and thereby generates a space wherein the "D" region acts as any circuit function. Further, by similarly performing the fourth stage, the fifth stage, and further the n-th stage (where, n=1, 2, 3, . . . ) in order to repeatedly successively generate and release the space acting as any circuit function, the functions of the elements are used divided in time and divided in space.

A seventh integrated circuit device of the present invention is provided with x number of integrated circuits. The y-th ($1 \leq y \leq x$) integrated circuit among the x number of integrated circuits is provided with the same integrated circuit function or different integrated circuit functions and exchanges data or instructions or data and instructions with the integrated circuits. This seventh integrated circuit device, in the first stage, designates an address represented by $(Y_B = \Sigma Y_B i) \overline{Y}_A$ (where, i=1, 2, 3, . . . ) for any integrated circuit of the set "$Y_A$" of integrated circuits wherein addresses are allocated to individual integrated circuits in advance to generate a set of integrated circuits of "$Y_B i$" (where, i=1, 2, 3, . . . ) comprised of a partial set of "$Y_A$" and generate a space wherein the set of integrated circuits of "$Y_B$" exhibits any function. Next, in the second stage, after using any integrated circuit function of "$Y_B i$" (where, i=1, 2, 3, . . . ), it releases the addresses of the set "$Y_B$" of all integrated circuits of "$Y_B i$" (where, i=1, 2, 3, . . . ), generates the set of integrated circuits of "$Y_C j$" (where, j=1, 2, 3, . . . ) comprised of a partial set of "$Y_A$" represented by $(Y_C = \Sigma Y_C j) \overline{Y}_A$ (where, j=1, 2, 3, . . . ), and generates a space wherein the set of integrated circuits of "$Y_C$" exhibits any integrated circuit function. Next, in the third stage, after using the integrated circuit function of "$Y_C j$" (where, j=1, 2, 3, . . . ), it releases the addresses of the set "$Y_C$" of all integrated circuits of "$Y_C j$" (where, j=1, 2, 3, . . . ), generates a set of integrated circuits of "$Y_D k$" (where, k=1, 2, 3, . . . ) comprised of the partial set of "$Y_A$" represented by $(Y_D = \Sigma Y_D k) A$ (where, k=1, 2, 3, . . . ), and generates a space wherein the set of integrated circuits of "$Y_D$" exhibits any integrated circuit function. Further, by similarly performing the fourth stage, the fifth stage, and further the n-th (where, n=1, 2, 3, . . . ) stage in that order to repeatedly successively generate and release spaces exhibiting the function of any integrated circuit, the functions of the integrated circuits are used divided in time and divided in space.

In addition, the above integrated circuit is configured by a plurality of elements and, in the first stage, designates an address represented by $(\beta = \Sigma \beta i) \overline{\alpha}$ (where, i=1, 2, 3, . . . ) for any region of the set "α" of the elements of the integrated circuit to which the addresses are allocated in advance to generate a "βi" (wherein, i=1, 2, 3 . . . ) region comprised of a partial set of "α" and generate a space wherein the "β" region acts as any circuit function. Next, in the second stage, after using any circuit function of "βi" (where, i=1, 2, 3, . . . ), this releases the addresses of the circuit functions of the "β" region comprised of the entire region of "βi" (where, i=1, 2, 3, . . . ) or the circuit functions of part of "βi" (where, i=1, 2, 3, . . . ) in the "β" region, generates a region represented by $(\epsilon 4\phi = \Sigma \lambda j) \overline{\alpha}$ (where, j=1, 2, 3, . . . ) and constituted by the "ε" region comprised by the region released from "β" and the "δ" region as the complementary set of "β", and "φ" ($\phi\ \overline{\alpha}$) region which is not released from "β" and remains, and generates a space wherein the "ε4φ" region acts as any circuit function. Next, in the third stage, after using the circuit function of "λj" (where, j=1, 2, 3, . . . ), it releases the addresses of the circuit functions of "ε4φ" comprised of the entire region of "λj" (where, j=1, 2, 3, . . . ) or the circuit functions of part of "λj" (where, j=1, 2, 3, . . . ) in the "ε4φ" region, generates a region represented by $(\xi 4\gamma 4\rho = \Sigma \zeta k) \overline{\alpha}$ (where, k=1, 2, 3, . . . ) and constituted by the "ξ" region comprised by the region released from "ε4φ" and the "η" region as the complementary set of "ε4φ", the "γ" (where, $\gamma\ \overline{\epsilon}$) region which is not released from "ε4φ" and remains, and the "ρ" (where, $\rho\ \overline{\beta}$) region, and generates a space wherein the "ξ4γ4ρ" region acts as any circuit function. Further, by similarly performing the fourth stage, the fifth stage, and further the n-th stage (where, n=1, 2, 3, . . . ) in that order to repeatedly successively generate and release spaces acting as any circuit function, the functions of the elements are used divided in time and in space.

An eighth integrated circuit device of the present invention is provided with x number of integrated circuits. A y-th ($1 \leq y \leq x$) integrated circuit among these x number of integrated circuits, in the first stage, designates an address represented by $(Y_\beta = \Sigma Y_\beta i) \overline{Y}_\alpha$ (where, i=1, 2, 3, . . . ) for any integrated circuit of the set "$Y_\alpha$" of integrated circuits wherein addresses are allocated to individual integrated circuits in advance to generate a set of integrated circuits of "$Y_\beta i$" (where, i=1, 2, 3, . . . ) comprised of a partial set of "$Y_\alpha$" and generate a space wherein the set of integrated circuits of "$Y_\beta$" exhibits any integrated circuit function. Next, in the second stage, after using any integrated circuit function of "$Y_\beta i$" (where, i=1, 2, 3, . . . ), it releases the addresses of the integrated circuit function of the set "$Y_\beta$" of all integrated circuits of "$Y_\beta i$" (where, i=1, 2, 3, . . . ) or the addresses of the integrated circuit function of part of "$Y_\beta i$" (where, i=1, 2, 3, . . . ) in the set of the integrated circuits of "$Y_\beta$", generates the set of integrated circuits represented by $(Y_\xi 4 Y_\phi = \Sigma Y_\lambda j) \overline{Y}_\alpha$ (where, j=1, 2, 3, . . . ) and constituted by a set of integrated circuits of "$Y_\xi$" comprised of a set of integrated circuits released from "$Y_\beta$" and the complementary set "$Y_\delta$" of "$Y_\alpha$", and the set of integrated circuits of "$Y_\phi$" (where, $Y_\phi\ \overline{Y}_\alpha$) which is not released from "$Y_\beta$" and remains, and generates a space wherein the set of integrated circuits of "$Y_\epsilon 4 Y_\phi$" exhibits any integrated circuit function. Next, in the third stage, after using the integrated circuit function of "$Y_\lambda j$" (where, j=1, 2, 3, . . . ), it releases the addresses of the integrated circuit function of the set "$Y_\epsilon 4 Y_\phi$" of all integrated circuits of "$Y_\lambda j$" (where, j=1, 2, 3, . . . ) or the addresses of the integrated circuit function of part of "$Y_\lambda j$" (where, j=1, 2, 3, . . . ) in the set of integrated circuits of "$Y_\epsilon 4 Y_\phi$", generates the set of the integrated circuits represented by $(Y_\xi 4 Y_\gamma 4 Y_\rho = \Sigma Y_\zeta k) \overline{Y}_\alpha$ (where, k=1, 2, 3, . . . ) and constituted by the set of integrated circuits of "$Y_\xi$" comprised by the set of the integrated circuits released from "$Y_\epsilon 4 Y_\phi$" and the complementary set "$Y_\eta$" of "$Y_\epsilon 4 Y_\phi$", and "$Y_\gamma$" which is not released from "$Y_\epsilon 4 Y_\phi$" and remains (where, $Y_\gamma\ \overline{Y}_\epsilon$) and "$Y_\rho$" (where, $Y_\rho\ \overline{Y}_\alpha$), and generates a space wherein the set of integrated circuits of "$Y_\xi 4 Y_\gamma 4 Y_\rho$" acts as any integrated circuit function. Further, by similarly performing the fourth stage, the fifth stage, and further the n-th (where, n=1, 2, 3, . . . ) stage in that order to repeatedly successively generate and release spaces exhibiting any integrated circuit function, the functions of the integrated circuits are used divided in time and divided in space.

In addition, the above integrated circuit is configured by a plurality of elements and, in the first stage, designates an address represented by $(\beta=\Sigma\beta i)\overline{\alpha}$ (where, $i=1, 2, 3, \ldots$) for any region of the set "$\alpha$" of the elements of the integrated circuit to which the addresses are allocated in advance to generate a "$\beta i$" (wherein, $i=1, 2, 3 \ldots$) region comprised of a partial set of "$\alpha$" and generate a space wherein the "$\beta$" region acts as any circuit function. Next, in the second stage, after using any circuit function of "$\beta i$" (where, $i=1, 2, 3, \ldots$), this releases the addresses of the circuit functions of the "$\beta$" region comprised of the entire region of "$\beta i$" (where, $i=1, 2, 3, \ldots$) or the circuit functions of part of "$\beta i$" (where, $i=1, 2, 3, \ldots$) in the "$\beta$" region, generates a region represented by $(\epsilon 4\phi=\Sigma\lambda j)\overline{\alpha}$ (where, $j=1, 2, 3, \ldots$) and constituted by the "$\epsilon$" region comprised by the region released from "$\beta$" and the "$\delta$" region as the complementary set of "$\beta$", and "$\phi$" ($\phi\overline{\alpha}$) region which is not released from "$\beta$" and remains, and generates a space wherein the "$\epsilon 4\phi$" region acts as any circuit function. Next, in the third stage, after using the circuit function of "$\lambda j$" (where, $j=1, 2, 3, \ldots$), it releases the addresses of the circuit functions of "$\epsilon 4\phi$" comprised of the entire region of "$\lambda j$" (where, $j=1, 2, 3, \ldots$) or the circuit functions of part of "$\lambda j$" (where, $j=1, 2, 3, \ldots$) in the "$\epsilon 4\phi$" region, generates a region represented by $(\xi 4\gamma 4\rho=\Sigma\zeta k)\overline{\alpha}$ (where, $k=1, 2, 3, \ldots$) and constituted by the "$\xi$" region comprised by the region released from "$\epsilon 4\phi$" and the "$\eta$" region as the complementary set of "$\epsilon 4\phi$", the "$\gamma$" (where, $\gamma\overline{\epsilon}$) region which is not released from "$\epsilon 4\phi$" and remains, and the "$\rho$" (where, $\rho\overline{\beta}$) region, and generates a space wherein the "$\xi 4\gamma 4\rho$" region acts as any circuit function. Further, by similarly performing the fourth stage, the fifth stage, and further the n-th stage (where, $n=1, 2, 3, \ldots$) in that order to repeatedly successively generate and release spaces acting as any circuit function, the functions of the elements are used divided in time and in space.

A ninth integrated circuit device of the present invention is provided with x number of integrated circuits. A y-th ($1\leq y\leq x$) integrated circuit among these x number of integrated circuits, in the first stage, designates an address represented by $(Y_\phi=\Sigma Y_\phi i)\overline{Y}_\Lambda$ (where, $i=1, 2, 3, \ldots$) for any integrated circuit of the set "$Y_\Lambda$" of the integrated circuits wherein the addresses are allocated to individual integrated circuits in advance, generates a set of integrated circuits of "$Y_\phi i$" (where, $i=1, 2, 3, \ldots$) comprised of a partial set of "$Y_\Lambda$", and generates a space wherein the set of integrated circuits of "$Y_\phi$" exhibits any function. Next, in the second stage, after using any integrated circuit function of "$Y_\phi i$" (where, $i=1, 2, 3, \ldots$), it releases the addresses of the integrated circuit function of the set "$Y_\phi$" of all integrated circuits of "$Y_\phi i$" (where, $i=1, 2, 3, \ldots$), generates the set of integrated circuits of "$Y_\psi j$" (where, $j=1, 2, 3, \ldots$) comprised of a partial set of "$Y_\Lambda$" represented by $(Y_\psi=\Sigma Y_\psi j)\overline{Y}_\Lambda$ (where, $j=1, 2, 3, \ldots$), and generates a space wherein the set of integrated circuits of "$Y_\psi$" exhibits any integrated circuit function. Next, in the third stage, after using the integrated circuit function of "$Y_\psi j$" (where, $j=1, 2, 3, \ldots$), it releases the addresses of the integrated circuit function of the set "$Y_\psi$" of all integrated circuits of "$Y_\psi j$" (where, $j=1, 2, 3, \ldots$) or the addresses of the function of part of "$Y_\psi j$" (where, $j=1, 2, 3, \ldots$) in the "$Y_\psi$" region, generates the set of the integrated circuits represented by $(Y_\Theta 4Y_\Omega=Y_\gamma k)\overline{Y}_\Lambda$ (where, $k=1, 2, 3, \ldots$), and constituted by the set "$Y_\Theta$" of integrated circuits comprised of the set of the integrated circuits released from "$Y_\psi$" and the complementary set "$Y_\Lambda$" of "$Y_\psi$", and the set of "$Y_\Omega$" ($Y_\Omega\overline{Y}_\psi$) which is not released from "$Y_\psi$" and remains, and generates a space wherein the set of integrated circuits of "$Y_\Theta 4Y_\Omega$" exhibits any function. Further, by similarly performing the fourth stage, the fifth stage, and further the n-th (where, $n=1, 2, 3, \ldots$) stage in that order to repeatedly successively generate and release spaces exhibiting the function of any integrated circuit, the functions of the integrated circuits are used divided in time and divided in space.

In addition, the above integrated circuit is configured by a plurality of elements and, in the first stage, designates an address represented by $(\beta=\Sigma\beta i)\overline{\alpha}$ (where, $i=1, 2, 3, \ldots$) for any region of the set "$\alpha$" of the elements of the integrated circuit to which the addresses are allocated in advance to generate a "$\beta i$" (wherein, $i=1, 2, 3 \ldots$) region comprised of a partial set of "$\alpha$" and generate a space wherein the "$\beta$" region acts as any circuit function. Next, in the second stage, after using any circuit function of "$\beta i$" (where, $i=1, 2, 3, \ldots$) this releases the addresses of the circuit functions of the "$\beta$" region comprised of the entire region of "$\beta i$" (where, $i=1, 2, 3, \ldots$) or the circuit functions of part of "$\beta i$" (where, $i=1, 2, 3, \ldots$) in the "$\beta$" region, generates a region represented by $(\epsilon 4\phi=\Sigma\lambda j)\overline{\alpha}$ (where, $j=1, 2, 3, \ldots$) and constituted by the "$\epsilon$" region comprised by the region released from "$\beta$" and the "$\delta$" region as the complementary set of "$\beta$", and "$\phi$" ($\phi\overline{\alpha}$) region which is not released from "$\beta$" and remains, and generates a space wherein the "$\epsilon 4\phi$" region acts as any circuit function. Next, in the third stage, after using the circuit function of "$\lambda j$" (where, $j=1, 2, 3, \ldots$), it releases the addresses of the circuit functions of "$\epsilon 4\phi$" comprised of the entire region of "$\lambda j$" (where, $j=1, 2, 3, \ldots$) or the circuit functions of part of "$\lambda j$" (where, $j=1, 2, 3, \ldots$) in the "$\epsilon 4\phi$" region, generates a region represented by $(\xi 4\gamma 4\rho=\Sigma\zeta k)\overline{\alpha}$ (where, $k=1, 2, 3, \ldots$) and constituted by the "$\xi$" region comprised by the region released from "$\epsilon 4\phi$" and the "$\eta$" region as the complementary set of "$\epsilon 4\phi$", the "$\gamma$" (where, $\gamma\overline{\epsilon}$) region which is not released from "$\epsilon 4\phi$" and remains, and the "$\rho$" (where, $\rho\overline{\beta}$) region, and generates a space wherein the "$\xi 4\gamma 4\rho$" region acts as any circuit function. Further, by similarly performing the fourth stage, the fifth stage, and further the n-th stage (where, $n=1, 2, 3, \ldots$) in that order to repeatedly successively generate and release spaces acting as any circuit function, the functions of the elements are used divided in time and in space.

A 10th integrated circuit device of the present invention is provided with x number of integrated circuits. A y-th ($1\leq y\leq x$) integrated circuit among the x number of integrated circuits is provided with the same integrated circuit function or a different integrated circuit functions and exchanges data or instructions or data and instructions with integrated circuits. This 10th integrated circuit device, in the first stage, designates an address represented by $(Y_B=\Sigma Y_B i)\overline{Y}_A$ (where, $i=1, 2, 3, \ldots$) for any integrated circuit of the set "$Y_A$" of integrated circuits wherein addresses are allocated to individual integrated circuits in advance to generate a set of integrated circuits of "$Y_B i$" (where, $i=1, 2, 3, \ldots$) comprised of a partial set of "$Y_A$" and generate a space wherein the set of integrated circuits of "$Y_B$" exhibits any function. Next, in the second stage, after using any integrated circuit function of "$Y_B i$" (where, $i=1, 2, 3, \ldots$), it releases the addresses of the set "$Y_B$" of all integrated circuits of "$Y_B i$" (where, $i=1, 2, 3, \ldots$), generates the set of integrated circuits of "$Y_C j$" (where, $j=1, 2, 3, \ldots$) comprised of a partial set of "$Y_A$" represented by $(Y_C=\Sigma Y_C j)\overline{Y}_A$ (where, $j=1, 2, 3, \ldots$), and generates a space wherein the set of integrated circuits of "$Y_C$" exhibits any integrated circuit function. Next, in the third stage, after using the integrated circuit function of "$Y_Cj$" (where, j=1, 2, 3, . . . ), it releases the addresses of the set "$Y_C$" of all integrated circuits of "$Y_Cj$" (where, j=1, 2, 3, . . . ), generates a set of integrated circuits of "$Y_Dk$" (where, k=1, 2, 3, . . . ) comprised of a partial set of "$Y_A$" represented by $(Y_D=\Sigma Y_Dk)\overline{A}$ (where, k=1, 2, 3, . . . ), and generates a space wherein the set of integrated circuits of "$Y_D$" exhibits any integrated circuit function. Further, by similarly performing the fourth stage, the fifth stage, and further the n-th (where, n=1, 2, 3, . . . ) stage in that order to repeatedly successively generate and release spaces exhibiting the function of any integrated circuit, the functions of the integrated circuits are used divided in time and divided in space.

In addition, the integrated circuit is configured by a plurality of elements and, in the first stage, designates an address represented by $\Lambda\rho(\phi=\Sigma\phi i)$ (where, i=1, 2, 3, . . . ) for any region of the set "$\Lambda$" of elements of the integrated circuit to which the addresses are allocated in advance to generate a "$\phi i$" region (where, i=1, 2, 3, . . . ) region comprised of a partial set of "$\Lambda$" and generate a space wherein the "$\phi$" region acts as any circuit function. Next, in the second stage, after using any circuit function of "$\phi i$" (where, i=1, 2, 3, . . . ), it releases the addresses of the circuit function of the entire region "$\phi$" of "$\phi i$" (where, i=1, 2, 3, . . . ), generates a "$\psi j$" (where, i=1, 2, 3, . . . ) region comprised of a partial set of "$\Lambda$" represented by $\Lambda\rho$ ($\psi=\Sigma\psi j$) (where, j=1, 2, 3, . . . ), and generates a space wherein the "$\psi$" region acts as any circuit function. Next, in the third stage, after using the circuit function of "$\psi j$" (where, j=1, 2, 3, . . . ), it releases the addresses of the circuit function of the entire region "$\psi$" of "$\psi j$" (where, i=1, 2, 3, . . . ) or the circuit function according to part of "$\psi j$" (where, i=1, 2, 3, . . . ) in the "$\psi$" region, generates the region represented by $(\Theta 4\ \Omega=\Sigma Yk)\overline{\Lambda}$ (where, k=1, 2, 3, . . . ) and constituted by the region "$\Theta$" comprised by the region released from "$\psi$" and the region "$\Lambda$" as the complementary set of "$\psi$" and the "$\Omega$" ($\Omega\ \overline{\psi}$) region which is not released from "$\psi$" and remains, and generates a space wherein the "$\Theta 4\ \Omega$" region acts as any circuit function. By similarly continuously or alternately repeating the second stage and the third stage appropriately and performing the n-th stage (where, n=1, 2, 3, . . . ) to repeatedly successively generate and release spaces acting as any circuit function, the functions of the elements are used divided in time and divided in space.

An 11th integrated circuit device of the present invention is provided with x number of integrated circuits. A y-th ($1\leq y\leq x$) integrated circuit among these x number of integrated circuits, in the first stage, designates an address represented by $(Y_\beta=\Sigma Y_\beta i)\overline{Y}_\alpha$ (where, i=1, 2, 3, . . . ) for any integrated circuit of the set "$Y_\alpha$" of the integrated circuits wherein the addresses are allocated to individual integrated circuits in advance to generate a set of integrated circuits of "$Y_\beta i$" (where, i=1, 2, 3, . . . ) comprised of a partial set of "$Y_\alpha$" and generate a space wherein the set of integrated circuits of "$Y_\beta$" exhibits any integrated circuit function. Next, in the second stage, after using any integrated circuit function of "$Y_\beta i$" (where, i=1, 2, 3, . . . ), it releases the addresses of the integrated circuit function of the "$Y_\beta$" of all integrated circuits of "$Y_\beta i$" (where, i=1, 2, 3, . . . ) or the addresses of the integrated circuit function of part of "$Y_\beta i$" (where, i=1, 2, 3, . . . ) of the set of the integrated circuits of "$Y_\beta$", generates the set of integrated circuits represented by $(Y_\xi 4Y_\phi=\Sigma Y_\lambda j)\overline{Y}_\alpha$ (where, j=1, 2, 3, . . . ) and constituted by a set of integrated circuits such as "$Y_\xi$" comprised by the set of integrated circuits released from "$Y_\beta$" and the complementary set "$Y_\delta$" of "$Y_\beta$", and the set of integrated circuits of "$Y_\phi$" (where, $Y_\phi\ \overline{Y}_\alpha$) which is not released from "$Y_\beta$" and remains, and generates a space wherein the set of integrated circuits of "$Y_\epsilon 4Y_\phi$" exhibits any integrated circuit function. Next, in the third stage, after using the integrated circuit function of "$Y_\lambda j$" (where, j=1, 2, 3, . . . ), the y-th integrated circuit releases the addresses of the integrated circuit function according to the set "$Y_\epsilon 4Y_\phi$" of all integrated circuits of "$Y_\lambda j$" (where, j=1, 2, 3, . . . ) or the addresses of the integrated circuit function according to part of "$Y_\lambda$" (where, j=1, 2, 3, . . . ) in the set of integrated circuits of "$Y_\epsilon 4Y_\phi$", generates the set of the integrated circuits represented by $(Y_\xi 4Y_\gamma 4Y_\rho=\Sigma Y_\xi k)\overline{Y}_\alpha$ (where, k=1, 2, 3, . . . ) and constituted by the set of integrated circuits of the set "$Y_\xi$" of the integrated circuits released from "$Y_\epsilon 4Y_\phi$" and the complementary set "$Y_\eta$" of "$Y_\epsilon 4Y_\phi$", and "$Y_\gamma$" which is not released from "$Y_\epsilon 4Y_\phi$" and remains (where, $Y_\gamma\ \overline{Y}_\epsilon$) and "$Y_\rho$" (where, $Y_\rho\ \overline{Y}_\alpha$), and generates a space wherein the set of integrated circuits of "$Y_\xi 4Y_\gamma 4Y_\rho$" acts as any integrated circuit function. Further, by similarly performing the fourth stage, the fifth stage, and further the n-th (where, n=1, 2, 3, . . . ) stage in that order to repeatedly successively generate and release spaces exhibiting the function of any integrated circuit, the functions of the integrated circuits are used divided in time and divided in space.

In addition, the integrated circuit is configured by a plurality of elements and, in the first stage, designates an address represented by $\Lambda\rho(\phi=\Sigma\phi i)$ (where, i=1, 2, 3, . . . ) for any region of the set "$\Lambda$" of elements of the integrated circuit to which the addresses are allocated in advance to generate a "$\phi i$" region (where, i=1, 2, 3, . . . ) region comprised of a partial set of "$\Lambda$" and generate a space wherein the "$\phi$" region acts as any circuit function. Next, in the second stage, after using any circuit function of "$\phi i$" (where, i=1, 2, 3, . . . ), it releases the addresses of the circuit function of the entire region "$\phi$" of "$\phi i$" (where, i=1, 2, 3, . . . ), generates a "$\psi j$" (where, i=1, 2, 3, . . . ) region comprised of a partial set of "$\Lambda$" represented by $\Lambda\rho$ ($\psi=\Sigma\psi j$) (where, j=1, 2, 3, . . . ), and generates a space wherein the "$\psi$" region acts as any circuit function. Next, in the third stage, after using the circuit function of "$\psi j$" (where, j=1, 2, 3, . . . ), it releases the addresses of the circuit function of the entire region "$\psi$" of "$\psi j$" (where, i=1, 2, 3, . . . ) or the circuit function according to part of "$\psi j$" (where, i=1, 2, 3, . . . ) in the "$\psi$" region, generates the region represented by $(\Theta 4\ \Omega=\Sigma Yk)\overline{\Lambda}$ (where, k=1, 2, 3, . . . ) and constituted by the region "$\Theta$" comprised by the region released from "$\psi$" and the region "$\Lambda$" as the complementary set of "$\psi$" and the "$\Omega$" ($\Omega\ \overline{\psi}$) region which is not released from "$\psi$" and remains, and generates a space wherein the "$\Theta 4\ \Omega$" region acts as any circuit function. By similarly continuously or alternately repeating the second stage and the third stage appropriately and performing the n-th stage (where, n=1, 2, 3, . . . ) to repeatedly successively generate and release spaces acting as any circuit function, the functions of the elements are used divided in time and divided in space.

A 12th integrated circuit device of the present invention is provided with x number of integrated circuits. A y-th ($1\leq y\leq x$) integrated circuit among these x number of integrated circuits, in the first stage, designates an address represented by $(Y_\phi=\Sigma Y_\phi i)\overline{Y}_\Lambda$ (where, i=1, 2, 3, . . . ) for any integrated circuit of the set "$Y_\Lambda$" of the integrated circuits wherein the addresses are allocated to individual integrated circuits in advance to generate a set of integrated circuits of "$Y_\phi i$" (where, i=1, 2, 3, . . . ) comprised of a partial set of "$Y_\Lambda$" and generate a space wherein the set of integrated circuits of "$Y_\phi$" exhibits any function. Next, in the second stage, after using any integrated circuit function of "$Y_\phi i$" (where, i=1, 2, 3, . . . ), it releases the addresses of the integrated circuit function of the set "$Y_\phi$" of all integrated circuits of "$Y_\phi i$" (where, i=1, 2, 3, . . . ), generates the set of integrated circuits of "$Y_\psi j$" (where, j=1, 2, 3, . . . ) comprised of a partial set of "$Y_\Lambda$" represented by ($Y_\psi = \Sigma Y_{\psi j}$) $\overline{Y}_\Lambda$ (where, j=1, 2, 3, . . . ), and generates a space wherein the set of integrated circuits of "$Y_\psi$" exhibits any integrated circuit function. Next, in the third stage, after using the integrated circuit function of "$Y_\psi j$" (where, j=1, 2, 3, . . . ), it releases the addresses of the integrated circuit function of the set "$Y_\psi$" of all integrated circuits of "$Y_\psi j$" (where, j=1, 2, 3, . . . ) or the addresses of the function of part of "$Y_\psi j$" (where, j=1, 2, 3, . . . ) in the "$Y_\psi$" region, generates the set of the integrated circuits represented by ($Y_\Theta 4 Y_{\Omega = Y_\psi} k$) $\overline{Y}_\Lambda$ (where, k=1, 2, 3, . . . ), and constituted by the set "$Y_\Theta$" of integrated circuits comprised by the set of the integrated circuits released from "$Y_\psi$" and the complementary set "$Y_\Lambda$" of "$Y_\psi$", and the set of "$Y_\Omega$" ($Y_\Omega \overline{Y}_\psi$) which is not released from "$Y_\psi$" and remains, and generates a space wherein the set of integrated circuits of $Y_\Theta 4 Y_\Omega$" exhibits any function. Further, by similarly performing the fourth stage, the fifth stage, and further the n-th (where, n=1, 2, 3, . . . ) stage in that order to repeatedly successively generate and release spaces exhibiting the function of any integrated circuit, the functions of the integrated circuits are used divided in time and divided in space.

In addition, the integrated circuit is configured by a plurality of elements and, in the first stage, designates an address represented by $\Lambda \rho (\phi = \Sigma \phi i)$ (where, i=1, 2, 3, . . . ) for any region of the set "$\Lambda$" of elements of the integrated circuit to which the addresses are allocated in advance to generate a "$\phi i$" region (where, i=1, 2, 3, . . . ) region comprised of a partial set of "$\Lambda$" and generate a space wherein the "$\phi$" region acts as any circuit function. Next, in the second stage, after using any circuit function of "$\phi i$" (where, i=1, 2, 3, . . . ), it releases the addresses of the circuit function of the entire region "$\phi$" of "$\phi i$" (where, i=1, 2, 3, . . . ), generates a "$\psi j$" (where, i=1, 2, 3, . . . ) region comprised of a partial set of "$\Lambda$" represented by $\Lambda \rho (\psi = \Sigma \psi j)$ (where, j=1, 2, 3, . . . ), and generates a space wherein the "$\psi$" region acts as any circuit function. Next, in the third stage, after using the circuit function of "$\psi j$" (where, j=1, 2, 3, . . . ), it releases the addresses of the circuit function of the entire region "$\psi$" of "$\psi j$" (where, i=1, 2, 3, . . . ) or the circuit function according to part of "$\psi j$" (where, i=1, 2, 3, . . . ) in the "$\psi$" region, generates the region represented by ($\Theta 4\ \Omega = \Sigma Yk$) $\overline{\Lambda}$ (where, k=1, 2, 3, . . . ) and constituted by the region "$\Theta$" comprised by the region released from "$\psi$" and the region "$\Lambda$" as the complementary set of "$\psi$" and the "$\Omega$" ($\Omega\ \overline{\psi}$) region which is not released from "$\psi$" and remains, and generates a space wherein the "$\Theta 4\ \Omega$" region acts as any circuit function. By similarly continuously or alternately repeating the second stage and the third stage appropriately and performing the n-th stage (where, n=1, 2, 3, . . . ) to repeatedly successively generate and release spaces acting as any circuit function, the functions of the elements are used divided in time and divided in space.

The first to 12th integrated circuit devices explained above can be realized by for example the stacked three-dimensional integrated circuit device configured by n number of layers shown in FIG. 5. In this three-dimensional integrated circuit device, it is also possible to regard each layer from the first layer to the n-th layer as one set of integrated circuits or possible to divide any y number of layer among the first to n-th layers to regions of any number and regard one of the divided regions as one set of integrated circuits. Further, each above integrated circuit is configured by a system integrated circuit such as an image processing function, the image generation function, or audio processing function and a memory function. The memory circuit function is constituted by at least one type of function among a cache memory function, primary cache memory function, secondary cache memory function, buffer memory function, main memory function, nonvolatile memory function, data temporary storage function for eliminating dependency, and instruction temporary storage function for eliminating dependency.

On the other hand, in a conventional memory element, in general, during execution of the program, the memory space is secured according to need. When it becomes unnecessary, the memory space is released. These functions correspond to the memory region into which the data can be written or from which the data can be read being appropriately set. In the prior art, a memory element is allocated an address. On the other hand, a logic circuit, which is a functional element other than the memory circuit, cannot be allocated an address since an integrated circuit of the two-dimensional structure is used. Accordingly, the logic circuit and the function using the logic circuit are divided only in terms of space for every function. In the methods of operation of the fourth to sixth integrated circuit devices explained above, the address is not allocated to the logic circuit and the function per se using the logic circuit as in the prior art. For the function of the logic circuit, the address is dynamically secured along with the elapse of time (clock advance), and then released, and this is repeated. By this, it becomes possible to remarkably increase the spatial volume for realizing the logical function and the memory function using the three-dimensional cubic structure as the structure of the integrated circuit device.

The invention claimed is:

1. A semiconductor integrated circuit device comprising:
   a plurality of circuit elements functioning as part of a configured circuit;
   a plurality of connection elements each of which becomes a conductive state or a nonconductive state to connect or disconnect at least part of the circuit elements of said plurality of circuit elements to and from each other;
   interconnects for supplying control signals for placing said plurality of connection elements in said conductive state or nonconductive state; and
   a plurality of circuit selection switching elements which become a conductive state or a nonconductive state in response to a circuit configuration instruction signal in accordance with the desired circuit to be configured and apply said control signals to said interconnects in the conductive state,
   wherein said connection elements include magnetoresistance effect elements which enter a conductive state or nonconductive state in accordance with application of a magnetic field and
   wherein said device maintains a continuous conductive state by application of a continuous magnetic field generated by continuous control signals supplied to said interconnects to said magnetoresistance effect elements.

2. A semiconductor integrated circuit device as set forth in claim 1, which drives said circuit selection switching elements in accordance with said circuit configuration instruction signal, outputs said control signals from said circuit selection switching elements, combines said circuit elements to configure a desired circuit through said connection elements placed in the conductive state or nonconductive state in accordance with the control signals, and can operate said configured circuit.

3. A semiconductor integrated circuit device as set forth in either of claims 1 or 2, wherein said connection elements include resistance control elements entering a conductive state or nonconductive state in accordance with application of voltage.

4. A semiconductor integrated circuit device as set forth in claim 3, wherein said circuit selection switching elements include transistors formed on a semiconductor substrate.

5. A semiconductor integrated circuit device as set forth in claim 3, wherein
- a control line for supplying said control signals is connected to an input terminal of the semiconductor integrated circuit device and
- another of said connection elements or another of said circuit elements and connected to an output terminal of the semiconductor integrated circuit device, and
- a drive input terminal of a circuit switching element is connected to a terminal for applying said circuit configuration instruction signal.

6. A method of using a desired circuit in a semiconductor integrated circuit device as set forth in claim 3, comprising operating the configured circuit.

7. A semiconductor integrated circuit device as set forth in any one of claims 1 to 2, wherein said circuit selection switching elements include transistors fromed on a semiconductor substrate.

8. A semiconductor integrated circuit device as set forth in claim 7, wherein
- a control line for supplying said control signals is connected to an input terminal of the semiconductor integrated circuit device and
- another of said connection elements or another of said circuit elements and connected to an output terminal of the semiconductor integrated circuit device, and
- a drive input terminal of a circuit switching element is connected to a terminal for applying said circuit configuration instruction signal.

9. A method of using a desired circuit in a semiconductor integrated circuit device as set forth in claim 7, comprising operating the configured circuit.

10. A semiconductor integrated circuit device as set forth in any one of claims 1 to 2, wherein
- a control line for supplying said control signals is connected to an input terminal of the semiconductor integrated circuit device and
- another of said connection elements or another of said circuit elements and connected to an output terminal of the semiconductor integrated circuit device, and
  - a drive input terminal of a circuit switching element is connected to a terminal for applying said circuit configuration instruction signal.

11. A method of using a desired circuit in a semiconductor integrated circuit device as set forth in claims 8, comprising operating the configured circuit.

12. A semiconductor integrated circuit device as set forth in claim 1, wherein said circuit elements include magnetoresistance effect elements entering a conductive state or nonconductive state in accordance with application of a magnetic field and
- wherein said device exhibits an instantaneous conductive state by application of an instantaneous magnetic field generated by instantaneous control signals supplied to said interconnects to said magnetoresistance effect elements.

13. A semiconductor integrated circuit device as set forth in claim 1, wherein said circuit elements comprised of said magnetoresistance effect elements operate as logic operation elements, arithmetic operation elements, and storage elements.

14. A semiconductor integrated circuit device as set forth in claim 1, wherein said circuit selection switching elements include transistors formed on a semiconductor substrate.

15. A semiconductor integrated circuit device as set forth in claim 1, wherein
- a control line for supplying said control signals is connected to an input terminal of the semiconductor integrated circuit device and
- another of said connection elements or another of said circuit elements and connected to an output terminal of the semiconductor integrated circuit device, and
- a drive input terminal of a circuit switching element is connected to a terminal for applying said circuit configuration instruction signal.

16. A method of using a desired circuit in a semiconductor integrated circuit device as set forth in claim 1, comprising operating the configured circuit.

17. A semiconductor integrated circuit device comprising:
- a plurality of circuit elements functioning as part of a configured circuit;
- a plurality of connection elements each of which becomes a conductive state or a nonconductive state to connect or disconnect at least part of the circuit elements of said plurality of circuit elements to and from each other;
- interconnects for supplying control signals for placing said plurality of connection elements in said conductive state or nonconductive state; and
- a plurality of circuit selection switching elements which become a conductive state or a nonconductive state in response to a circuit configuration instruction signal in accordance with the desired circuit to be configured and apply said control signals to said interconnects in the conductive state,
- wherein said circuit elements include magnetoresistance effect elements entering a conductive state or nonconductive state in accordance with application of a magnetic field and
- wherein said device exhibits an instantaneous conductive state by application of an instantaneous magnetic field generated by instantaneous control signals supplied to said interconnects to said magnetoresistance effect elements.

18. A semiconductor integrated circuit device as set forth in claim 17, wherein said circuit elements comprised of said magnetoresistance effect elements operate as logic operation elements, arithmetic operation elements, and storage elements.

19. A semiconductor integrated circuit device as set forth in claim 18, wherein said circuit selection switching elements include transistors formed on a semiconductor substrate.

20. A semiconductor integrated circuit device as set forth in claim 18, wherein
- a control line for supplying said control signals is connected to an input terminal of the semiconductor integrated circuit device and
- another of said connection elements or another of said circuit elements and connected to an output terminal of the semiconductor integrated circuit device, and
- a drive input terminal of a circuit switching element is connected to a terminal for applying said circuit configuration instruction signal.

21. A method of using a desired circuit in a semiconductor integrated circuit device as set forth in claim 5, comprising operating the configured circuit.

22. A semiconductor integrated circuit device as set forth in claim 17, wherein said circuit selection switching elements include transistors formed on a semiconductor substrate.

23. A semiconductor integrated circuit device as set forth in claim 17, wherein
a control line for supplying said control signals is connected to an input terminal of the semiconductor integrated circuit device and
another of said connection elements or another of said circuit elements and connected to an output terminal of the semiconductor integrated circuit device, and
a drive input terminal of a circuit switching element is connected to a terminal for applying said circuit configuration instruction signal.

24. A method of using a desired circuit in a semiconductor integrated circuit device as set forth in claim 17, comprising operating the configured circuit.

25. A semiconductor integrated circuit device as set forth in claim 17, wherein said connection elements include resistance control elements entering a conductive state or nonconductive state in accordance with application of voltage.

26. A semiconductor integrated circuit device as set forth in claim 17, wherein said circuit selection switching elements include transistors formed on a semiconductor substrate.

27. A semiconductor integrated circuit device as set forth in claim 17, wherein
a control line for supplying said control signals is connected to an input terminal of the semiconductor integrated circuit device and
another of said connection elements or another of said circuit elements and connected to an output terminal of the semiconductor integrated circuit device, and
a drive input terminal of a circuit switching element is connected to a terminal for applying said circuit configuration instruction signal.

28. A semiconductor integrated circuit device comprising:
a semiconductor substrate,
a plurality of circuit selection switching elements formed on said semiconductor substrate,
a first insulating film formed on said semiconductor substrate,
a power supply line formed at the first insulating film, and
a first circuit forming layer having a second insulating film formed at said first insulating film and having a first interconnect used as a control line formed inside it, magnetoresistance effect elements formed on the surface of the second insulating film, and a second interconnect formed on the magnetoresistance effect element,
wherein a via hole in which a conductive member is filled is formed in said second insulating film close to a magnetoresistance effect element, said power supply line is connected to one end of said conductive member, said second interconnect is connected to the other end of said conductive member,
a drive input terminal of a circuit switching element is connected to a terminal for applying a circuit configuration instruction signal input from the outside of the semiconductor integrated circuit device,
an input signal input from the outside of the semiconductor integrated circuit device is applied to said first interconnect of a portion functioning as a circuit element among said magnetoresistance effect elements,
an output portion of a circuit selection switching element is connected to said first interconnect of a portion functioning as a connection element among said magnetoresistance effect elements,
an output portion of a circuit selection switching element is connected to said second interconnect via the conductive member filled in the via hole formed in said first insulating film,
connected to another of said connection elements or another of said circuit elements, and connected to the output terminal of the semiconductor integrated circuit device,
a circuit selection switching element is driven in response to said circuit configuration instruction signal, the circuit selection switching element outputs said control signal, and a desired circuit can be configured by combining said circuit elements via said connection elements which become the conductive state or the nonconductive state in response to the control signals.

29. A semiconductor integrated circuit device as set forth in claim 28, wherein,
when an instantaneous current is passed through said first interconnect as said control signal, said magnetoresistance effect element becomes a conductive state and functions as one of said circuit elements and
when current is continuously passed to said first interconnect as said control signal, said magnetoresistance effect element becomes a conductive state continuously and functions as a circuit connection element.

30. A semiconductor integrated circuit element as set forth in claim 29, wherein said circuit element using said magnetoresistance effect element operates as a logic operation element, arithmetic processing element, or storage element.

31. A semiconductor integrated circuit device as set forth in any one of claims 28 to 30, wherein said circuit selection switching elements include transistors formed on a semiconductor substrate.

32. A semiconductor integrated circuit device as set forth in claim 31, further comprising:
a second circuit forming layer having a third insulating film formed at said second insulating film forming said first circuit forming layer and having an additional first interconnect formed inside it, additional magnetoresistance effect elements formed on the surface of the third insulating film, and an additional second interconnect formed on the additional magnetoresistance effect elements,
said first circuit forming layer and said second circuit forming layer are connected by a conductive member filled in a via hole formed in said second insulating film,
one of said additional magnetoresistance effect elements is connected to another magnetoresistance effect element formed at said second circuit forming layer and functions as a horizontal connection element, and
another of said additional magnetoresistance effect elements is connected to a magnetoresistance effect element formed at said first circuit forming layer and functions as a vertical connection element.

33. A semiconductor integrated circuit device as set forth in any one of claims 28 to 30, further comprising:
a second circuit forming layer having a third insulating film formed at said second insulating film forming said first circuit forming layer and having an additional first interconnect formed inside it, additional magnetoresistance effect elements formed on the surface of the third insulating film, and an additional second interconnect formed on the additional magnetoresistance effect elements, said first circuit forming layer and said second circuit forming layer are connected by a conductive member filled in a via hole formed in said second insulating film, one of said additional magnetoresistance effect elements is connected to another magnetoresistance effect element formed at said second circuit forming layer and functions as a horizontal connection element, and another of said additional magnetoresistance effect elements is connected to a magnetoresistance effect element formed at said first circuit forming layer and functions as a vertical connection element.

* * * * *

UNITED STATES PATENT AND TRADEMARK OFFICE
CERTIFICATE OF CORRECTION

PATENT NO. : 7,274,207 B2 Page 1 of 1
APPLICATION NO. : 10/477115
DATED : September 25, 2007
INVENTOR(S) : Minoru Sugawara et al.

It is certified that error appears in the above-identified patent and that said Letters Patent is hereby corrected as shown below:

Column 45, Line 25:
"fromed" should read -- formed --.

Column 45, Line 54:
"claim 8" should read -- claim 10 --.

Column 47, Line 2:
"claim 5" should read -- claim 18 --.

Signed and Sealed this

Fifth Day of August, 2008

JON W. DUDAS
*Director of the United States Patent and Trademark Office*